United States Patent
Nakamura

(10) Patent No.: US 7,167,534 B2
(45) Date of Patent: Jan. 23, 2007

(54) OVERSAMPLING CLOCK RECOVERY CIRCUIT APPLICABLE NOT ONLY TO HIGH RATE DATA BUT ALSO TO LOW RATE DATA

(75) Inventor: Satoshi Nakamura, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 709 days.

(21) Appl. No.: 10/100,871

(22) Filed: Mar. 19, 2002

(65) Prior Publication Data

US 2002/0176527 A1    Nov. 28, 2002

(30) Foreign Application Priority Data

Mar. 19, 2001  (JP)  ............................. 2001-079167
Dec. 27, 2001  (JP)  ............................. 2001-396458

(51) Int. Cl.
*H04L 7/02* (2006.01)
*H03K 19/23* (2006.01)
*H03L 7/06* (2006.01)

(52) U.S. Cl. .................. 375/373; 375/371; 370/518; 327/144

(58) Field of Classification Search ................ 375/326, 375/327, 355, 371, 373–376; 370/516, 518; 327/144, 147, 148, 156, 157
See application file for complete search history.

(56) References Cited

U.S. PATENT DOCUMENTS

| 5,301,196 A | 4/1994 | Ewen et al. |
| 5,633,899 A | 5/1997 | Fiedler et al. |
| 6,130,584 A * | 10/2000 | Yoshida ..................... 331/11 |
| 6,259,755 B1 * | 7/2001 | O'Sullivan et al. ......... 375/376 |
| 6,266,799 B1 * | 7/2001 | Lee et al. ..................... 716/6 |
| 6,445,316 B1 * | 9/2002 | Hsu et al. .................. 341/120 |

FOREIGN PATENT DOCUMENTS

EP    0 942 551 A2    9/1999
JP    9-233061    9/1997

OTHER PUBLICATIONS

Inyeol Lee et. al., "A 622 Mb/s CMOS Clock Recovery PLL with Time-Interleaved Phase Detector Array", IEEE (1996), pp. 198-199 and p. 444.

* cited by examiner

*Primary Examiner*—Young T. Tse
(74) *Attorney, Agent, or Firm*—Scully, Scott, Murphy & Presser, P.C.

(57) ABSTRACT

In an oversampling clock recovery circuit comprising first through fourth phase comparators (PD1 to PD4) and a majority circuit (10), DOWN signal output terminals (DN2 (out), DN3(out)) of the second and the third phase comparators are connected to UP signal input terminals (UP3(in), UP4(in)) of the majority circuit and UP signal output terminals (UP3(out), UP4(out)) of the third and the fourth phase comparators are connected to DONW signal input terminals (DN2(in), DN3(in)) of the majority circuit.

18 Claims, 22 Drawing Sheets

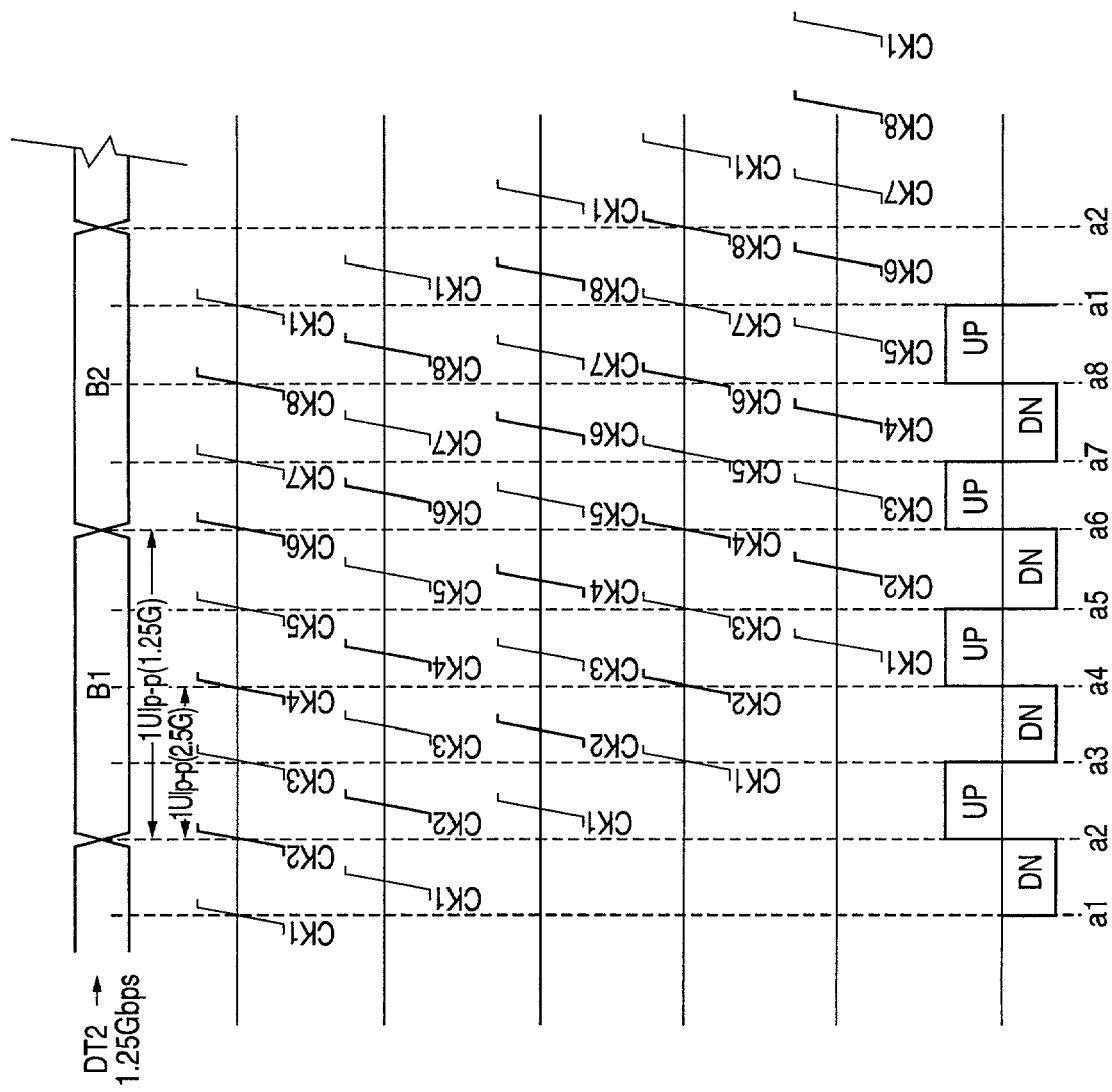

OVERSAMPLING CLOCK RECOVERY CIRCUIT APPLICABLE NOT ONLY TO HIGH RATE DATA BUT ALSO TO LOW RATE DATA

BACKGROUND OF THE INVENTION

This invention relates to an oversampling clock recovery circuit.

The development in an electronic industry is striking and alternation of generations in electronic applied machine instruments is increasing at a high rate. Therefore, smooth alternation of generations always is a problem in common.

In basic network communications as well, transmission rate in digital data has been shifting from 622 megahertz (MHz) to 1.25 gigahertz (GHz) and further to 2.5 GHz. Accordingly, request has been made in development of clock recovery circuits which can make a clock signal sufficiently follow high-speed input data. In prior art, in order to cope with high-speed in such a date transmission, an oversampling type clock recovery circuit has been proposed. The oversampling type clock recovery circuit samples successive several bits of data using a number of clock signals each having a low frequency compared with data rate and phase compares using a plurality of phase-comparators. The oversampling is a method of carrying out sampling by making two or more clock edges correspond to one bit of an input data. A method of carrying out sampling by making n clock edges correspond to one bit of the input data is called an n-times oversampling. An 8-times oversampling is disclosed in Japanese Unexamined Patent Publication Tokkai No. Hei 9-233061 or JP-A 9-233061. A 2-times oversampling is disclosed in U.S. Pat. No. 5,633,899 issued to Alan Fiedler et al.

However, when the oversampling clock recovery circuit designed for use in data communications for a data rate of 2.5 Gbps receives data having a data rate of 1.25 Gbps or 622 Mbps, it is disadvantageous in that an error rate increases, in the manner which will later be in detail described in conjunction with FIGS. 4A through 4G.

SUMMARY OF THE INVENTION

It is therefore an object of this invention to enable a clock recovery circuit applied to data having a high data rate (e.g. 2.5 Gbps) to also apply data having a low data rate (e.g. 1.25 Gbps, 622 Mbps) with a minimum alternation in design and with a minimum increment in circuitry.

Other objects of this invention will become clear as the description proceeds.

According to a first aspect of this invention, an oversampling clock recovery circuit comprises first through 2N-th phase comparators with a one-to-two correspondence with one bit of an input data, where N represents a predetermined positive integer. Each of the first through the 2N-th phase comparators has an UP signal output terminal for producing an UP signal and a DOWN signal output terminal for producing a DOWN signal. Each of N odd numbered phase comparators corresponds to a transition point of the input data, where n represents an integer between 0 to (N−1), both inclusive. A majority circuit decides by majority on UP signals and DOWN signals supplied from the first through the 2N-th phase comparators. The majority circuit has 2N UP signal input terminals and 2N DOWN signal input terminals. The N odd numbered phase comparators have N DOWN signal output terminals connected to N DOWN signal input terminals of the majority circuit and N UP signal output terminals connected to N UP signal input terminals of the majority circuit. N even numbered phase comparators have N DOWN signal output terminals connected to N UP signal input terminals of the majority circuit and N UP signal output terminals connected to N DOWN signal input terminal of the majority circuit.

According to a second aspect of this invention, an oversampling clock recovery circuit comprises first through 4N-th phase comparators with a one-to-four correspondence with one bit of an input data, where N represents a predetermined positive integer. Each of the first through the 4N-th phase comparators has an UP signal output terminal for producing an UP signal and a DOWN signal output terminal for producing a DOWN signal. A (4n+1)-th phase comparator corresponds to a transition point of the input data, where n represents an integer between 0 to (N−1), both inclusive. A majority circuit decides by majority on UP signals and DOWN signals supplied from the first through the 4N-th phase comparators. The majority circuit has 4N UP signal input terminals and 4N DOWN signal input terminals. The (4n+1)-th phase comparator has a DOWN signal output terminal connected to a DOWN signal input terminal of the majority circuit and an UP signal output terminal connected to an UP signal input terminal of the majority circuit. A (4n+2)-th phase comparator has a DOWN signal output terminal and an UP signal output terminal which are connected to UP signal input terminals of the majority circuit. A (4n+3)-th phase comparator has a DOWN signal output terminal connected to an UP signal input terminal of the majority circuit and an UP signal output terminal connected to a DOWN signal input terminal of the majority circuit. A (4n+4)-th phase comparator has a DOWN signal output terminal and an UP signal output terminal which are connected to DOWN signal input terminals of the majority circuit.

According to a third aspect of this invention, an oversampling clock recovery circuit comprises first through 8N-th phase comparators with a one-to-eight correspondence with one bit of an input data, where N represents a predetermined positive integer. Each of the first through the 8N-th phase comparators has an UP signal output terminal for producing an UP signal and a DOWN signal output terminal for producing a DOWN signal. An (8n+1)-th phase comparator corresponds to a transition point of the input data, where n represents an integer between 0 to (N−1), both inclusive. A majority circuit decides by majority on UP signals and DOWN signals supplied from the first through the 8N-th phase comparators. The majority circuit has 8N UP signal input terminals and 8N DOWN signal input terminals. The (8n+1)-th phase comparator has a DOWN signal output terminal connected to a DOWN signal input terminal of the majority circuit and an UP signal output terminal connected to an UP signal input terminal of the majority circuit. Each of (8n+2)-th through (8n+4)-th phase comparators has a DOWN signal output terminal and an UP signal output terminal which are connected to UP signal input terminals of the majority circuit. An (8n+5)-th phase comparator has a DOWN signal output terminal connected to an UP signal input terminal of the majority circuit and an UP signal output terminal connected to a DOWN signal input terminal of the majority circuit. Each of (8n+6)-th through (8n+8)-th phase comparators has a DOWN signal output terminal and an UP signal output terminal which are connected to DOWN signal input terminals of the majority circuit.

According to a fourth aspect of this invention, an oversampling clock recovery circuit comprises first through $2^M$N-th phase comparators with a one-to-$2^M$ correspondence with one bit of an input data, where M and N represent first and second predetermined positive integers, respectively. Each of the first through the $2^M$N-th phase comparators has an UP signal output terminal for producing an UP signal and a DOWN signal output terminal for producing a DOWN signal. A ($2^M$n+1)-th phase comparator corresponds to a transition point of the input data, where n represents an integer between 0 to (N−1), both inclusive. A majority circuit decides by majority on UP signals and DOWN signals supplied from the first through the $2^M$N-th phase comparators. The majority circuit has $2^M$N UP signal input terminals and $2^M$N DOWN signal input terminals. The ($2^M$n+1)-th phase comparator has a DOWN signal output terminal connected to a DOWN signal input terminal of the majority circuit and an UP signal output terminal connected to an UP signal input terminal of the majority circuit. Each of ($2^M$n+2)-th through ($2^M$n+$2^{M-1}$)-th phase comparators has a DOWN signal output terminal and an UP signal output terminal which are connected to UP signal input terminals of the majority circuit. A ($2^M$n+($2^{M-1}$+1))-th phase comparator has a DOWN signal output terminal connected to an UP signal input terminal of the majority circuit and an UP signal output terminal connected to a DOWN signal input terminal of the majority circuit. Each of ($2^M$n+($2^{M-1}$+2))-th through ($2^M$n+$2^M$)-th phase comparators has a DOWN signal output terminal and an UP signal output terminal which are connected to DOWN signal input terminals of the majority circuit.

According to the first through the fourth aspects of this invention, by reconstructing an oversampling clock recovery circuit for a data having a high data rate (e.g. 2.5 Gbps) (which will be called a "high rate data") and comprising even numbered phase comparators with a one-to-one correspondence with one bit of the high rate date into input/output connections as the first through the fourth aspects of this invention, it is possible to realize a phase comparison characteristic corresponding to a data having a low data rate (e.g. 1.25 Gbps, 622 Mpbs) (which will be called a "low rate data"). As a result, it is possible to apply the low rate data with minimum design alternation and minimum circuit increment.

According to a fifth aspect of this invention, in the above-mentioned first through fourth aspects of this invention, the oversampling clock recovery circuit further comprises a selector, disposed between the phase comparators and the majority circuit, for switching a connection state between the UP signal output terminal and the DOWN signal output terminal of said phase comparators and the UP signal input terminals and the DOWN signal input terminals of the majority circuit.

By adding the selector, it is possible to use the oversampling clock recovery circuit as not only one for the high rate data but also one for the low rate data.

The "phase comparators with a one-to-two (four, eight, $2^M$) correspondence with one bit an input data" mean different two (four, eight, $2^M$) phase comparators for carrying out a phase comparison on the basis of sampled data obtained by sampling the input data within a range of one bit length of the input data.

The "phase comparator corresponding to a transition point of the input data" means a phase comparator for carrying out a phase comparison on the basis of sampled data obtained by sampling the input data within a range including the transition point of the input data.

It will be assumed that the low rate data is a half of the high rate data in the manner as the first aspect of this invention. In this event, it is possible to obtain a sufficient follow-up (following speed) either by making a count number of an accumulation counter for counting outputs of the majority circuit a half or by making a resolution (an amount for shifting once) for phase controlling clock signals twice.

It will be assumed that the low rate data is a quarter of the high rate data in the manner as the second aspect of this invention. In this event, it is possible to obtain a sufficient follow-up (following speed) by making a count number of an accumulation counter for counting outputs of the majority circuit a half and by making a resolution (an amount for shifting once) for phase controlling clock signals twice.

It will be assumed that the low rate data is one-eighths of the high rate data in the manner as the third aspect of this invention. In this event, it is possible to obtain a sufficient follow-up (following speed) either by making a count number of an accumulation counter for counting outputs of the majority circuit a quarter and by making a resolution (an amount for shifting once) for phase controlling clock signals twice or by making the count number of the accumulation counter a half and by making the resolution (the amount for shifting once) for phase controlling the clock signals four times.

It will be assumed that the low rate data is one-$2^M$ths of the high rate data in the manner as the fourth aspect of this invention and 2M is represented by multiplying a by b, where a and b represent a positive integer. In this event, it is possible to obtain a sufficient follow-up (following speed) by making a count number of an accumulation counter for counting outputs of the majority circuit one-aths and by making a resolution (an amount for shifting once) for phase controlling clock signals b times.

According to a sixth aspect of this invention, an oversampling clock recovery circuit comprises first through 2N-th phase comparators with a one-to-two correspondence with one bit of an input data, where N represents a predetermined positive integer. Each of the first through the 2N-th phase comparators has a synchronization signal output terminal for producing a synchronization signal, an UP signal output terminal for producing an UP signal, and a DOWN signal output terminal for producing a DOWN signal. Each of N odd numbered phase comparators corresponds to a transition point of the input data, where n represents an integer between 0 to (N−1), both inclusive. A majority circuit decides by majority on synchronization signals, UP signals, and DOWN signals supplied from the first through the 2N-th phase comparators. The majority circuit has 2N synchronization signal input terminals, 2N UP signal input terminals, and 2N DOWN signal input terminals. The N odd numbered phase comparators have N synchronization signal output terminals connected to N synchronization signal input terminals of the majority circuit, N DOWN signal output terminals connected to N DOWN signal input terminals of the majority circuit, and N UP signal output terminals connected to N UP signal input terminals of the majority circuit. N even numbered phase comparators have N synchronization signal output terminals disconnected to N synchronization signal input terminals of the majority circuit, N DOWN signal output terminals connected to N UP signal input terminals of the majority circuit, and N UP signal output terminals connected to N DOWN signal input terminal of the majority circuit.

According to a seventh aspect of this invention, an oversampling clock recovery circuit comprises first through 4N-th phase comparators with a one-to-four correspondence with one bit of an input data, where N represents a predetermined positive integer. Each of the first through the 4N-th phase comparators has a synchronization signal output terminal for produciing a synchronization signal, an UP signal output terminal for producing an UP signal, and a DOWN signal output terminal for producing a DOWN signal. A (4n+1)-th phase comparator corresponds to a transition point of the input data, where n represents an integer between 0 to (N−1), both inclusive. A majority circuit decides by majority on synchronization signals, UP signals, and DOWN signals supplied from the first through the 4N-th phase comparators. The majority circuit has 4N synchronization signal input terminals, 4N UP signal input terminals, and 4N DOWN signal input terminals. The (4n+1)-th phase comparator has a synchronization signal output terminal, a DOWN signal output terminal, and an UP signal output terminal which are connected to a synchronization signal input terminal, a DOWN signal input terminal, and an UP signal input terminal of the majority circuit, respectively. A (4n+2)-th phase comparator has a synchronization signal output terminal disconnected to a synchronization signal input terminal of the majority circuit. The (4n+2)-th phase comparator has a DOWN signal output terminal and an UP signal output terminal which are connected to UP signal input terminals of the majority circuit. A (4n+3)-th phase comparator has a synchronization signal output terminal disconnected to a synchronization signal input terminal of the d majority circuit. The (4n+3)-th phase comparator has a DOWN signal output terminal connected to an UP signal input terminal of the majority circuit and an UP signal output terminal connected to a DOWN signal input terminal of the majority circuit. A (4n+4)-th phase comparator has a synchronization signal input terminal disconnected to a synchronization signal output terminal of the majority circuit. The (4n+4)-th phase comparator has a DOWN signal output terminal and an UP signal output terminal which are connected to DOWN signal input terminals of the majority circuit.

According to an eighth aspect of this invention, an oversampling clock recovery circuit comprises first through 8N-th phase comparators with a one-to-eight correspondence with one bit of an input data, where N represents a predetermined positive integer. Each of the first through the 8N-th phase comparators has a synchronization signal output terminal for producing a synchronization signal, an UP signal output terminal for producing an UP signal, and a DOWN signal output terminal for producing a DOWN signal. An (8n+1)-th phase comparator corresponds to a transition point of the input data, where n represents an integer between 0 to (N−1), both inclusive. A majority circuit decides by majority on synchronization signals, UP signals, and DOWN signals supplied from the first through the 8N-th phase comparators. The majority circuit has 8N synchronization signal input terminals, 8N UP signal input terminals, and 8N DOWN signal input terminals. The (8n+1)-th phase comparator has a synchronization signal output terminal, a DOWN signal output terminal, and an UP signal output terminal which are connected to a synchronization signal input terminal, a DOWN signal input terminal, and an UP signal input terminal of the majority circuit, respectively. Each of (8n+2)-th through (8n+4)-th phase comparators has a synchronization signal output terminal disconnected to a synchronization signal input terminal of the majority circuit. Each of the (8n+2)-th through the (8n+4)-th phase comparators has a DOWN signal output terminal and an UP signal output terminal which are connected to UP signal input terminals of the majority circuit. An (8n+5)-th phase comparator has a synchronization signal output terminal disconnected to a synchronization signal input terminal of the majority circuit. The (8n+5)-th phase comparator has a DOWN signal output terminal connected to an UP signal input terminal of the majority circuit and an UP signal output terminal connected to a DOWN signal input terminal of the majority circuit. Each of (8n+6)-th through (8n+8)-th phase comparators has a synchronization signal output terminal disconnected to a synchronization signal input terminal of the majority circuit. Each of the (8n+6)-th through the (8n+8)-th phase comparators has a DOWN signal output terminal and an UP signal output terminal which are connected to DOWN signal input terminals of the majority circuit.

According to a ninth aspect of this invention, an oversampling clock recovery circuit comprises first through $2^M$N-th phase comparators with a one-to-$2^M$ correspondence with one bit of an input data, where M and N represent first and second predetermined positive integers, respectively. Each of the first through the $2^M$N-th phase comparators has a synchronization signal output terminal for producing a synchronization signal, an UP signal output terminal for producing an UP signal, and a DOWN signal output terminal for producing a DOWN signal. A ($2^M$n+1)-th phase comparator corresponds to a transition point of the input data, where n represents an integer between 0 to (N−1), both inclusive. A majority circuit decides by majority on synchronization signals, UP signals, and DOWN signals supplied from the first through the $2^M$N-th phase comparators. The majority circuit has $2^M$N synchronization signal input terminals, $2^M$N UP signal input terminals, and $2^M$N DOWN signal input terminals. The ($2^M$n+1)-th phase comparator has a synchronization signal output terminal, a DOWN signal output terminal, and an UP signal output terminal which are connected to a synchronization signal input terminal, a DOWN signal input terminal, and an UP signal input terminal of the majority circuit, respectively. Each of ($2^M$n+2)-th through ($2^M$n+$2^{M-1}$)-th phase comparators has a synchronization signal output terminal disconnected to a synchronization signal input terminal of said majority circuit. Each of the ($2^M$n+2)-th through the ($2^M$n+$2^{M-1}$)-th phase comparators has a DOWN signal output terminal and an UP signal output terminal which are connected to UP signal input terminals of the majority circuit. A ($2^M$n+($2^{M-1}$+1))-th phase comparator has a synchronization signal output terminal disconnected to a synchronization signal input terminal of the majority circuit. The ($2^M$n+($2^{M-1}$+1))-th phase comparator has a DOWN signal output terminal and an UP signal output terminal which are connected to an UP signal input terminal and a DOWN signal input terminal of the majority circuit, respectively. Each of ($2^M$n+($2^{M-1}$+2))-th through ($2^M$n+$2^M$)-th phase comparators has a synchronization signal output terminal disconnected to a synchronization signal input terminal of the majority circuit. Each of the ($2^M$n+($2^{M-1}$+2))-th through the ($2^M$n+$2^M$)-th phase comparators has a DOWN signal output terminal and an UP signal output terminal which are connected to DOWN signal input terminals of the majority circuit.

According to the sixth through the ninth aspects of this invention, by reconstructing an oversampling clock recovery circuit for a data having a high data rate (e.g. 2.5 Gbps) (which will be called a "high rate data") and comprising even numbered phase comparators with a one-to-one correspondence with one bit of the high rate date into input/output connections in the manner as the sixth through the ninth aspects of this invention, it is possible to realize a phase comparison characteristic corresponding to a data having a low data rate (e.g. 1.25 Gbps, 622 Mpbs) (which will be called a "low rate data"). As a result, it is possible to apply the low rate data with minimum design alternation and minimum circuit increment.

According to a tenth aspect of this invention, in the above-mentioned sixth through ninth aspects of this invention, the oversampling clock recovery circuit further comprises a selector, disposed between the phase comparators and the majority circuit, for switching a connection state between the synchronization signal output terminal, the UP signal output terminal, and the DOWN signal output terminal of the phase comparators and the synchronization signal input terminals, the UP signal input terminals, and the DOWN signal input terminals of the majority circuit.

By adding the selector, it is possible to use the oversampling clock recovery circuit as not only one for the high rate data but also one for the low rate data.

It will be assumed that the low rate data is a half of the high rate data in the manner as the sixth aspect of this invention. In this event, it is possible to obtain a sufficient follow-up (following speed) either by making a count number of an accumulation counter for counting outputs of the majority circuit a half or by making a resolution (an amount for shifting once) for phase controlling clock signals twice.

It will be assumed that the low rate data is a quarter of the high rate data in the manner as the seventh aspect of this invention. In this event, it is possible to obtain a sufficient follow-up (following speed) by making a count number of an accumulation counter for counting outputs of the majority circuit a half and by making a resolution (an amount for shifting once) for phase controlling clock signals twice.

It will be assumed that the low rate data is one-eighths of the high rate data in the manner as the eighth aspect of this invention. In this event, it is possible to obtain a sufficient follow-up (following speed) either by making a count number of an accumulation counter for counting outputs of the majority circuit a quarter and by making a resolution (an amount for shifting once) for phase controlling clock signals twice or by making the count number of the accumulation counter a half and by making the resolution (the amount for shifting once) for phase controlling the clock signals four times.

It will be assumed that the low rate data is one-$2^M$ths of the high rate data in the manner as the ninth aspect of this invention and $2^M$ is represented by multiplying a by b, where a and b represent a positive integer. In this event, it is possible to obtain a sufficient follow-up (following speed) by making a count number of an accumulation counter for counting outputs of the majority circuit one-aths and by making a resolution (an amount for shifting once) for phase controlling clock signals b times.

According to an eleventh aspect of this invention, an oversampling clock recovery circuit comprises a plurality of phase comparators for sampling an input data having a predetermined data rate using two or more clock signals selected from multi-phase clock signals. Each of the phase comparators produces one of an UP signal and a DWON signal. A majority circuit decides by majority on UP signals and DOWN signals supplied from the phase comparators. Therefore, the oversampling clock recovery circuit has a phase comparison characteristic corresponding to a data rate different from the predetermined data rate by supplying the phase comparators with the two or more clock signals selected from the multi-phase clock signals in accordance with the data rate.

According to a twelfth aspect of this invention, in the above-mentioned eleventh aspect of this invention, the oversampling clock recovery circuit further comprises a selector for switching a connection state between said multi-phase clock signals and said phase comparators.

In the eleventh and the twelfth aspects of this invention, the oversamoling clock recovery circuit can be used also for the low rate data because the phase comparison characteristic is reconstructed so as to suit the input data having more low data rate.

BRIEF DESCRIPTION OF THE DRAWINGS

FIG. 4A is a time chart schematically showing a waveform of a second input data DT2;

FIGS. 4B through 4F are time charts schematically showing leading edges of eight-phase clock signals CK1 through CK8;

FIG. 4G shows a phase comparison characteristic in phase comparator;

DESCRIPTION OF THE PREFERRED EMBODIMENTS

Figure 1:
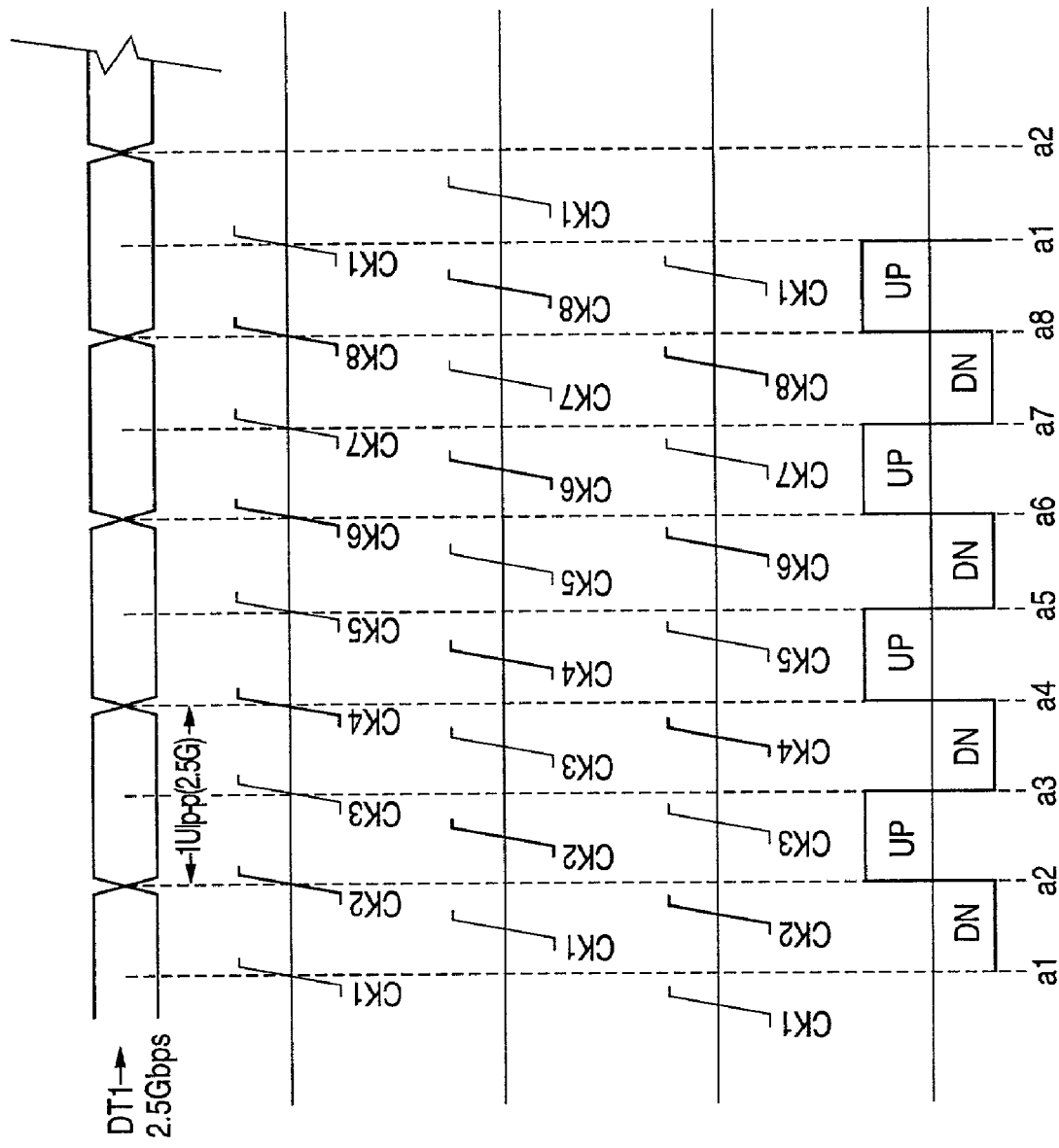
FIG. 1A is a time chart schematically showing a waveform of a first input data DT1.
FIGS. 1B through 1D are time charts schematically showing leading edges of an eight-phase clock signals CK1 through CK8.
FIG. 1E shows a phase comparison characteristic in phase comparators.
Figure 2:
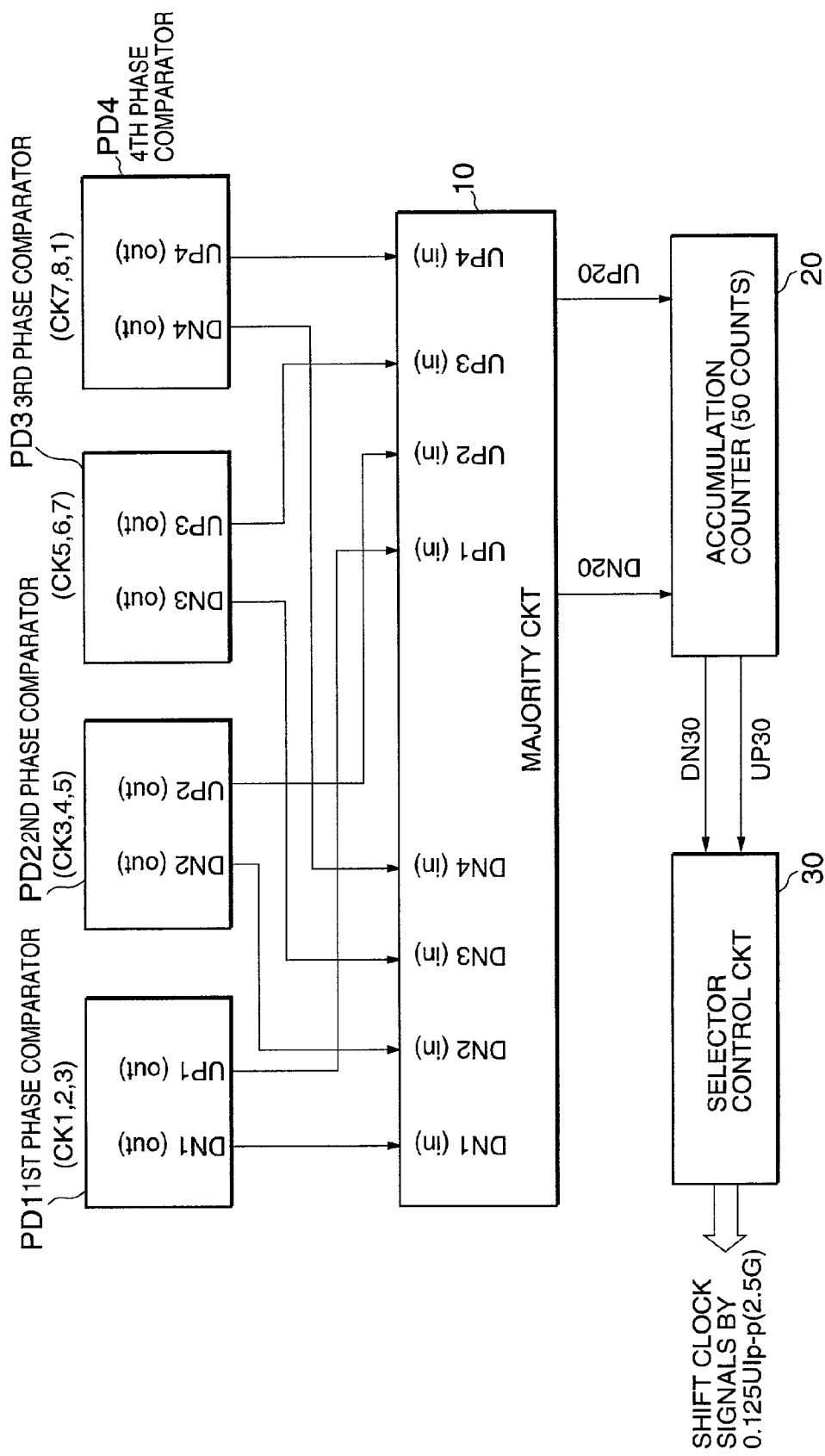
FIG. 2 is a block diagram showing a main part of a conventional 2-times digital oversampling clock recovery circuit that includes the phase comparator.

Referring to FIGS. 1A through 1E and 2, description will at first be directed to a conventional 2-times digital oversampling clock recovery circuit to facilitate an understanding of this invention. FIG. 1A is a time chart schematically showing a waveform of an input data DT1. FIGS. 1B through 1D are time charts schematically showing leading edges of an eight-phase clock signals CK1 through CK8. FIG. 1E shows a phase comparison characteristic in phase comparators. FIG. 2 is a block diagram showing a main part of the conventional 2-times digital oversampling clock recovery circuit that includes the phase comparators.

As shown in FIG. 1A, the input data DT1 is a serial input data DT1 having a data rate of 2.5 Gbps and has a length of one bit equal to 400 ps. Flicker in the input data caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT1 is denoted by 1UT(2.5 G).

In FIGS. 1B through 1D, it will be assumed that the eight-phase clock signals CK1 through CK8 are called first through eighth clock signals, respectively. The eight-phase clock signals CK1 through CK8 are multi-phase clock signals which have a clock frequency of 625 MHz and which are arranged at equal intervals each having 200 ps. Such eight-phase clock signals CK1 through CK8 may favorably be generated by an original clock signal having a clock frequency of 625 MHz using a phase locked loop (PLL) and by expanding the original clock signal into the eight phase clock signals CK1 to CK8 using a delay locked loop (DLL). In addition, the eight-phase clock signals CK1 to CK8 are phase shifted with phase intervals held as a whole using a phase control circuit (not shown).

FIG. 1B shows a state where the eight-phase clock signals CK1 to CK5 are phase locked to a desired phase of the input data DT1. As shown in FIG. 1B, by making the leading edges of the second, the fourth, the sixth, and the eighth clock signals CK2, CK4, CK6, and CK8 phase lock to phases of transition points in the input data DT1, the leading edges of the first, the third, the fifth, and the seventh clock signals CK1, CK3, CK5, and CK7 are phase locked to a bit center of the input data DT1. Accordingly, it is possible to correctly read values of the input data DT1 at timings phase locked to the first, the third, the fifth, and the seventh clock signals CK1, CK3, CK5, and CK7.

The transition point of the input data DT1 sways caused by the jitter. It will be assumed that phases a1 through a8 of the transition points in the input data DT1 gains. In this event, as shown in FIG. 1C, the leading edges of the second, the fourth, the sixth, and the eighth clock signals CK2, CK4, CK6, and CK8 lag behind with reference to phases a2, a4, a6, and a8 of the transition point in the input data DT1. On the contrary, it will be assumed that the phases of the transition points in the input data DT1 lag behind. In this event, as shown in FIG. 1D, the leading edges of the second, the fourth, the sixth, and the eighth clock signals CK2, CK4, CK6, and CK8 gain compared with the phases a2, a4, a6, and a8 of the transition points in the input data DT1.

As shown in FIG. 1E, in the 2-times digital oversampling clock recovery circuit, each phase comparator determines that the phases of the clock signals should be led (be put "forward (UP)" in a case where the leading edges of the second, the fourth, the sixth, and the eighth clock signals CK2, CK4, CK6, and CK8 lie in ranges from the phases a2, a4, a6, and a8 of the transition points in the input data DT1 up to +0.5UI (between the phases a2 and a3, between the phases a4 and a5, between the phases a6 and a7, and between the phases a8 and a1), respectively. On the contrary, each phase comparator determines that the phases of the clock signals should be lagged (be put "backward (DN)" in a case where the leading edges of the second, the fourth, the sixth, and the eighth clock signals CK2, CK4, CK6, and CK8 lie in ranges from the phases a2, a4, a6, and a8 of the transition points in the input data DT1 down to −0.5UI (between the phases a1 and a2, between the phases a3 and a4, between the phases a5 and a6, and between the phases a7 and a8), respectively.

As shown in FIG. 2, the 2-times digital oversampling clock recovery circuit comprises first through fourth phase comparators PD1, PD2, PD3, and PD4, a majority circuit 10, an accumulation counter 20, and a selector control circuit 30.

The first phase comparator PD1 is supplied with first through third sampled data obtained by sampling the input data DT1 using the leading edges of the first, the second, and the third clock signals CK1, CK2, and CK3, respectively. Likewise, the second phase comparator PD2 is supplied with the third through fifth sampled data obtained by sampling the input data DT1 using the leading edges of the third, the fourth, and the fifth clock signals CK3, CK4, and CK5, respectively. The third phase comparator PD3 is supplied with the fifth through seventh sampled data obtained by sampling the input data DT1 using the leading edges of the fifth, the sixth, and the seventh clock signals CK5, CK6, and CK7, respectively. The fourth phase comparator PD4 is supplied with the seventh, eighth, and the first sampled data obtained by sampling the input data DT1 using the leading edges of the seventh, the eighth, and the first clock signals CK7, CK8, and CK1, respectively.

The first phase comparator PD1 has a first UP signal output terminal UP1(out) and a first DOWN signal output terminal DN1(out) for producing a first UP signal and a first DOWN signal, respectively, in the manner which will later be described. Similarly, the second phase comparator PD2 has a second UP signal output terminal UP2(out) and a second DOWN signal output terminal DN2(out) for producing a second UP signal and a second DOWN signal, respectively. The third phase comparator PD3 has a third UP signal output terminal UP3(out) and a third DOWN signal output terminal DN3(out) for producing a third UP signal and a third DOWN signal. The fourth phase comparator PD4 has a fourth UP signal output terminal UP4(out) and a fourth DOWN signal output terminal DN4(out) for producing a fourth UP signal and a fourth DOWN signal, respectively.

The majority circuit 10 has first through fourth UP signal input terminals UP1(in), UP2(in), UP3(in), and UP4(in) and first through fourth DOWN signal input terminals DN1(in), DN2(in), DN3(in), and DN4(in) which are connected to the first through the fourth UP signal output terminals UP1(out) to UP4(out) and the first through the fourth DOWN signal output terminals DN1(out) to DN4(out) in the manner which will later be described. The majority circuit 10 decides by majority of four ones in the first through the fourth UP signals and the first through the fourth DOWN signals to produce, as a majority result, either a decided UP signal UP20 or a decided DOWN signal DN20 which is supplied to the accumulation counter 20.

In the manner which will later be described, the accumulation counter 20 carries out a count operation on the decided UP signal UP20 or the decided DWON signal DN20 to produce an accumulated UP signal UP30 or an accumulated DOWN signal DN30 which is supplied to the selector control circuit 30.

Responsive to the accumulated UP signal UP30, the selector control circuit 30 produces a UP control signal for shifting the clock signals forward by one resolution of 0.125UIp-p(2.5 G). Responsive to the accumulated DOWN signal DN30, the selector control circuit 30 produces a DOWN control signal for shifting the clock signals backward by the one resolution of 0.125UIp-p(2.5 G).

Attention will be directed to the second clock signal CK2. It will be assumed that the leading edge of the second clock signal CK2 lies between the phases a2 and a3 as shown in FIG. 1C. Under the circumstances, the first phase comparator PD1 detects that the transition point in the input data PD1 lies between the leading edges of the first and the second clock signals CK1 and CK2 on the basis of the first through the third sampled data. As a result, the first phase comparator PD1 determines that the phases of the clock signals should be put forward (UP) because the clock signals lag behind. In this event, the first phase comparator PD1 supplies the majority circuit 10 with a first UP signal from a first UP signal output terminal UP1(out) thereof as shown in FIG. 2.

It will be assumed that the leading edge of the second clock signal CK2 lies between the phases a1 and a2 as shown in FIG. 1D. Under the circumstances, the first phase comparator PD1 detects that the transition point in the input data PD1 lies between the leading edges of the second and the third clock signals CK2 and CK3 on the basis of the first through the third sampled data. As a result, the first phase comparator PD1 determines the phases of the clock signals should be put backward (DOWN) because the clock signals gain. In this event, the first phase comparator PD1 supplies the majority circuit 10 with a first DOWN signal from a first DOWN signal output terminal DN1(out) thereof as shown in FIG. 2.

Likewise, the second phase comparator PD2 determines lag/lead of the clock signals on the basis of the third through the fifth sampled data to produce either one of a second UP signal and a second DOWN signal from the second UP signal output terminal UP2(out) and the second DOWN signal output terminal DN2(out). The third phase comparator PD3 determines lag/lead of the clock signals on the basis of the fifth through the seventh sampled data to produce either one of the third UP signal and the third DOWN signal from the third UP signal output terminal UP3(out) and the third DOWN signal output terminal DN3(out). The fourth phase comparator PD4 determines lag/lead of the clock signals on the basis of the seventh, the eighth, and the first sampled data to produce either one of the fourth UP signal and the fourth DOWN signal from the fourth UP signal output terminal UP4(out) and the fourth DOWN signal output terminal DN4(out).

It will be assumed that the input data DT1 has a data pattern with successive same code. In this event, it is impossible to determine lag/lead of the clock signals because the transition point of the input data DT1 is not detected. Accordingly, any phase comparator does not produce any one of the UP signal and the DOWN signal.

As shown in FIG. 2, the first phase comparator PD1 has the first UP signal output terminal UP1(out) and the first DOWN signal output terminal DN1(out) which are connected to the first UP signal input terminal UP1(in) and the first DOWN signal input terminal DN1(in) of the majority circuit 10, respectively. Likewise, the second phase comparator PD2 has the second UP signal output terminal UP2(out) and the second DOWN signal output terminal DN2(out) which are connected to the second UP signal input terminal UP2(in) and the second DOWN signal input terminal DN2(in) of the majority circuit 10, respectively. The third phase comparator PD3 has the third UP signal output terminal UP3(out) and the third DOWN signal output terminal DN3(out) which are connected to the third UP signal input terminal UP3(in) and the third DOWN signal input terminal DN3(in) of the majority circuit 10, respectively. The fourth phase comparator PD4 has the fourth UP signal output terminal UP4(out) and the fourth DOWN signal output terminal DN4(out) which are connected to the fourth UP signal input terminal UP4(in) and the fourth DOWN signal input terminal DN4(in) of the majority circuit 10, respectively.

In the manner which is described above, the majority circuit 10 decides by majority of four ones in the first through the fourth UP signals and the first through the fourth DOWN signals to supply, as the majority result, either the decided UP signal UP20 or the decided DOWN signal DN20 to the accumulation counter 20.

The accumulation counter 20 carries out the count operation on the decided UP signal UP20 or the decided DOWN signal DN20 in the manner which will presently be described. The accumulation counter 20 supplies the selector control circuit 30 with the accumulated UP signal UP30 or the accumulated DOWN signal DN30.

More specifically, the accumulation counter 20 initially has an accumulated value of zero. Responsive to the decided UP signal UP20, the accumulation counter 20 adds one to the accumulated value or counts the accumulated value up by one. Responsive to the decided DOWN signal DN20, the accumulation counter 20 subtracts one from the accumulated value or counts the accumulated value down by one. When the accumulated value is equal to plus fifty or +50, the accumulation counter 20 initializes the accumulated value to reset the accumulated value to zero or 0 and supplies the accumulated UP signal UP30 to the selector control circuit 30. When the accumulated value is equal to minus fifth or −50, the accumulation counter 20 initializes the accumulated value to reset the accumulated value to zero or 0 and supplies the accumulated DOWN signal DN30 to the selector control circuit 30.

Responsive to the accumulated UP signal UP30, the selector control circuit 30 supplies a phase control circuit (not shown) with the UP control signal for shifting the eight-phase clock signals CK1 to CK8 forward by one resolution. Responsive to the accumulated DOWN signal DN30, the selector control circuit 30 supplies the phase control circuit with the DOWN control signal for shifting the eight-phase clock signals CK1 to CK8 backward by the one resolution. In the example being illustrated, the one resolution is equal to 0.125UI(2.5 G).

However, a problem is created in the above-mentioned conventional 2-times digital oversampling clock recovery circuit on receiving data having a low data rate in the manner which will presently be described.

According to ITU-T (International Telecommunication Union-Telecommunication) recommendation G.958, for a predetermined data rate, normal operation must be guaranteed to a flicker caused by jitter, for example, of minimum 1.5UIp-p (or more preferably) in a low frequency band and of minimum 0.15UIp-p (or more preferably) in a high frequency band.

Figure 3A:
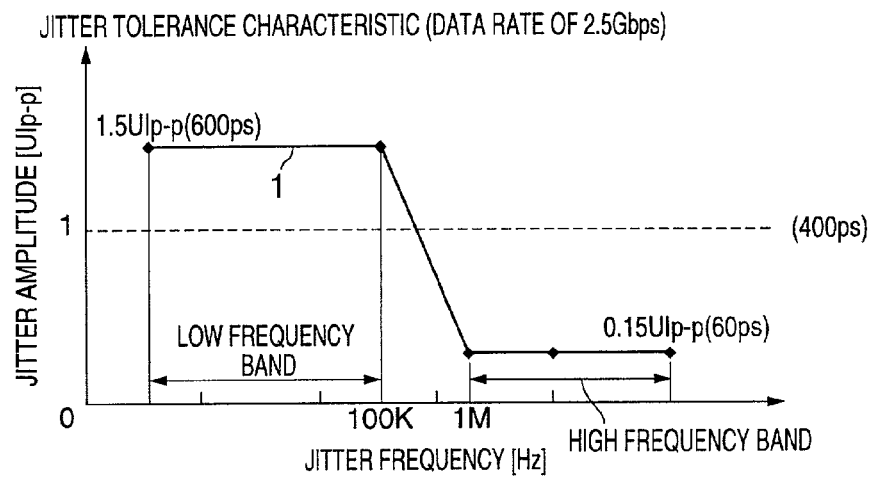
FIG. 3A is a graph showing an example of the jitter tolerance characteristic in a case where the data rate is equal to 2.5 Gbps.
Figure 3B:
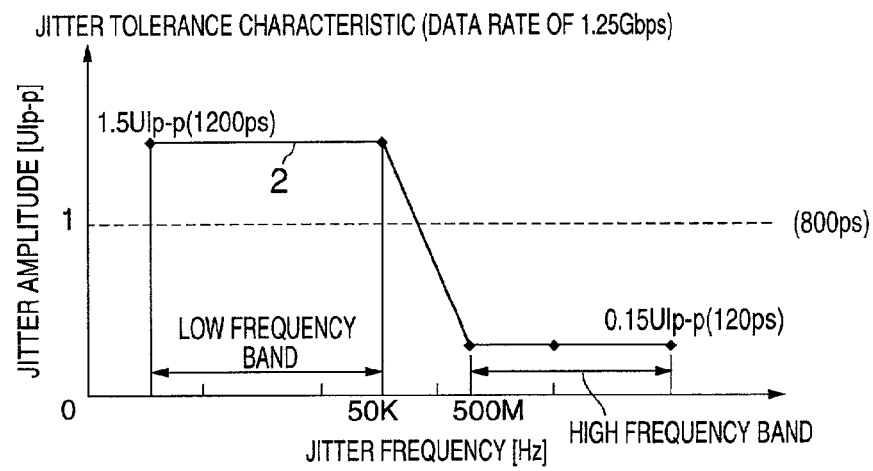
FIG. 3B is a graph showing an example of the jitter tolerance characteristic in another case where the data rate is equal to 1.25 Gbps.
Figure 3C:
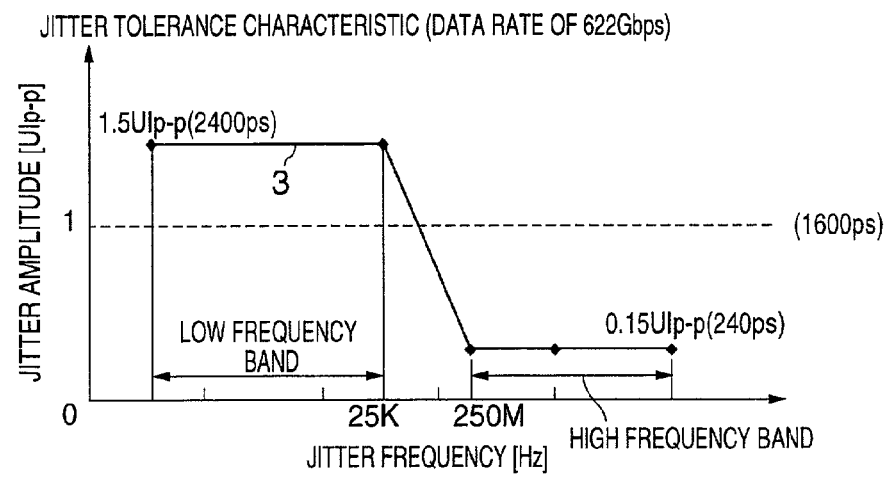
FIG. 3C is a graph showing an example of the jitter tolerance characteristic in still another case where the data rate is equal to 622 Mbps.

FIGS. 3A, 3B, and 3C show correlation relationship between a jitter amplitude and a jitter frequency in the predetermined data rate defined by ITU-T recommendation G.958. The correlation relationship is called a jitter tolerance characteristic. FIG. 3A is a graph showing an example of the jitter tolerance characteristic in a case where the data rate is equal to 2.5 Gbps. FIG. 3B is a graph showing an example of the jitter tolerance characteristic in another case where the data rate is equal to 1.25 Gbps. FIG. 3C is a graph showing an example of the jitter tolerance characteristic in still another case where the data rate is equal to 622 Mbps. In each of FIGS. 3A through 3C, the abscissa represents the jitter frequency [Hz] and the ordinate represents the jitter amplitude [UIp-p] ([ps]).

According to ITU-T recommendation G.958, the following is defined. It will be assumed that the data rate is equal to 2.5 Gbps (a length of one bit is equal to 400 ps). In this event, to correctly operate is required at a desired error rate or less for the jitter having an amplitude and a frequency in a lower region of a solid line 1 shown in FIG. 3A. That is, normal operation must be guaranteed for the jitter amplitude of the minimum 1.5UIp-p (600 ps) (or more preferably) in the low frequency band and of the minimum 0.1 5UIp-p (60 ps) (or more preferably) in the high frequency band.

In addition, it will be assumed that the data rate is equal to 1.25 Gbps (a length of one bit is equal to 800 ps). In this event, to correctly operate is required at a desired error rate or less for the jitter having an amplitude and a frequency in a lower region of a solid line 2 shown in FIG. 3B. That is, normal operation must be guaranteed for the jitter amplitude of the minimum 1.5UIp-p (1200 ps) (or more preferably) in the low frequency band and of the minimum 0.15UIp-p (120ps) (or more preferably) in the high frequency band. As a matter of fact, ITU-T recommendation G.958 does not define a band of 1.25 Gbps. In a real application, the band of 1.25 Gbps is frequently used as an intermediate band between a band of 622 Mbps and a band of 2.5 Gbps. Under the circumstances, ITU-T recommendation G.958 is applied to the band of 1.25 Gbps in the manner described above.

Furthermore, it will be assumed that the data rate is equal to 622 Mbps (a length of one bit is equal to 1600 ps). In this event, to correctly operate is required at a desired error rate or less for the jitter having an amplitude and a frequency in a lower region of a solid line 3 shown in FIG. 3C. That is, normal operation must be guaranteed for the jitter amplitude of the minimum 1.5UIp-p (2400 ps) (or more preferably) in the low frequency band and of the minimum 0.15UIp-p (240 ps) (or more preferably) in the high frequency band.

Herein, in the low frequency band and the high frequency band, Table 1 regularly shows the jitter amplitude where the above-mentioned three kinds of data rates must guarantee the normal operation.

TABLE 1

|  | DATE RATE 2.5 Gbps | DATA RATE 1.25 Gbps | DATA RATE 622 Mbps |
| --- | --- | --- | --- |
| LOW FREQUENCY BAND | 1.5 UIp-p (600 ps or less) | 1.5 UIp-p (1200 ps or less) | 1.5 UIp-p (2400 ps or less) |
| HIGH FREQUENCY BAND | 0.15 UIp-p (6O ps or less) | 0.15 UIp-p (120 ps or less) | 0.15 UIp-p (240 ps or less) |

As shown in Table 1, when comparison is made at the same band in each of the low frequency band and the high frequency band, representation of UI in each frequency band is similar to each other although the data rate becomes a half or a quarter. However, in a case of considering on the basis of its absolute amount, when the data rate becomes a half and a quarter, the jitter amplitude becomes two times and four times, respectively. This is caused by the jitter tolerant characteristic as described with reference to FIGS. 3A through 3C.

Accordingly, consideration will be made by making unit interval [UI] in the data rate of 2.5 Gbps a standard. In other words, it will be assumed in practical use that data having the data rate of 1.25 Gbps or 622 Mbps is received in the clock recovery circuit designed for the data rate of 2.5 Gbps. For the data having the data rate of 1.25 Gbps, the normal operation must be guaranteed to a flicker caused by jitter of minimum 3UIp-p (or more preferably) in the low frequency band and of minimum 0.3UIp-p (or more preferably) in the high frequency band. For the data having the data rate of 622 Mbps, the normal operation must be guaranteed to a flicker caused by jitter of minimum 6UIp-p (or more preferably) in the low frequency band and of minimum 0.6UIp-p (or more preferably) in the high frequency band.

Inasmuch as the clock recovery circuit described in conjunction with FIGS. 1A through 1E and FIG. 2 is designed for use in data communications for the data rate of 2.5 Gbps, following problems occur on receiving the data having the data rate of 1.25 Gbps or 622 Mbps in the clock recovery circuit illustrated in FIG. 2.

Referring to FIGS. 4A through 4G, description will directed to operation in a case where an input data DT2 of the data rate of 1.25 Gbps is supplied to the clock recovery circuit for the data rate of 2.5 Gbps illustrated in FIG. 2. FIG. 4A is a time chart schematically showing a waveform of the input data DT2. FIGS. 4B through 4F are time charts schematically showing leading edges of eight-phase clock signals CK1 through CK8. FIG. 4G shows a phase comparison characteristic in a phase comparator.

As shown in FIG. 4A, the input data DT2 is a serial input data having the data rate of 1.25 Gbps and has a length of one bit equal to 800 ps. Flicker in the input data caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT2 is denoted by 1UT(1.25 G).

In FIGS. 4B through 4F, it will be assumed that the eight-phase clock signals CK1 through CK8 are called first through eighth clock signals, respectively. The eight-phase clock signals CK1 through CK8 are multi-phase clock signals which have a clock frequency of 625 MHz and which are arranged at equal intervals each having 200 ps. Such eight-phase clock signals CK1 through CK8 may favorably be generated by an original clock signal having a clock frequency of 625 MHz using a phase locked loop (PLL) and by expanding the original clock signal into the eight phase clock signals CK1 to CK8 using a delay locked loop (DLL). In addition, the eight-phase clock signals CK1 to CK8 are phase shifted with phase intervals held as a whole using a phase control circuit (not shown).

FIG. 4B shows a state where the eight-phase clock signals CK1 to CK5 are phase locked to a desired phase of the input data DT1. As shown in FIG. 4B, by making the leading edges of the second and the sixth clock signals CK2 and CK6 phase lock to phases of transition points in the input data DT2, the leading edges of the fourth and the eighth clock signals CK4 and CK8 are phase locked to a bit center of the input data DT2. Accordingly, it is possible to correctly read values of the input data DT2 at timings phase locked to the fourth and the eighth clock signals CK4 and CK8.

The transition point of the input data DT2 sways caused by the jitter. It will be assumed that phases a1 through a8 of the transition points in the input data DT2 gains. In this event, as shown in FIG. 4C, the leading edges of the second, the fourth, the sixth, and the eighth clock signals CK2, CK4, CK6, and CK8 lag behind with reference to phases a2, a4, a6, and a8 of the transition points in the input data DT2.

Attention will be directed to the second clock signal CK2. It will be assumed that the leading edge of the second clock signal CK2 lies between the phases a2 and a3 as shown in FIG. 4C. Under the circumstances, the first phase comparator PD1 detects that the transition point in the input data DT2 lies between the leading edges of the first and the second clock signals CK1 and CK2 on the basis of the first through the third sampled data obtained by sampling the input data DT2 by the first through the third clock signals CK1, CK2, and CK3. As a result, the first phase comparator PD1 determines that the phases of the clock signals should be put forward (UP) because the clock signals lag behind. Accordingly, the first phase comparator PD1 produces the first UP signal. In addition, the third phase comparator PD3 detects that the transition point in the input data DT2 lies between the leading edges of the fifth and the sixth clock signals CK5 and CK6 on the basis of the fifth through the seventh sampled data obtained by sampling the input data DT2 by the fifth through the seventh clock signals CK5, CK6, and CK7. As a result, the third phase comparator PD3 determines that the phases of the clock signals should be put forward (UP) because the clock signals lag behind. Accordingly, the third phase comparator PD3 produces the third UP signal. It is therefore possible to return the eight-phase clock signals CK1 to CK8 back to a phase-locked state illustrated in FIG. 4B. In addition, in this event, inasmuch as the second and the fourth phase comparators PD2 and PD4 cannot catch the transition point in the input data DT2, the second and the fourth phase comparators PD2 and PD4 do not produce any of the UP signal and the DOWN signal.

However, in a case of the input data DT2 having the data rate of 1.25 Gbps, inasmuch as the clock recovery circuit illustrated in FIG. 2 is designed for the data rate of 2.5 Gbps although the jitter frequency is similar to that of the input data DT1 having the data rate of 2.5 Gbps as shown in FIG. 1A, the jitter amplitude corresponds to two times of that of the input data DT1 having the data rate of 2.5 Gbps. As a result, as shown in FIG. 4D, a case where the leading edge of the second clock signal CK2 swings up to a phase between the phases a3 and a4 may occur. In this event, although the phases of the clock signals should be rightfully put forward (UP), the second clock Ck2 is phase locked to the phase a4.

More specifically, the second phase comparator PD2 detects that the transition point in the input data DT2 lies between the leading edges of the fourth and the fifth clock signals CK4 and CK5 on the basis of the third through the fifth sampled data obtained by sampling the input data DT2 by the third through the fifth clock signals CK3, CK4, and CK5. As a result, the second phase comparator PD2 determines that the phases of the clock signals should be put backward (DOWN). Accordingly, the second phase comparator PD2 produces the second DOWN signal. In addition, the fourth phase comparator PD4 detects that the transition point in the input data DT2 lies between the leading edges of the eighth and the first clock signals CK8 and CK1 on the basis of the seventh, the eighth, and the first sampled data obtained by sampling the input data DT2 by the seventh, the eighth, and the first clock signals CK7, CK8, and CK1. As a result, the fourth phase comparator PD4 determines that the phases of the clock signals should be put backward (DOWN). Accordingly, the fourth phase comparator PD4 produces the fourth DOWN signal. Therefore, the second clock signal CK2 is phase locked to the phase a4 as shown in FIG. 4E instead of returning the clock signals back to the desired phase-locked state as shown in FIG. 4B.

Such a phenomenon is frequently repeated. In particular, when a large jitter amplitude is superimposed with the input data DT2, the clock signals perfectly are shaken down from the transition point of the input data DT2 as shown in FIG. 4F and then following comes to an end. As a result, it is disadvantageous in that an error rate increases, as mentioned in the preamble of the instant specification.

Now, description will proceed to oversampling clock recovery circuits according to embodiments of this invention with reference to figures.

First Embodiment

Figures 5A, 5B, 5C, 5D, 5E, 5F:
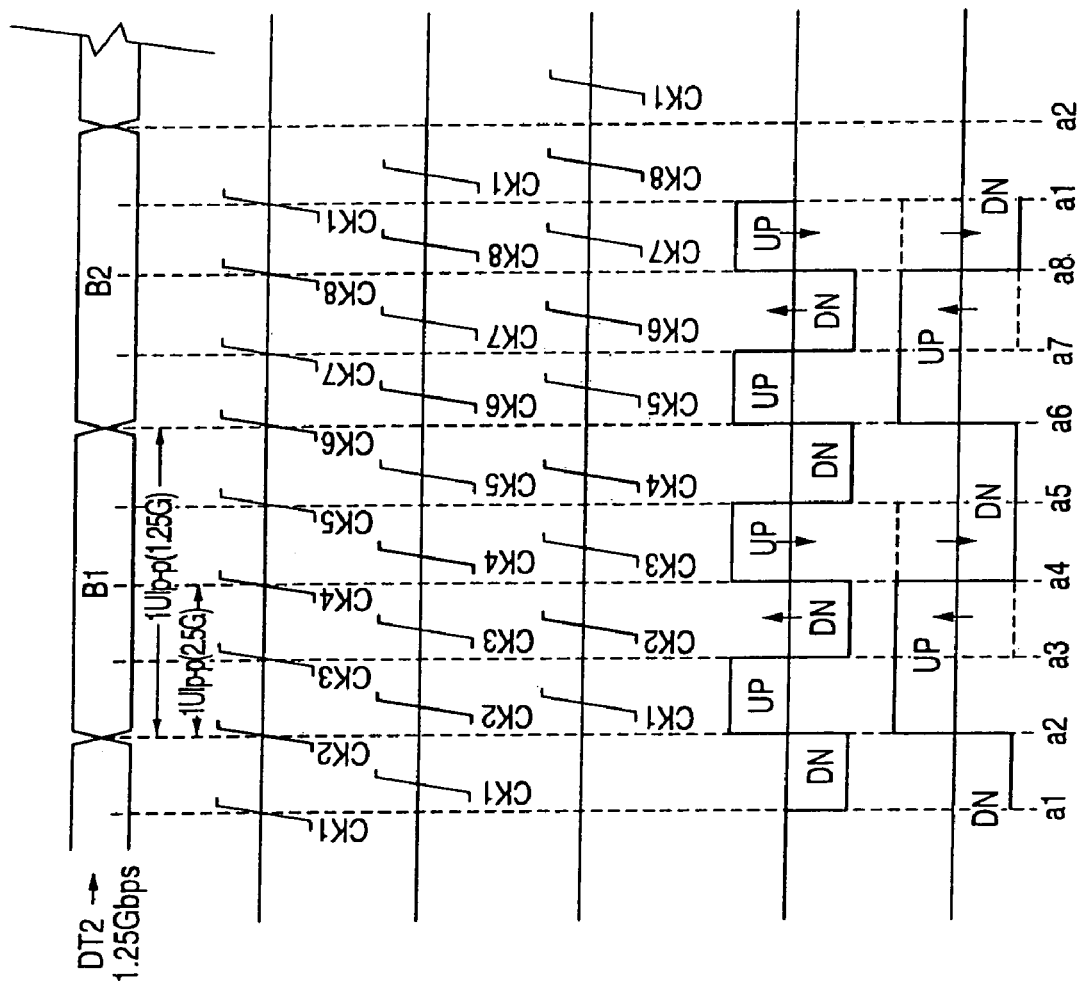
FIG. 5A is a time chart schematically showing a waveform of a second input data DT2.
FIGS. 5B through 5D are time charts schematically showing leading edges of eight-phase clock signals CK1 through CK8.
FIGS. 5E and 5F show a phase comparison characteristic in phase comparators.
Figure 6:
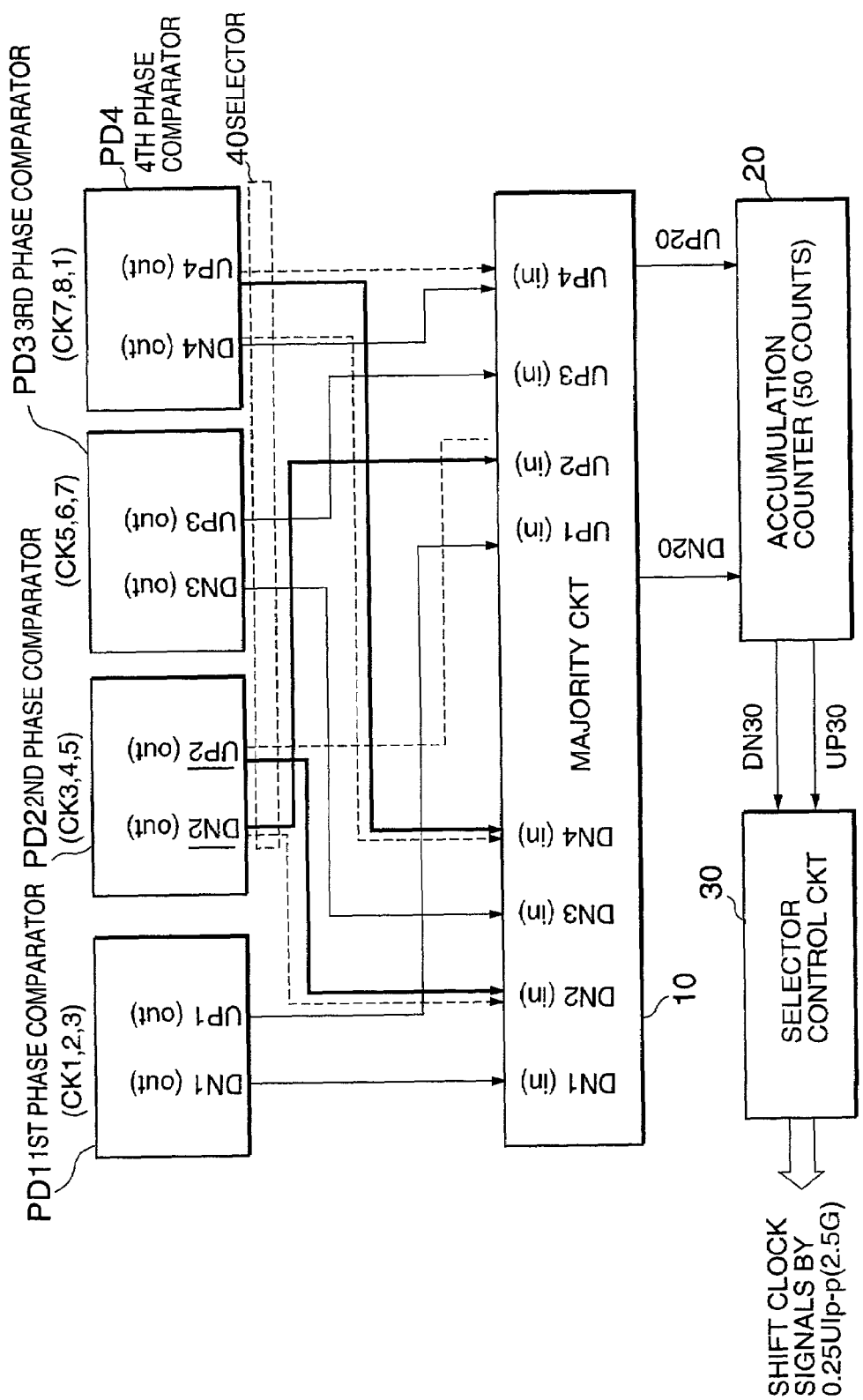
FIG. 6 is a block diagram showing a main part of a digital oversampling clock recovery circuit according to a first embodiment of this invention that includes the phase comparators.

Referring to FIGS. 5A through 5F and FIG. 6, the description will proceed to an oversampling clock recovery circuit according to a first embodiment of this invention. FIG. 5A is a time chart schematically showing a waveform of an input data DT2. FIGS. 5B through 3D are time charts schematically showing leading edges of eight-phase clock signals CK1 through CK8. FIGS. 5E and 5F show a phase comparison characteristic in phase comparators. FIG. 6 is a block diagram showing a main part of the digital oversampling clock recovery circuit that includes the phase comparators.

As shown in FIG. 5A, the input data DT2 is a serial input data having a data rate of 1.25 Gbps and has a length of one bit equal to 800 ps. Flicker in the input data DT2 caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT2 is denoted by 1UT(1.25 G). As shown in FIG. 5A, 1UIp-p (1.25 G) corresponds to 2UIp-p(2.5 G).

The illustrated digital oversampling clock recovery circuit according to the first embodiment is an embodiment obtained by making two alternations in structure of the 2-times digital oversampling clock recovery circuit described in conjunction with FIG. 2.

Firstly, a correspondence relationship between output terminals of the second and the fourth phase comparators PD2 and PD4 and input terminals of the majority circuit 10 is altered.

Secondary, resolution (an amount for shifting once) in a selector control circuit 31 is changed from 0.125UIp-p(2.5 G) to 0.25UIp-p(2.5 G).

Now, a first alternation will be described in detail. As shown in FIG. 6, the second UP signal output terminal UP2(out) of the second phase comparator PD2 is connected to the second DOWN signal input terminal DN2(in) of the majority circuit 10 in lieu of the second UP signal input terminal UP3(in). The second DOWN signal output terminal DN2(out) of the second phase comparator PD2 is connected to the second UP signal input terminal UP2(in) of the majority circuit 10 in lieu of the second DOWN signal input terminal DN2(in). The fourth UP signal output terminal UP4(out) of the fourth phase comparator PD4 is connected to the fourth DOWN signal input terminal DN4(in) of the majority circuit 10 in place of the fourth UP signal input terminal UP4(in). The fourth DOWN signal output terminal DN4(out) of the fourth phase comparator PD4 is connected to the fourth UP signal input terminal UP4(in) of the majority circuit 10 in place of the fourth DOWN signal input terminal DN4(in). In FIG. 6, wiring before alternation is depicted at a broken line.

The illustrated digital oversampling clock recovery circuit further may comprise a selector 40 for changing connections between inputs and outputs before alternation into connections between inputs and outputs after alternation.

In FIGS. 5B through 5D, it will be assumed that the eight-phase clock signals CK1 through CK8 are called first through eighth clock signals, respectively. The eight-phase clock signals CK1 through CK8 are multi-phase clock signals which have a clock frequency of 625 MHz and which are arranged at equal intervals each having 200 ps. Such eight-phase clock signals CK1 through CK8 may favorably be generated by producing an original clock signal having a clock frequency of 625 MHz using a phase locked loop (PLL) and by expanding the original clock signal into the eight phase clock signals CK1 to CK8 using a delay locked loop (DLL). In addition, the eight-phase clock signals CK1 to CK8 are phase shifted with phase intervals held as a whole using a phase control circuit (not shown).

Now, the description will proceed to a phase comparison characteristic of the digital oversampling clock recovery circuit illustrated in FIG. 6.

FIG. 5B shows a state where the eight-phase clock signals CK1 to CK5 are phase locked to a desired phase of the input data DT2. As shown in FIG. 5B, by making the leading edges of the second and the sixth clock signals CK2 and CK6 phase lock to phases of transition points in the input data DT2, the leading edges of the fourth and the eighth clock signals CK4 and CK8 are phase locked to a bit center of the input data DT2. Accordingly, it is possible to correctly read values of the input data DT2 at timings phase locked to the fourth and the eighth clock signals CK4 and CK8.

As shown in FIG. 5C, it will be assumed that the leading edges of the second and the sixth clock signals CK2 and CK6 lie between phases a2 and a3 and between phases a6 and a7, respectively. In this event, the first phase comparator PD1 detects that the transition point of the input data DT2 lies between the first and the second clock signals CK1 and CK2 on the basis of the first through the third sampled data obtained by sampling the input data DT2 by the first through the third clock signals CK1 to CK3. Accordingly, the first phase comparator PD1 determines that the phases of the clock signals should be put forward (UP) because the clock signals lag behind. Under the circumstances, the first phase comparator PD1 supplies the first UP signal to the majority circuit 10 as shown in FIG. 6.

Similarly, the third phase comparator PD3 detects that the transition point of the input data DT2 lies between the fifth and the seventh clock signals CK5 and CK6 on the basis of the fifth through the seventh sampled data obtained by sampling the input data DT2 by the fifth through the seventh clock signals CK5 to CK7. Accordingly, the third phase comparator PD3 determines that the phases of the clock signals should be put forward (UP) because the clock signals lag behind. Under the circumstances, the third phase comparator PD3 supplies the third UP signal to the majority circuit 10 as shown in FIG. 6.

In addition, the second phase comparator PD2 does not detect the transition point of the input data DT2 on the basis of the third through the fifth sampled data obtained by sampling the input data DT by the third through the fifth clock signals CK3 to CK5. Accordingly, the second phase comparator PD2 produces neither the second UP signal nor the second DOWN signal. Likewise, the fourth phase comparator PD4 does not detect the transition point of the input data DT2 on the basis of the seventh, the eighth, and the first sampled data obtained by sampling the input data DT by the seventh, the eighth, and the first clock signals CK7, CK8, and CK1. Accordingly, the fourth phase comparator PD4 produces neither the fourth UP signal nor the fourth DOWN signal.

As shown in FIG. 5D, it will be assumed that the leading edges of the second and the sixth clock signals CK2 and CK6 lie between phases a3 and a4 and between phases a7 and a8, respectively. In this event, the second phase comparator PD2 detects that the transition point of the input data DT2 lies between the fourth and the fifth clock signals CK4 and CK5 on the basis of the third through the fifth sampled data obtained by sampling the input data DT2 by the third through the fifth clock signals CK3 to CK5. Accordingly, the second phase comparator PD2 determines that the phases of the clock signals should be put backward (DOWN) because the clock signals gain. Under the circumstances, the second phase comparator PD2 supplies the second DOWN signal to the majority circuit 10. However, in this case, inasmuch as the second DOWN signal output terminal DN2(out) of the second phase comparator PD2 is connected to the second UP signal input terminal UP2(in) of the majority circuit 10 as illustrated in FIG. 6, the majority circuit 10 decides by majority by counting the second DOWN signal as the second UP signal.

Similarly, the fourth phase comparator PD4 detects that the transition point of the input data DT2 lies between the eighth and the first clock signals CK8 and CK1 on the basis of the seventh, the eighth, and the first sampled data obtained by sampling the input data DT2 by the seventh, the eighth, and the first clock signals CK7, CK8, and CK1. Accordingly, the fourth phase comparator PD4 determines that the phases of the clock signals should be put backward (DOWN) because the clock signals gain. Under the circumstances, the fourth phase comparator PD4 supplies the fourth DOWN signal to the majority circuit 10. However, in this case, inasmuch as the fourth DOWN signal output terminal DN4 (out) of the fourth phase comparator PD4 is connected to the fourth UP signal input terminal UP4(in) of the majority circuit as illustrated in FIG. 6, the majority circuit 10 decides by majority by counting the fourth DOWN signal as the fourth UP signal.

In addition, inasmuch as the first phase comparator PD1 cannot detect the transition point of the input data DT2 on the basis of the first through the third sampled data obtained by sampling the input data DT by the first through the third clock signals CK1 to CK3, the first phase comparator PD1 produces neither the first UP signal nor the first DOWN signal. Likewise, inasmuch as the third phase comparator PD3 cannot detect the transition point of the input data DT2 on the basis of the fifth through the seventh sampled data obtained by sampling the input data DT by the fifth through the seventh clock signals CK5 to CK7, the third phase comparator PD3 produces neither the third UP signal nor the third DOWN signal.

Although illustration is not made, it will be assumed that the leading edges of the second and the sixth clock signals CK2 and CK6 lie between phases a1 and a2 and between phases a5 and a6, respectively. In this event, the first phase comparator PD1 detects that the transition point of the input data DT2 lies between the second and the third clock signals CK2 and CK3 on the basis of the first through the third sampled data obtained by sampling the input data DT2 by the first through the third clock signals CK1 to CK3. Accordingly, the first phase comparator PD1 determines that the phases of the clock signals should be put backward (DOWN) because the clock signals gain. Under the circumstances, the first phase comparator PD1 supplies the first DOWN signal to the majority circuit 10 as shown in FIG. 6.

Similarly, the third phase comparator PD3 detects that the transition point of the input data DT2 lies between the sixth and the seventh clock signals CK6 and CK7 on the basis of the fifth through the seventh sampled data obtained by sampling the input data DT2 by the fifth through the seventh clock signals CK5 to CK7. Accordingly, the third phase comparator PD3 determines that the phases of the clock signals should be put backward (DOWN) because the clock signals gain. Under the circumstances, the third phase comparator PD3 supplies the third DOWN signal to the majority circuit 10 as shown in FIG. 6.

In addition, inasmuch as the second phase comparator PD2 cannot detect the transition point of the input data DT2 on the basis of the third through the fifth sampled data obtained by sampling the input data DT by the third through the fifth clock signals CK3 to CK5, the second phase comparator PD2 produces neither the second UP signal nor the second DOWN signal. Likewise, inasmuch as the fourth phase comparator PD4 cannot detect the transition point of the input data DT2 on the basis of the seventh, the eighth, and the first sampled data obtained by sampling the input data DT by the seventh, the eighth, and the first clock signals CK7, CK8, and CK1, the fourth phase comparator PD4 produces neither the fourth UP signal nor the fourth DOWN signal.

Although illustration is not made, it will be assumed that the leading edges of the second and the sixth clock signals CK2 and CK6 lie between phases a8 and a1 and between phases a6 and a7, respectively. In this event, the second phase comparator PD2 detects that the transition point of the input data DT2 lies between the third and the fourth clock signals CK3 and CK4 on the basis of the third through the fifth sampled data obtained by sampling the input data DT2 by the third through the fifth clock signals CK3 to CK5. Accordingly, the second phase comparator PD2 determines that the phases of the clock signals should be put forward (UP) because the clock signals lag behind. Under the circumstances, the second phase comparator PD2 supplies the second UP signal to the majority circuit 10. However, in this case, inasmuch as the second UP signal output terminal UP2(out) of the second phase comparator PD2 is connected to the second DOWN signal input terminal DN2(in) of the majority circuit 10 as illustrated in FIG. 6, the majority circuit 10 decides by majority by counting the second UP signal as the second DOWN signal.

Similarly, the fourth phase comparator PD4 detects that the transition point of the input data DT2 lies between the seventh and the eighth clock signals CK7 and CK8 on the basis of the seventh, the eighth, and the first sampled data obtained by sampling the input data DT2 by the seventh, the eighth, and the first clock signals CK7, CK8, and CK1. Accordingly, the fourth phase comparator PD4 determines that the phases of the clock signals should be put forward (UP) because the clock signals lag behind. Under the circumstances, the fourth phase comparator PD4 supplies the fourth UP signal to the majority circuit 10. However, in this case, inasmuch as the fourth UP signal output terminal UP4(out) of the fourth phase comparator PD4 is connected to the fourth DOWN signal input terminal DN4(in) of the majority circuit as illustrated in FIG. 6, the majority circuit 10 decides by majority by counting the fourth UP signal as the fourth DOWN signal.

In addition, inasmuch as the first phase comparator PD1 cannot detect the transition point of the input data DT2 on the basis of the first through the third sampled data obtained by sampling the input data DT by the first through the third clock signals CK1 to CK3, the first phase comparator PD1 produces neither the first UP signal nor the first DOWN signal. Likewise, inasmuch as the third phase comparator PD3 cannot detect the transition point of the input data DT2 on the basis of the fifth through the seventh sampled data obtained by sampling the input data DT by the fifth through the seventh clock signals CK5 to CK7, the third phase comparator PD3 produces neither the third UP signal nor the third DOWN signal.

On summarizing the above-mentioned phase comparison characteristic, by changing the connections between the output terminals of the second and the fourth phase comparators PD2 and PD4 and the input terminals of the majority circuit 10 in the manner which is described above, the phase comparison characteristic is changed so as to suit the input data DT having the data rate of 1.25 Gbps as illustrated in FIG. 5F. More specifically, as is apparent from FIGS. 5E and 5F, DN decision between the phases a3 and a4 is changed to UP decision, UP decision between the phases a4 and a5 is changed to DN decision, DN decision between the phases a7 and a8 is changed to UP decision, and UP decision between the phases a8 and a1 is changed to DN decision. In other words, while the leading edges of the second and the sixth clock signals CK2 and CK6 lie between the phases a2 and a4 and between the phases a6 and a8, respectively, UP decision is carried out. While the leading edges of the second and the sixth clock signals CK2 and CK6 lie between the phases a8 and a2 and between the phases a4 and a6, respectively, DN decision is carried out. Accordingly, it is possible to recovery the state illustrated in FIG. 5A where the leading edges of the second and the sixth clock signals CK2 and CK6 are phase locked to the phases a2 and a6 of the transition points in the input data DT2, respectively, and to make the clock signals follow the input data DT2. Inasmuch as the resolution for phase controlling the eight-phase clock signals CK1 to CK8 is twice, a following speed of the clock signals becomes twice. Accordingly, it is possible to ensure a sufficient follow-up for the input data DT2 having the data rate of 1.25 Gbps.

The first embodiment described above is nothing but an embodiment of this invention. In general, the oversampling clock recovery circuit comprises first through 2N-th phase comparators PD1 through PD2N with a one0-to-two correspondence with one bit of an input data, where N represents a predetermined positive integer and a majority circuit. Each of the first through the 2N-th phase comparators has an UP signal output terminal for producing an UP signal and a DOWN signal output terminal for producing a DOWN signal. Each of N odd numbered phase comparators PD(2n+1) corresponds to a transition point of the input data, where n represents an integer between 0 and (N−1), both inclusive. The majority circuit decides by majority on UP signals and DOWN signals supplied from the first through 2N-th phase comparators. The majority circuit has 2N UP signal input terminals and 2N DOWN signal output terminals. The N odd numbered phase comparators PD(2n+1) have N UP signal output terminals connected to N UP signal input terminals of the majority circuit and N DOWN signal output terminals connected to N DOWN signal input terminals of the majority circuit. N even numbered phase comparators PD(2n+2) have N DOWN signal output terminals connected to N UP signal input terminals of the majority circuit and N UP signal output terminals connected to N DOWN signal input terminals of the majority circuit.

Second Embodiment

Figure 7:
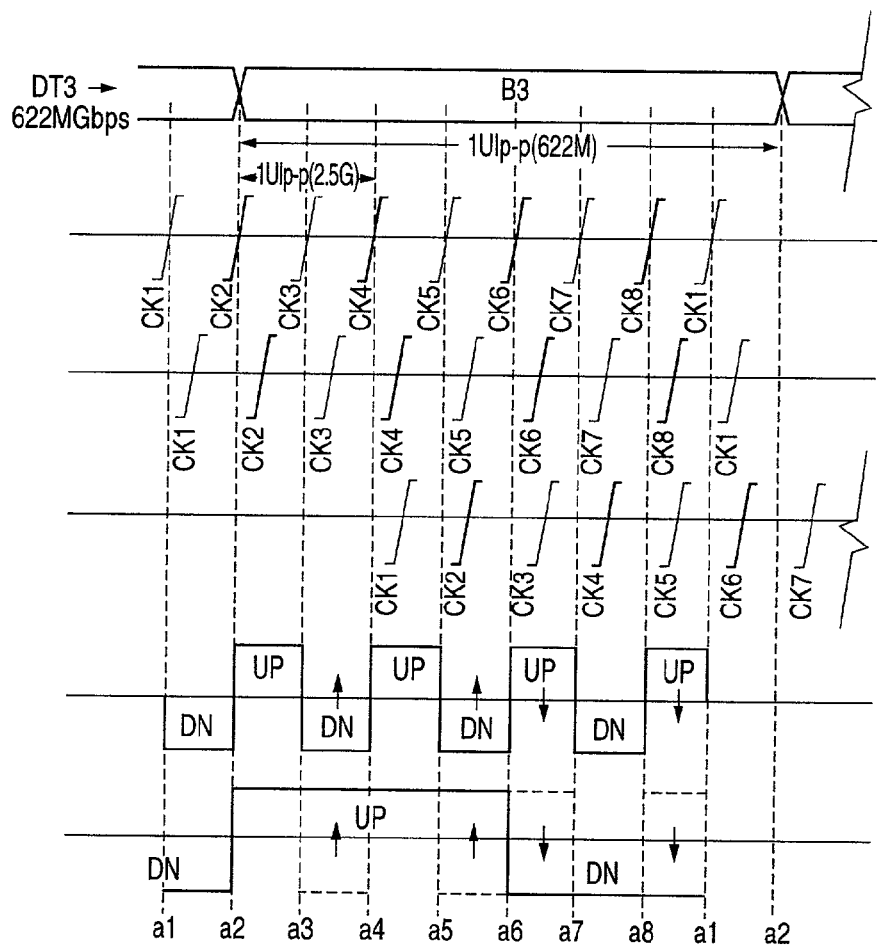
FIG. 7A is a time chart schematically showing a waveform of a third input data DT3.
FIGS. 7B through 7D are time charts schematically showing leading edges of eight-phase clock signals CK1 through CK8.
FIGS. 7E and 7F show a phase comparison characteristic in phase comparators.
Figure 8:
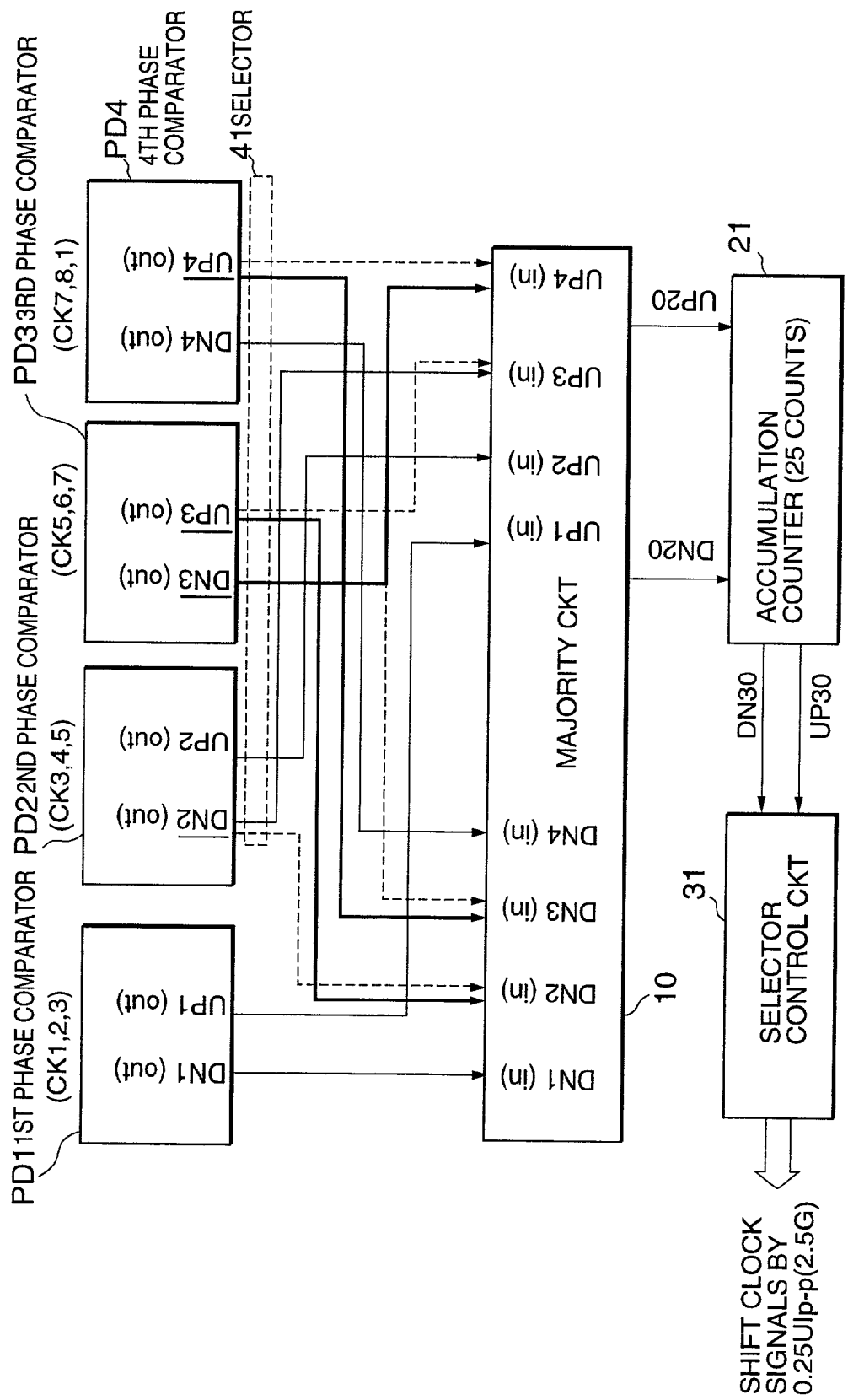
FIG. 8 is a block diagram showing a main part of a 2-times digital oversampling clock recovery circuit according to a second embodiment of this invention that includes the phase comparators.

Referring to FIGS. 7A through 7F and FIG. 8, the description will proceed to a 2-times digital oversampling clock recovery circuit according to a second embodiment of this invention. FIG. 7A is a time chart schematically showing a waveform of an input data DT3. FIGS. 7B through 7D are time charts schematically showing leading edges of eight-phase clock signals CK1 through CK8. FIGS. 7E and 7F show a phase comparison characteristic in phase comparators. FIG. 8 is a block diagram showing a main part of the 2-times digital oversampling clock recovery circuit that includes the phase comparators.

As shown in FIG. 7A, the input data DT3 is a serial input data having a data rate of 622 Mbps and has a length of one bit equal to 1600 ps. Flicker in the input data DT3 caused by jitter is dependent on the data rate. Inasmuch as it is convenient to use, as an indicator of a magnitude of the flicker, a unit of a bit length, a length of one bit is represented by 1 UI (unit interval) in the art. Inasmuch as the length of 1 UT is different by the data rate, 1 UI in the input data DT3 is denoted by 1 UT(622 M). As shown in FIG. 7A, 1UIp-p(622 M) corresponds to 4 UIp-p(2.5 G).

The illustrated 2-times digital oversampling clock recovery circuit according to the second embodiment is an embodiment obtained by making three alternations in structure of the 2-times digital oversampling clock recovery circuit described in conjunction with FIG. 2.

Firstly, a correspondence relationship between output terminals of the second, the third, and the fourth phase comparators PD2, PD3, and PD4 and input terminals of the majority circuit 10 is altered.

Secondary, resolution (an amount for shifting once) in the selector control circuit 31 is changed from 0.125UIp-p(2.5 G) to 0.25UIp-p(2.5 G).

Thirdly, an accumulation counter 21 has a count number which is changed from 50 to 25.

Now, a first alternation will be described in detail. As shown in FIG. 8, the second and the third DOWN signal output terminals DN2(out) and DN3(out) of the second and the thrid phase comparators PD2 and PD3 are connected to the thirs and the fourth UP signal input terminals UP3(in) and UP4(in) of the majority circuit 10 in lieu of the second and the third DOWN signal input terminals DN2(in) and DN3(in). The third and the fourth UP signal output terminals UP3(out) and UP4(out) of the third and the fourth phase comparator PD3 and PD4 are connected to the second and the third DOWN signal input terminal DN2(in) and DN3(in) of the majority circuit 10 in lieu of the third and the fourth UP signal input terminals UP3(in) and UP4(in). In FIG. 8, wiring before alternation is depicted at a broken line.

The illustrated 2-times digital oversampling clock recovery circuit further may comprise a selector 41 for changing connections between inputs and outputs before alternation into connections between inputs and outputs after alternation.

In FIGS. 7B through 7D, it will be assumed that the eight-phase clock signals CK1 through CK8 are called first through eighth clock signals, respectively. The eight-phase clock signals CK1 through CK8 are multi-phase clock signals which have a clock frequency of 625 MHz and which are arranged at equal intervals each having 200 ps. Such eight-phase clock signals CK1 through CK8 may favorably be generated by producing an original clock signal having a clock frequency of 625 MHz using a phase locked loop (PLL) and by expanding the original clock signal into the eight phase clock signals CK1 to CK8 using a delay locked loop (DLL). In addition, the eight-phase clock signals CK1 to CK8 are phase shifted with phase intervals held as a whole using a phase control circuit (not shown).

Now, the description will proceed to a phase comparison characteristic of the 2-times digital oversampling clock recovery circuit illustrated in FIG. 8.

FIG. 7B shows a state where the eight-phase clock signals CK1 to CK5 are phase locked to a desired phase of the input data DT3. As shown in FIG. 7B, by making the leading edge of the second clock signal CK2 phase lock to a phase of a transition point in the input data DT3, the leading edge of the sixth clock signal CK6 is phase locked to a bit center of the input data DT3. Accordingly, it is possible to correctly read values of the input data DT3 at a timing phase locked to the sixth clock signal CK6.

Now, description will proceed to a phase comparison characteristic in the second embodiment of this invention.

By changing connections between the output terminals of the second through the fourth phase comparators PD2 to PD4 and the input terminals of the majority circuit 10 in the manner which is described above, the phase comparison characteristic is changed from a phase comparison characteristic as shown in FIG. 7E to a phase comparison characteristic suit to the input data DT3 having the data rate of 622 Mbps as shown in FIG. 7F.

More specifically, as is apparent from FIGS. 7E and 7F, DN decisions between the phases a3 and a4 and between the phases a5 and a6 are changed to UP decisions while UP decisions between the phases a6 and a7 and between the phases a8 and a1 are changed to DN decisions. In other words, while the leading edge of the second clock signal CK2 lies in a range from the phase a2 to the phase a6, UP decision is carried out. While the leading edge of the second clock signal CK2 lies in a range from the phase a6 to the phase a2, DN decision is carried out. Accordingly, it is possible to recovery the state illustrated in FIG. 7A where the leading edge of the second clock signal CK2 is phase locked to the phase a2 of the transition point in the input data DT3 and to make the clock signals follow the input data DT3. Inasmuch as the resolution for phase controlling the eight-phase clock signals CK1 to CK8 is twice and the count number in the accumulation counter 21 is a half, a following speed of the clock signals becomes four times. Accordingly, it is possible to ensure a sufficient follow-up for the input data DT3 having the data rate of 622 Mbps.

For instance, as shown in FIG. 7C, it will be assumed that the leading edge of the second clock signal CK2 lie between phases a2 and a3. In this event, the first phase comparator PD1 detects that the transition point of the input data DT3 lies between the first and the second clock signals CK1 and CK2 on the basis of the first through the third sampled data obtained by sampling the input data DT3 by the first through the third clock signals CK1 to CK3. Accordingly, the first phase comparator PD1 determines that the phases of the clock signals should be put forward (UP) because the clock signals lag behind. Under the circumstances, the first phase comparator PD1 supplies the first UP signal to the majority circuit 10 as shown in FIG. 8.

In addition, inasmuch the second phase comparator PD2 cannot detect the transition point of the input data DT3 on the basis of the third through the fifth sampled data obtained by sampling the input data DT3 by the third through the fifth clock signals CK3 to CK5, the second phase comparator PD2 produces neither the second UP signal nor the second DOWN signal. Likewise, inasmuch as the third phase comparator PD3 cannot detect the transition point of the input data DT3 on the basis of the fifth through the seventh sampled data obtained by sampling the input data DT3 by the fifth through the seventh clock signals CK5 to Ck7, the third phase comparator PD3 produces neither the third UP signal nor the third DOWN signal. Inasmuch as the fourth phase comparator PD4 cannot detect the transition point of the input data DT3 on the basis of the seventh, the eighth, and the first sampled data obtained by sampling the input data DT3 by the seventh, the eighth, and the first clock signals CK7, CK8, and CK1, the fourth phase comparator PD4 produces neither the fourth UP signal nor the fourth DOWN signal.

As shown in FIG. 7D, it will be assumed that the leading edge of the second clock signal CK2 lies between phases a5 and a6. In this event, the third phase comparator PD3 detects that the transition point of the input data DT3 lies between the sixth and the seventh clock signals CK6 and CK7 on the basis of the fifth through the seventh sampled data obtained by sampling the input data DT3 by the fifth through the seventh clock signals CK5 to CK7. Accordingly, the third phase comparator PD3 determines that the phases of the clock signals should be put backward (DOWN) because the clock signals gain. Under the circumstances, the third phase comparator PD3 supplies the third DOWN signal to the majority circuit 10. However, in this case, inasmuch as the third DOWN signal output terminal DN3(out) of the third phase comparator PD3 is connected to the fourth UP signal input terminal UP4(in) of the majority circuit 10 as illustrated in FIG. 8, the majority circuit 10 decides by majority by counting the third DOWN signal as the fourth UP signal.

In addition, inasmuch as the first phase comparator PD1 cannot detect the transition point of the input data DT3 on the basis of the first through the third sampled data obtained by sampling the input data DT by the first through the third clock signals CK1 to CK3, the first phase comparator PD1 produces neither the first UP signal nor the first DOWN signal. Likewise, inasmuch as the second phase comparator PD2 cannot detect the transition point of the input data DT3 on the basis of the third through the fifth sampled data obtained by sampling the input data DT3 by the third through the fifth clock signals CK3 to CK5, the second phase comparator PD2 produces neither the second UP signal nor the second DOWN signal. Inasmuch as the fourth phase comparator PD4 cannot detect the transition point of the input data DT3 on the basis of the seventh, the eighth, and the first sampled data obtained by sampling the input data DT3 by the seventh, the eighth, and the first clock signals CK7, CK8, and CK1, the fourth phase comparator PD4 produces neither the fourth UP signal nor the fourth DOWN signal.

The second embodiment described above is nothing but an embodiment of this invention. In general, the oversampling clock recovery circuit comprises first through 4N-th phase comparators PD1 through PD4N with a one-to-four correspondence with one bit of an input data, where N represents a predetermined positive integer and a majority circuit. Each of the first through the 4N-th phase comparators has an UP signal output terminal for producing an UP signal and a DOWN signal output terminal for producing a DOWN signal. A (4n+1)-th phase comparator PD(4n+1) corresponds to a transition point of the input data, where n represents an integer between 0 and (N−1), both inclusive. The majority circuit decides by majority on UP signals and DOWN signals supplied from the first through the 4N-th phase comparators. The majority circuit has 4N UP signal input terminals and 4N DOWN signal output terminals. The (4n+1)-th phase comparator PD(4n+1) has a DOWN signal output terminal and an UP signal output terminal which are connected to a DONW signal input terminal and an UP signal input terminal of the majority circuit, respectively. A (4n+2)-th phase comparator PD(4n+2) has a DOWN signal output terminal and an UP signal output terminal which are connected to UP signal input terminals of the majority circuit. A (4n+3)-th phase comparator PD(4n+3) has a DOWN signal output signal and an UP signal output terminal which are connected to an UP signal input terminal and the a DOWN signal input terminal of the majority circuit, respectively. A (4n+4)-th phase comparator PD(4n+4) has a DOWN signal output terminal and an UP signal output terminal which are connected to DOWN signal input terminals of the majority circuit.

Figure 19:
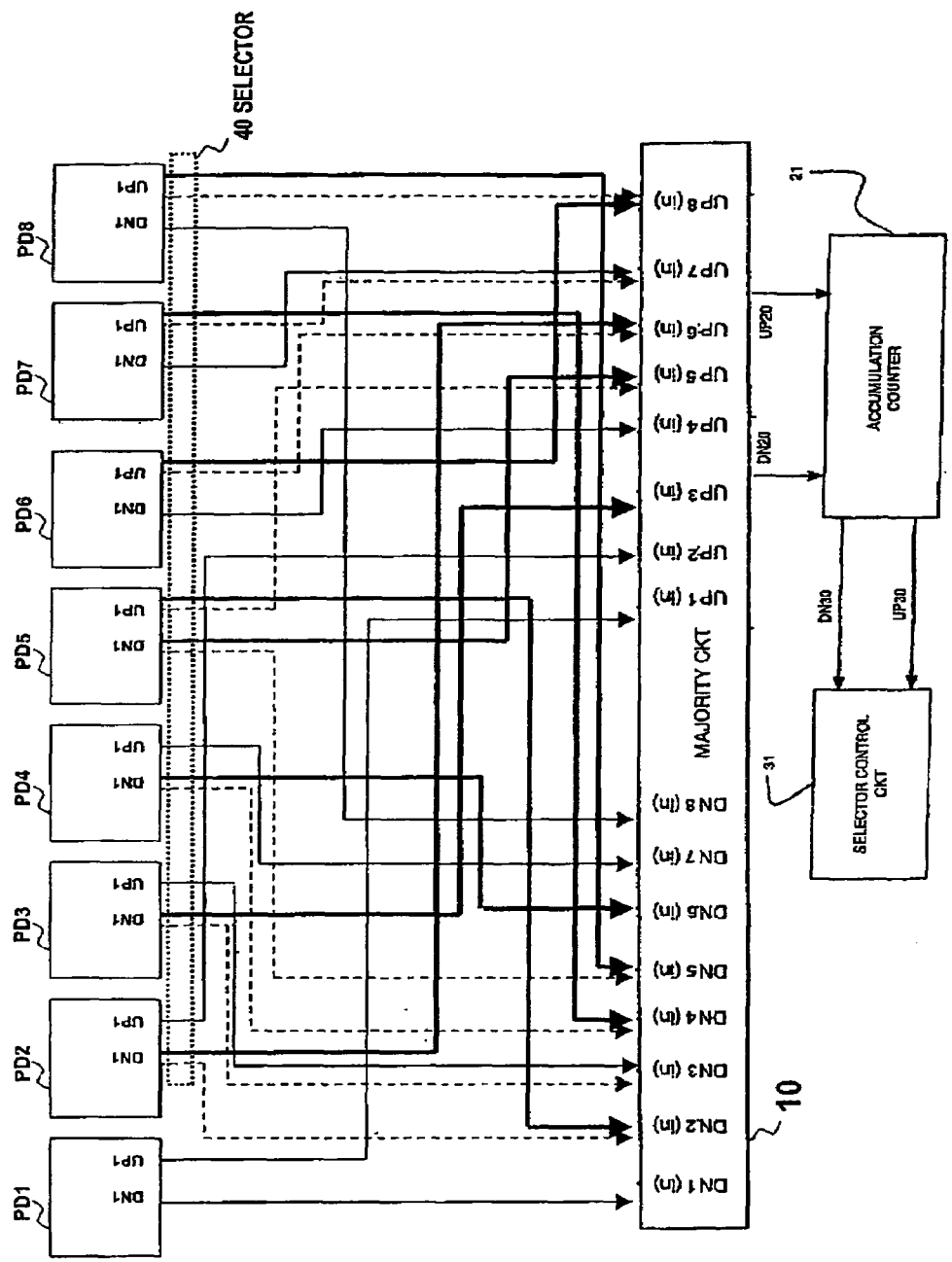
FIG. 19 is a block diagram showing a main part of a 2-times digital oversampling clock recovery circuit according to an alternative second embodiment of this invention that includes the phase comparators.

Referring to FIG. 19, it will be assumed that the phase control circuit produces sixteen-phase clock signals each having a clock signal of 312.5 MHz which is one-eighths of a data rate of 2.5 Gbps and the oversampling clock recovery circuit comprises first through eighth phase comparators PD1–PD8 with a one-to-eight correspondence with one bit of an input data and a majority circuit 10. Each of the first and the fifth phase comparators PD1 and PD5 corresponds to a transition point of the input data. The majority circuit 10 has eight DOWN signal input terminals DN1(in)–DN8(in) and eight UP signal input terminals UP1(in)–UP8(in). Each of the first and the fifth phase comparators PD1 and PD5 has a DOWN signal output terminal DN1 and an UP signal output terminal UP1 which are connected to a DOWN signal input terminal DN1(in)–DN8(in) and an UP signal input terminal UP1(in)–UP8(in) of the majority circuit 10 respectively. Each of the second and the sixth phase comparators PD2 and PD6 has a DOWN signal output terminal DN1 and an UP signal output terminals UP1 which are connected to UP signal input terminals UP1(in)–UP8(in) of the majority circuit 10. Each of the third and the seventh phase comparators PD3 and PD7 has a DOWN signal output terminal DN1 and an UP signal output terminal UP1 which are connected to an UP signal input terminal UP1(in)–UP8(in) and a DOWN signal input terminal DN1(in)–DN8(in) of the majority circuit 10, respectively. Each of the fourth and the eighth phase comparators PD4 and PD8 has a DOWN signal output terminal DN1 and an UP signal output terminal UP1 which are connected to DOWN signal output terminals DN1(in) DN8(in) of the majority circuit 10.

It will be assumed the oversampling clock recovery circuit is reconstructed for the input data having the data rate of 311 MHz. In this event, inasmuch as the data rate is one-eighths, the oversampling clock recovery circuit comprises first through 8N-th phase comparators PD1 through PD8N with a one-to-eight correspondence with one bit of an input data, where N represents a predetermined positive integer and a majority circuit having 8N DOWN signal input terminals and 8N UP signal input terminals. An (8n+1)-th phase comparator PD(8n+1) corresponds to a transition point of the input data, where n represents an integer between 0 to (N−1), both inclusive. The (8n+1)-th phase comparator PD(8n+1) has a DOWN signal output terminal and an UP signal output terminal which are connected to a DOWN signal input terminal and an UP signal input terminal of the majority circuit, respectively. Each of an (8n+2)-th phase comparator PD(8n+3), an (8n+3)-th phase comparator PD(8n+4), and an (8n+4)-th phase comparator PD(8n+4) has a DOWN signal output terminal and an UP signal output terminal which are connected to UP signal input terminals of the majority circuit. An (8n+5)-th phase comparator (8n+5) has a DOWN signal output terminal and an UP signal output terminal which are connected to an UP signal input terminal and a DOWN signal input terminal of the majority circuit, respectively. Each of an (8n+6)-th phase comparator PD(8n+6), an (8n+7)-th phase comparator PD(8n+7), and an (8n+8)-th phase comparator PD(8n+8) has a DOWN signal output terminal and an UP signal output terminal which are connected to DOWN signal input terminals of the majority circuit.

Figure 20:
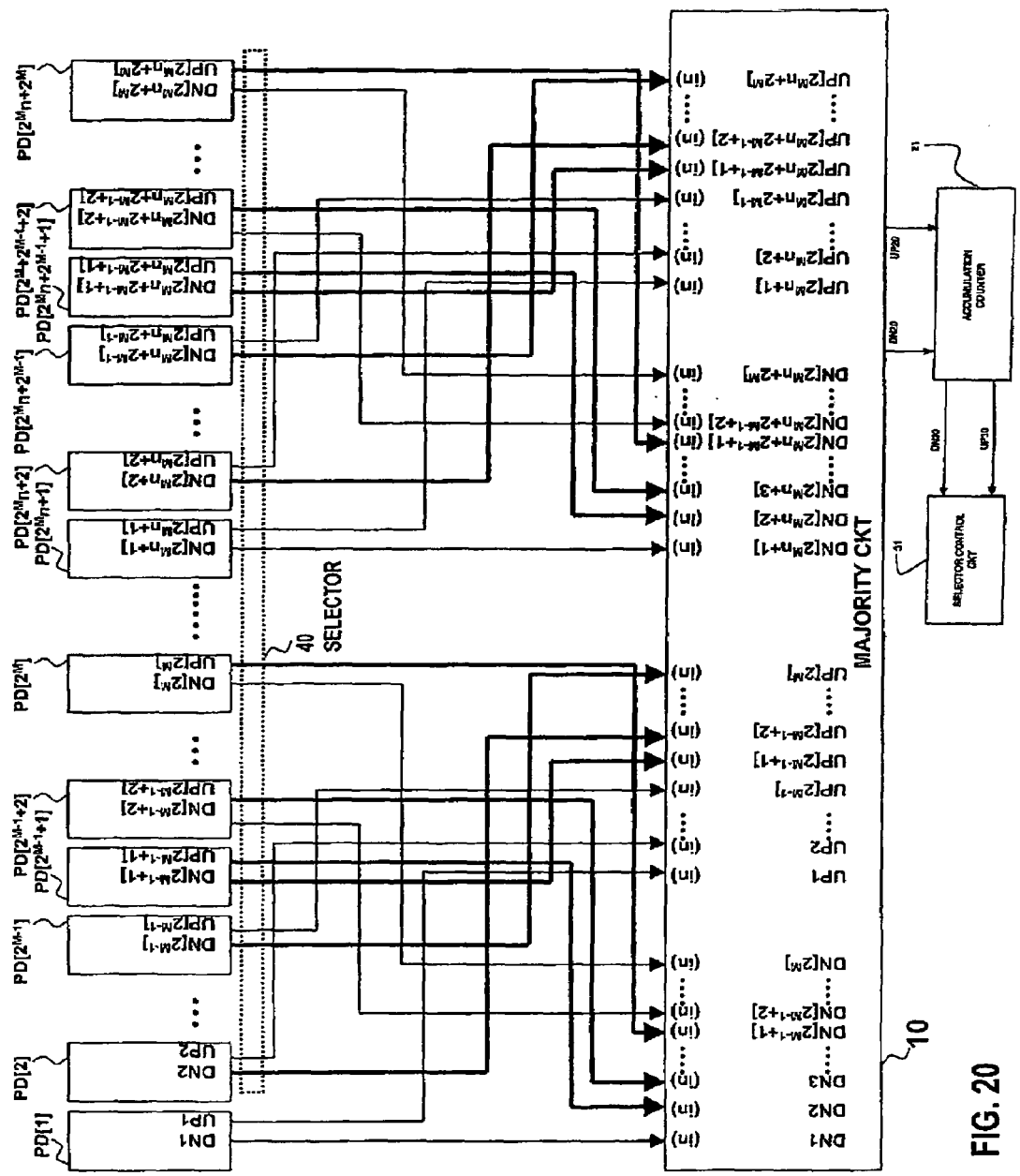
FIG. 20 is a block diagram showing a main part of a 2-times digital oversampling clock recovery circuit according to another alternative second embodiment of this invention that includes the phase comparators.

As shown in FIG. 20 in general, an oversampling clock recovery circuit comprises first through $2^M$N-th phase comparators PD[1]–PD[$2^M$n+$2^M$] with a one-to-$2^M$ correspondence with one bit of an input data, where M and N represent first and second predetermined positive integers, respectively, and a majority circuit 10 for deciding by majority on UP signals and DOWN signals supplied from the first through the $2^M$N-th phase comparators PD[1]–PD[$2^M$n+$2^M$]. Each of the first through the $2^M$N-th phase comparators PD[1]–PD[$2^M$n+$2^M$] has an UP signal output terminal UP1–UP[$2^M$n+$2^M$] for producing an UP signal and a DOWN signal output terminal DN1–DN[$2^M$n+$2^M$] for producing a DOWN signal. A ($2^M$n+1)-th phase comparator corresponds to a transition point of the input data, where n represents an integer between 0 to (N−1), both inclusive. The majority circuit 10 has $2^M$N UP signal input terminals UP1(in)–UP[$2^M$n+$2^M$](in) and $2^M$N DOWN signal input terminals DN1(in)–DN[$2^M$n+$2^M$](in). The ($2^M$n+1)-th phase comparator has a DOWN signal output terminal DN[$2^M$n+1] connected to a DOWN signal input terminal DN1(in)–DN[$2^M$n+$2^M$](in) of the majority circuit 10 and an UP signal output terminal UP[$2^M$n+1] connected to an UP signal input terminal UP1(in)–UP[$2^M$n+$2^M$](in) of the majority circuit 10. Each of ($2^M$n+2)-th through ($2^M$n+$2^{M-1}$)-th phase comparators has a DOWN signal output terminal DN[$2^M$n+2]–DN[$2^M$n+$2^{M-1}$] and an UP signal output terminal UP[$2^M$n+2]–UP[$2^M$n+$2^{M-1}$] which are connected to UP signal input terminals UP1(in)–UP[$2^M$n+$2^M$](in) of the majority circuit 10. A ($2^M$n+($2^{M-1}$+1))-th phase comparator has a DOWN signal output terminal DN[$2^M$n+$2^{M-1}$+1] connected to an UP signal input terminal UP1(in)–UP[$2^M$n+$2^M$](in) of the majority circuit 10 and an UP signal output terminal UP[$2^M$n+$2^{M-1}$+1] connected to a DOWN signal input terminal DN1(in)–UP[$2^M$n+$2^M$](in) of the majority circuit 10. Each of ($2^M$n+($2^{M-1}$+2))-th through ($2^M$n+$2^M$)-th phase comparators has a DOWN signal output terminal DN[$2^M$n+$2^{M-1}$+2]–DN[$2^M$n+$2^M$] and an UP signal output terminal UP[$2^M$n+$2^{M-1}$+2]–UP[$2^M$n+$2^M$] which are connected to DOWN signal input terminals UP1(in)–UP[$2^M$n+$2^M$](in) of the majority circuit 10.

RELATED ART

Referring to FIGS. 9A through 9E, 10, the description will proceed to an oversampling clock data recovery circuit in related art.

Figures 9A, 9B, 9C, 9D, 9E:
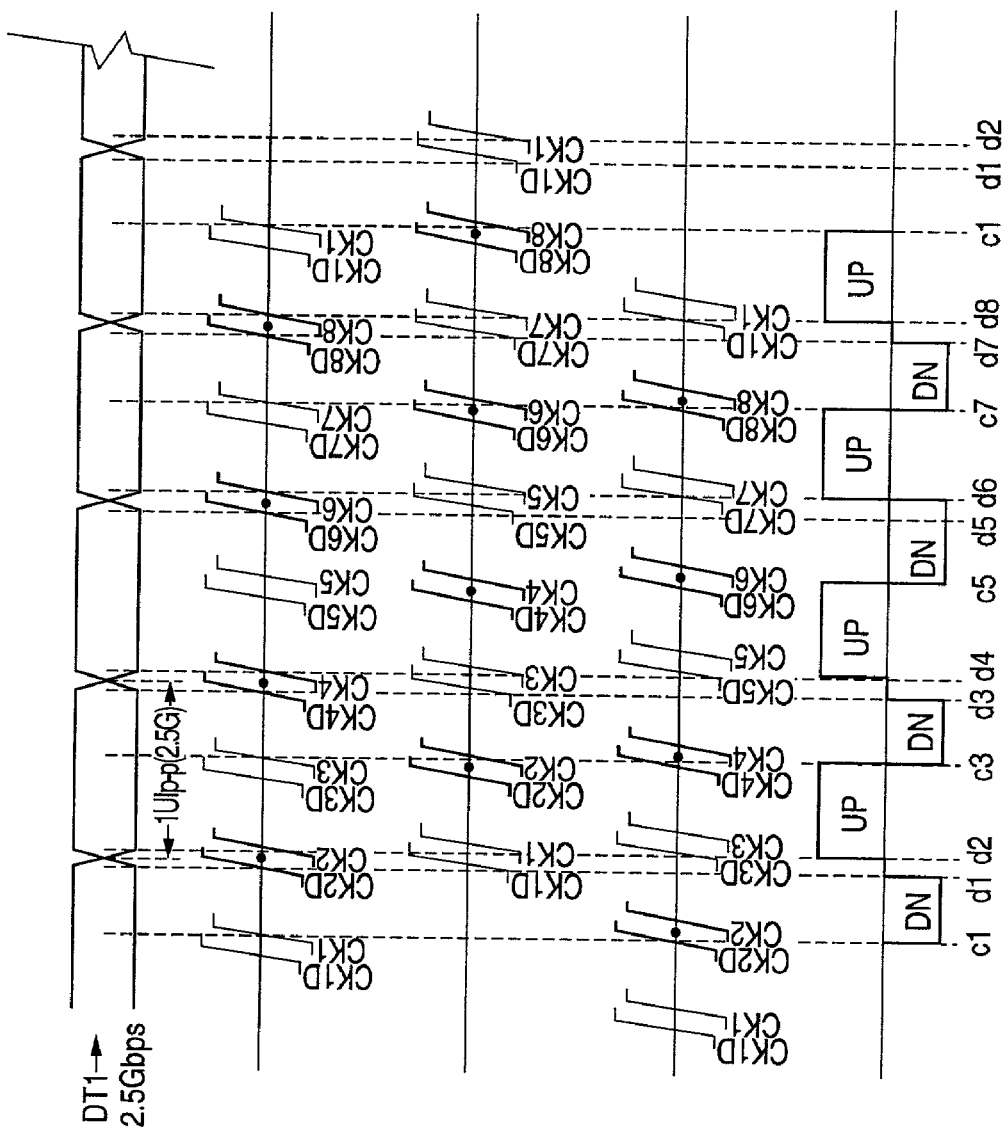
FIG. 9A is a time chart schematically showing a waveform of a first input data DT1.
FIGS. 9B through 9D are time charts schematically showing leading edges of primary eight-phase clock signals CK1 to CK8 and secondary eight-phase clock signals CK1D to CK8D.
FIG. 9E shows a phase comparison characteristic in phase comparators.
Figure 10:
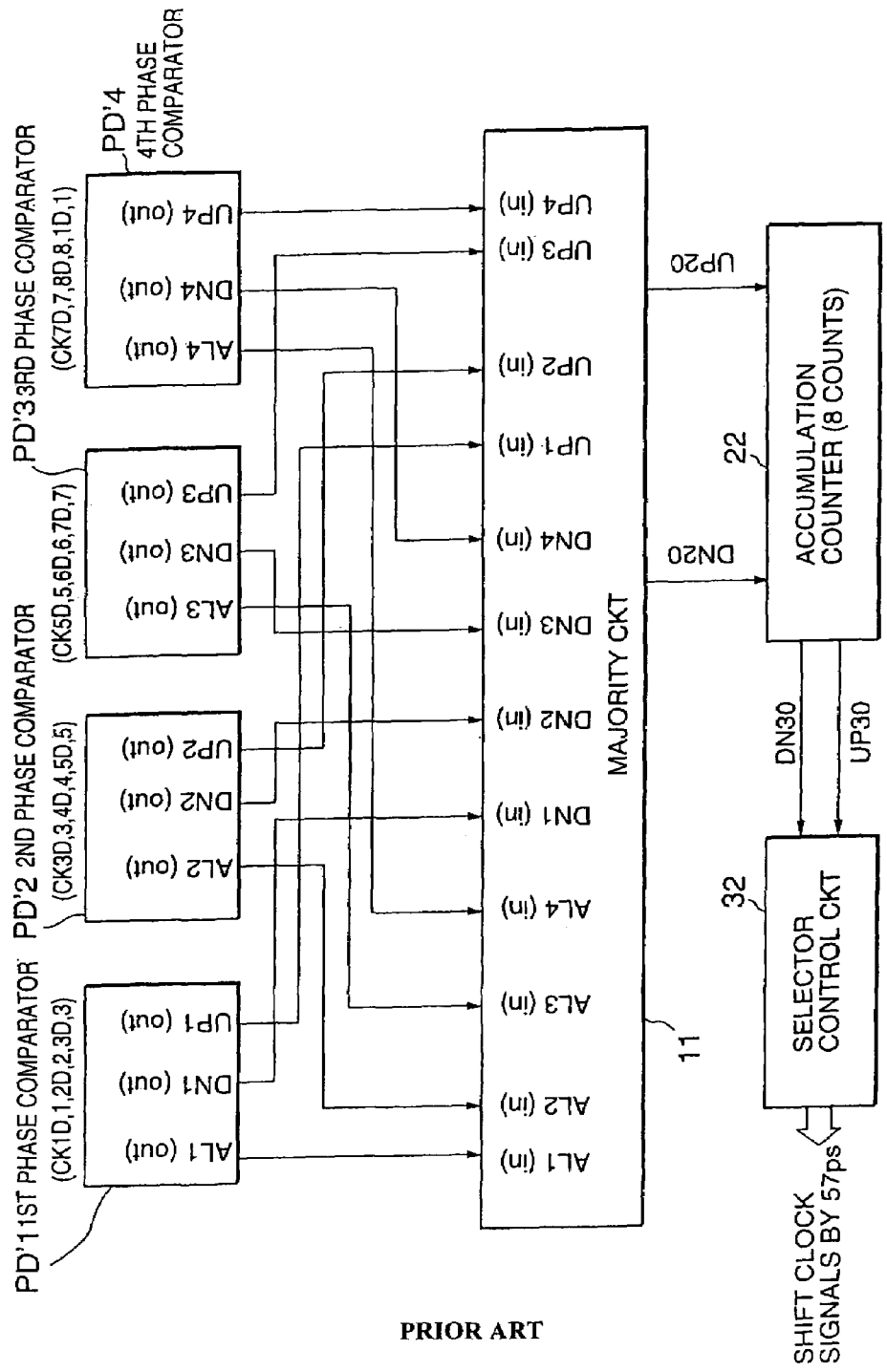
FIG. 10 is a block diagram showing a main part of a digital oversampling clock recovery circuit in related art that includes the phase comparators.

FIGS. 9A through 9E, and 10 are schematically views for use in describing an oversampling clock recovery circuit for a data rate of 2.5 Gbps that is a basic structure of the oversampling clock data recovery circuit according to the third embodiment of this invention. FIG. 9A is a time chart schematically showing a waveform of an input data DT1. FIGS. 9B through 9D are time charts schematically showing leading edges of primary eight-phase clock signals CK1 to CK8 and secondary eight-phase clock signals CK1D to CK8D. FIG. 9E shows a phase comparison characteristic in phase comparators. FIG. 10 is a block diagram showing a main part of the digital oversampling clock recovery circuit that includes the phase comparators.

As shown in FIG. 9A, the input data DT1 is a serial input data having a data rate of 2.5 Gbps and has a length of one bit equal to 400 ps. Flicker in the input data caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT1 is denoted by 1UT(2.5 G).

In FIGS. 9B through 9D, it will be assumed that the primary eight-phase clock signals CK1 through CK8 are called first through eighth primary clock signals, respectively. The primary eight-phase clock signals CK1 through CK8 are multi-phase clock signals which have a clock frequency of 625 MHz and which are arranged at equal intervals each having 200 ps. Such primary eight-phase clock signals CK1 through CK8 may favorably be generated by generating an original clock signal having a clock frequency of 625 MHz using a phase locked loop (PLL) and by expanding the original clock signal into the primary eight phase clock signals CK1 to CK8 using a delay locked loop (DLL). In addition, the primary eight-phase clock signals CK1 to CK8 are phase shifted with phase intervals held as a whole using a phase control circuit (not shown).

Similarly, it will be assumed that the secondary eight-phase clock signals CK1D through CK8D are called first through eighth secondary clock signals, respectively. The secondary eight-phase clock signals CK1D through CK8D are multi-phase clock signals which have a clock frequency of 625 MHz and which are arranged at equal intervals each having 200 ps. Such secondary eight-phase clock signals CK1D through CK8D may favorably be generated by generating an original clock signal having a clock frequency of 625 MHz using a phase locked loop (PLL) and by expanding the original clock signal into the secondary eight phase clock signals CK1D to CK8D using a delay locked loop (DLL). In addition, the secondary eight-phase clock signals CK1D to CK8D are phase shifted with phase intervals held as a whole using the phase control circuit (not shown).

The primary eight-phase clock signals CK1 to CK8 and the secondary eight-phase clock signals CK1D to CK8D are phase controlled at a resolution, for example, of 57 ps. The secondary eight-phase clock signals CK1D to CK8D are in phase put or held for the primary eight-phase clock signals CK1 to CK8 by one resolution of 57 ps. As a result, it is possible to generate sixteen-phase clock signals CK1 to CK8, CK1D to CK8D having non-uniform intervals as illustrated in FIGS. 9B through 9D. That is, the sixteen-phase clock signals CK1 to CK8, CK1D to CK8D are phase shifted as a whole with the non-uniform intervals held as shown in FIGS. 9B through 9D. This method is disclosed in U.S. Ser. No. 10/043,729 by the present inventor. It is not set a limit to this method; the sixteen-phase clock signals CK1 to CK8, CK1D to CK8D may be generated using a DLL. In this event, it is possible to generate the sixteen-phase clock signals CK1 to CK8, CK1D to CK8D by making delays between the clock signals CK1D-CK1, between the clock signals CK2D-CK2, between the clock signals CK3D-CK3, between the clock signals CK4D-CK4, between the clock signals CK5D-CK5, between the clock signals CK6D-CK6, between the clock signals CK7D-CK7, and between the clock signals CK8D-CK8 short (e.g. by inserting only one delay buffer therebetween) and making delays between the clock signals CK1-CK2D, between the clock signals CK2-CK3D, between the clock signals CK3-CK4D, between the clock signals CK4-CK5D, between the clock signals CK6-CK7D, between the clock signals CK7-CK8D, and between the clock signals CK8-CK1D long (e.g. by inserting two or more delay buffers therebetween). However, it is noted that it is difficult to implement a delay buffer operable at a very little propagation delay of about 50 ps by using the current technique.

As shown in FIG. 10, the illustrated digital oversampling clock recovery circuit comprises first through fourth phase comparators PD'1, PD'2, PD'3, and PD'4, a majority circuit 11, an accumulation counter 22, and a selector control circuit 32.

The first phase comparator PD'1 is supplied with a first set of six sampled data obtained by sampling the input data DT1 using the leading edges of a first set of successive six-phase clock signals, namely, the first secondary clock signal CK1D, the first primary clock signal CK1, the second secondary clock signal CK2D, the second primary clock signal CK2, the third secondary clock signal CK3D, and the third primary clock signal CK3. The first phase comparator PD'1 carries out a phase comparison on the basis of the first set of six sampled data.

Likewise, the second phase comparator PD'2 is supplied with a second set of six sampled data obtained by sampling the input data DT1 using the leading edges of a second set of successive six-phase clock signals, namely, the third secondary clock signal CK3D, the third primary clock signal CK3, the fourth secondary clock signal CK4D, the fourth primary clock signal CK4, the fifth secondary clock signal CK5D, and the fifth primary clock signal CK5. The second phase comparator PD'2 carries out a phase comparison on the basis of the second set of six sampled data.

The third phase comparator PD'3 is supplied with a third set of six sampled data obtained by sampling the input data DT1 using the leading edges of a third set of successive six-phase clock signals, namely, the fifth secondary clock signal CK5D, the fifth primary clock signal CK5, the sixth secondary clock signal CK6D, the sixth primary clock signal CK6, and the seventh secondary clock signal CK6D, and the seventh primary clock signal CK7. The third phase comparator PD'3 carries out a phase comparison on the basis of the third set of six sampled data.

The fourth phase comparator PD'4 is supplied with a fourth set of six sampled data obtained by sampling the input data DT1 using the leading edges of a fourth set of successive six-phase clock signals, the seventh secondary clock signal CK7D, the seventh primary clock signal CK7, the eighth secondary clock signal CK8D, the eighth primary clock signal CK8, and the first secondary clock signal CK1D, and the first primary clock signal CK1. The fourth phase comparator PD'4 carries out a phase comparison on the basis of the fourth set of six sampled data.

The first phase comparator PD'1 has a first synchronization signal output terminal AL1(out) for producing a first synchronization signal, a first UP signal output terminal UP1(out) for producing a first UP signal, and a first DOWN signal output terminal DN1(out) for producing a first DOWN signal, in the manner which will later be described. Similarly, the second phase comparator PD'2 has a second synchronization signal output terminal AL2(out) for producing a second synchronization signal, a second UP signal output terminal UP2(out) for producing a second UP signal, and a second DOWN signal output terminal DN2(out) for producing a second DOWN signal. The third phase comparator PD'3 has a third synchronization signal output terminal SL3(out) for producing a third synchronization signal, a third UP signal output terminal UP3(out) for producing a third UP signal, and a third DOWN signal output terminal DN3(out) for producing a third DOWN signal. The fourth phase comparator PD'4 has a fourth synchronization signal output terminal AL4(out) for producing a fourth synchronization signal, a fourth UP signal output terminal UP4(out) for producing a fourth UP signal, and a fourth DOWN signal output terminal DN4(out) for producing a fourth DOWN signal.

The majority circuit 11 has first through fourth synchronization signal input terminals AL1(in), AL2(in), AL3(in), and AL4(in), first through fourth UP signal input terminals UP1(in), UP2(in), UP3(in), and UP4(in), and first through fourth DOWN signal input terminals DN1(in), DN2(in), DN3(in), and DN4(in) which are connected to the first through the fourth synchronization output terminals AL1(out) to AL4(out), the first through the fourth UP signal output terminals UP1(out) to UP4(out), and the first through the fourth DOWN signal output terminals DN1(out) to DN4(out) in the manner which will later be described. The majority circuit 10 decides by majority of four ones in the first through the fourth synchronization signals, the first through the fourth UP signals, and the first through the fourth DOWN signals to produce, as a majority result, either a decided UP signal UP20 or a decided DOWN signal DN20 which is supplied to the accumulation counter 22.

In the manner which will later be described, the accumulation counter 22 carries out a count operation on the decided UP signal UP20 or the decided DWON signal DN20 to produce an accumulated UP signal UP30 or an accumulated DOWN signal DN30 which is supplied to the selector control circuit 32.

Responsive to the accumulated UP signal UP30, the selector control circuit 32 produces a UP control signal for shifting the clock signals forward by one resolution of 57 ps. Responsive to the accumulated DOWN signal DN30, the selector control circuit 32 produces a DOWN control signal for shifting the clock signals backward by the one resolution of 57 ps.

FIG. 9B shows a state where the sixteen-phase clock signals CK1 to CK8, CK1D to CK8D are phase locked at a desired phase of the input data DT1. As shown in FIG. 9B, by making phases of transition points in the input data DT1 phase lock between the clock signals CK2D-CK2, between the clock signals CK4D-CK4, between the clock signals CK6D-CK6, and between the clock signals CK8D-CK8, the leading edges of the first, the third, the fifth, and the seventh primary clock signals CK1, CK3, CK5, and CK7 are phase locked to a bit center of the input data DT1. Accordingly, it is possible to correctly read values of the input data DT1 at timings phase locked to the first, the third, the fifth, and the seventh primary clock signals CK1, CK3, CK5, and CK7.

As illustrated in FIG. 9B, it will be assumed that a middle point between the clock signals CK2D-CK2, a middle point between the clock signals CK4D-CK4, a middle point between the clock signal CK6D-CK6, and a middle point between the clock signals CK8D-CK8 lie between phases d1–d2, between phases d3–d4, between phases d5–d6, and between phases d7–d8 in this order, respectively. In this event, inasmuch as the first through the fourth phase comparators PD'1 to PD'4 can detect that the transition points of the input data DT1 lie between the clock signals CK2D-CK2, between the clock signals CK4D-CK4, between the clock signals CK6D-CK6, and between the clock signals CK8D-CK8, respectively, the first through the fourth phase comparators PD'1 to PD'4 decide that the clock signals phase lock to the desired phases of the input data DT1 to produce the first through the fourth synchronization signals, respectively.

The transition points of the input data DT1 sways caused by the jitter. As shown in FIG. 9C, it will be assumed that the middle point between the clock signals CK2D-CK2, the middle point between the clock signals CK4D-CK4, the middle point between the clock signal CK6D-CK6, and the middle point between the clock signals CK8D-CK8 lie between phases d2-c3, between phases d4-c5, between phases d6-c7, and between phases d8-c1 in this order, respectively. In this event, inasmuch as the first through the fourth phase comparators PD'1 to PD'4 can detect that the transition points of the input data DT1 lie between the clock signals CK1D-CK2D, between the clock signals CK3D-CK4D, between the clock signals CK5D-CK6D, and between the clock signals CK7D-CK8D in this order, respectively, the first through the fourth phase comparators PD'1 to PD'4 decide that the clock signals lag behind compared with the input data DT1 to produce the first through the fourth UP signals, respectively.

As shown in FIG. 9D, it will be assumed that the middle point between the clock signals CK2D-CK2, the middle point between the clock signals CK4D-CK4, the middle point between the clock signal CK6D-CK6, and the middle point between the clock signals CK8D-CK8 lie between phases c1-d1, between phases c3-d3, between phases c5-d5, and between phases d7—d7 in this order, respectively. In this event, inasmuch as the first through the fourth phase comparators PD'1 to PD'4 can detect that the transition points of the input data DT1 lie between the clock signals CK2-CK3D, between the clock signals CK4-CK5D, between the clock signals CK6-CK7D, and between the clock signals CK8-CK1D in this order, respectively, the first through the fourth phase comparators PD'1 to PD'4 decide that the clock signals gain compared with the input data DT1 to produce the first through the fourth DOWN signals, respectively.

As shown in FIG. 10, the first through the fourth UP signal output terminals UP1(out) to UP4(out) of the first through the fourth phase comparators PD'1 to PD'4 are connected to the first through the fourth UP signal input terminals UP1(in) to UP4(in) of the majority circuit 11, respectively. The first through the fourth synchronization signal output terminals AL1(out) to AL4(out) of the first through the fourth phase comparators PD'1 to PD'4 are connected to the first through the fourth synchronization signal input terminals AL1(in) to AL4(in) of the majority circuit 11, respectively.

The majority circuit 11 decides by majority of four ones in the first through the fourth synchronization signals, the first through the fourth UP signals, and the first through the fourth DOWN signals to supply, as a majority result, either a decided UP signal UP20 or a decided DOWN signal DN20 to the accumulation counter 22.

The accumulation counter 22 carries out the count operation on the decided UP signal UP20 or the decided DOWN signal DN20 in the manner which will presently be described. The accumulation counter 22 supplies the selector control circuit 32 with the accumulated UP signal UP30 or the accumulated DOWN signal DN30.

More specifically, the accumulation counter 22 initially has an accumulated value of zero. Responsive to the decided UP signal UP20, the accumulation counter 22 adds one to the accumulated value or counts the accumulated value up by one. Responsive to the decided DOWN signal DN20, the accumulation counter 22 subtracts one from the accumulated value or counts the accumulated value down by one. When the accumulated value is equal to plus eight or +8, the accumulation counter 22 initializes the accumulated value to reset the accumulated value to zero or 0 and supplies the accumulated UP signal UP30 to the selector control circuit 32. When the accumulated value is equal to minus eight or −8, the accumulation counter 22 initializes the accumulated value to reset the accumulated value to zero or 0 and supplies the accumulated DOWN signal DN30 to the selector control circuit 32.

Responsive to the accumulated UP signal UP30, the selector control circuit 32 supplies a phase control circuit (not shown) with the UP control signal for shifting the sixteen-phase clock signals CK1 to CK8 and CK1D to CK8D forward by one resolution. Responsive to the accumulated DOWN signal DN30, the selector control circuit 32 supplies the phase control circuit with the DOWN control signal for shifting the sixteen-phase clock signals CK1 to CK8 and CK1D to CK8D backward by the one resolution. The one resolution is equal to a phase difference between the clock signals CK1D-CK1, between the clock signals CK2D-CK2, between the clock signals CK3D-CK3, between the clock signals CK4D-CK4, between the clock signals CK5D-CK5, between the clock signals CK6D-CK6, between the clock signals CK7D-CK7, and between the clock signals CK8D-CK8. In the example being illustrated, the one resolution is equal to 57 ps.

The oversampling clock recovery circuit according to the third embodiment of this invention is an embodiment obtained by making two alternations in structure of the digital oversampling clock recovery circuit described in conjunction with FIGS. 9A through 9E and 10 in the manner which will later be described.

Third Embodiment

Figure 11:
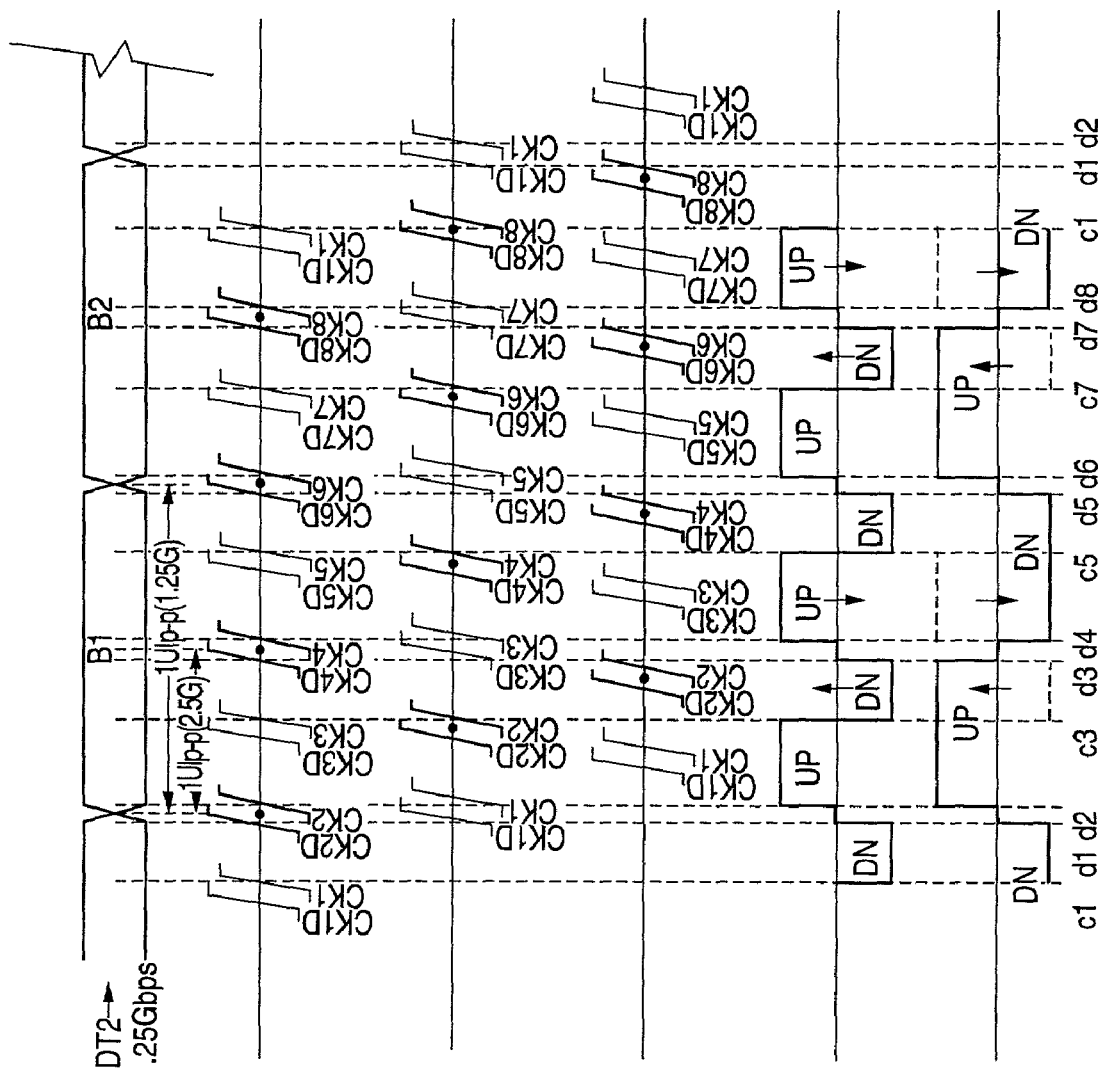
FIG. 11A is a time chart schematically showing a waveform of a second input data DT2.
FIGS. 11B through 11D are time charts schematically showing leading edges of sixteen-phase clock signals CK1 to CK8 and CK1D to CK8D.
FIGS. 11E and 11F show a phase comparison characteristic in phase comparators.
Figure 12:
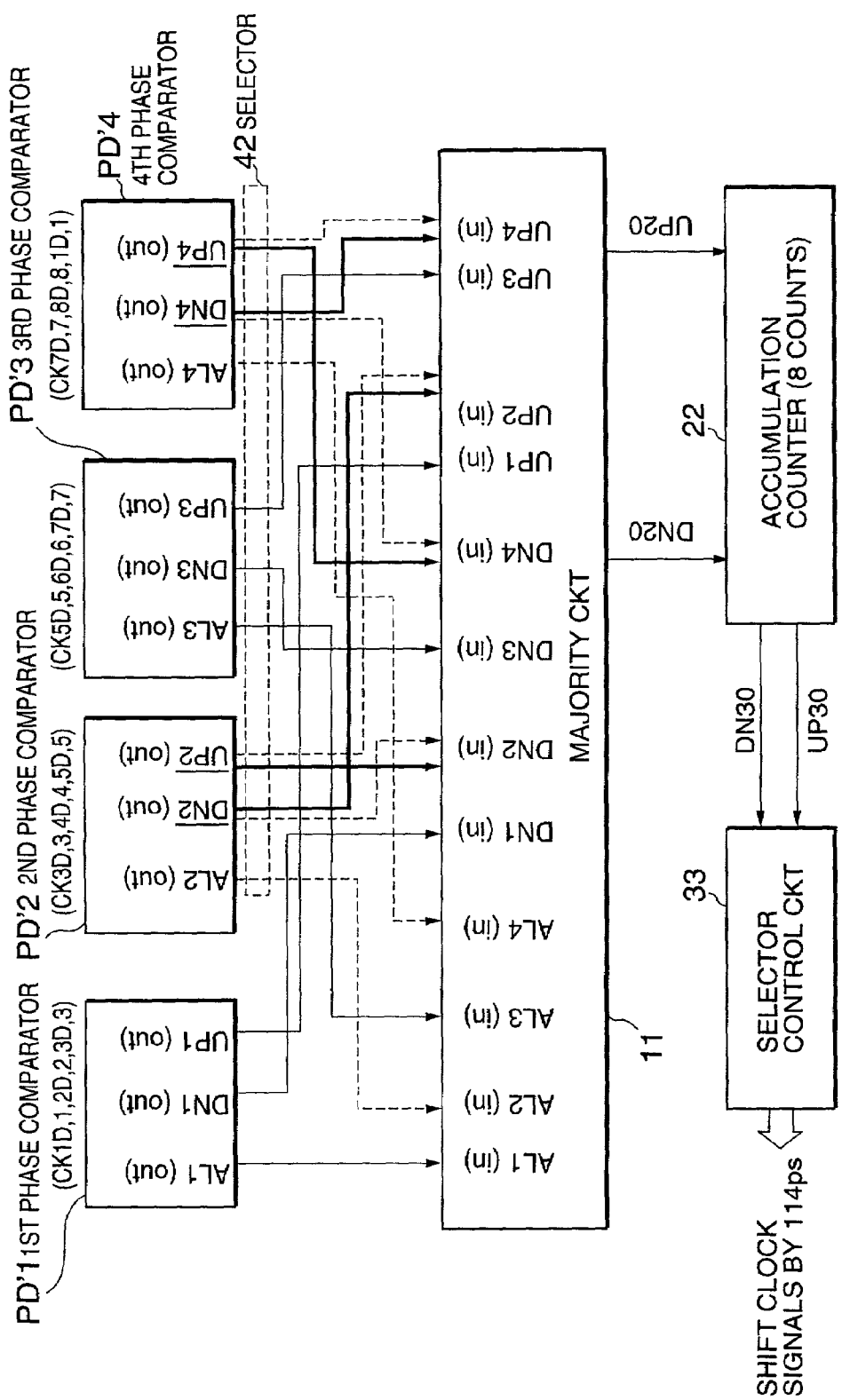
FIG. 12 is a block diagram showing a main part of a digital oversampling clock recovery circuit according to a third embodiment of this invention that includes the phase comparators.

Referring to FIGS. 11A through 11F and FIG. 12, the description will proceed to an oversampling clock recovery circuit according to a third embodiment of this invention. FIG. 11A is a time chart schematically showing a waveform of an input data DT2. FIGS. 11B through 11D are time charts schematically showing leading edges of sixteen-phase clock signals CK1 to CK8 and CK1D to CK8D. FIGS. 11E and 11F show a phase comparison characteristic in phase comparators. FIG. 12 is a block diagram showing a main part of the digital oversampling clock recovery circuit that includes the phase comparators.

As shown in FIG. 11A, the input data DT2 is a serial input data having a data rate of 1.25 Gbps and has a length of one bit equal to 800 ps. Flicker in the input data DT2 caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT2 is denoted by 1UT(1.25 G). As shown in FIG. 11A, 1UIp-p(1.25 G) corresponds to 2UIp-p(2.5 G).

Firstly, a correspondence relationship between output terminals of the second and the fourth phase comparators PD'2 and PD'4 and input terminals of the majority circuit 11 is altered.

Secondary, resolution (an amount for shifting once) in a selector control circuit 33 is changed from 57 ps to 114 ps.

Now, a first alternation will be described in detail. As shown in FIG. 12, the second UP signal output terminal UP2(out) of the second phase comparator PD'2 is connected to the second DOWN signal input terminal DN2(in) of the majority circuit 11 in lieu of the second UP signal input terminal UP1(in). The second DOWN signal output terminal DN2(out) of the second phase comparator PD'2 is connected to the second UP signal input terminal UP2(in) of the majority circuit 11 in lieu of the second DOWN signal input terminal DN2(in). The second synchronization signal output terminal AL2(out) of the second phase comparator PD'2 is connected to a ground terminal (not shown) in lieu of the second synchronization signal input terminal AL2(in).

Likewise, the fourth UP signal output terminal UP4(out) of the fourth phase comparator PD'4 is connected to the fourth DOWN signal input terminal DN4(in) of the majority circuit 11 in place of the fourth UP signal input terminal UP4(in). The fourth DOWN signal output terminal DN4(out) of the fourth phase comparator PD'4 is connected to the fourth UP signal input terminal UP4(in) of the majority circuit 11 in place of the fourth DOWN signal input terminal DN4(in). The fourth synchronization signal output terminal AL4(out) of the fourth phase comparator PD'4 is connected to the ground terminal (not shown) in place of the fourth synchronization signal input terminal AL4(in). In FIG. 12, wiring before alternation is depicted at a broken line.

The illustrated digital oversampling clock recovery circuit further may comprise a selector 42 for changing connections between inputs and outputs before alternation into connections between inputs and outputs after alternation.

Now, the description will proceed to a phase comparison characteristic of the digital oversampling clock recovery circuit illustrated in FIG. 12.

FIG. 11B shows a state where the sixteen-phase clock signals CK1 to CK8 and CK1D to CK8D are phase locked to a desired phase of the input data DT2. As shown in FIG. 5B, by making a middle point between the clock signals CK2D-CK2 and a middle point between the clock signals CK62D-CK6 phase lock to phases of transition points in the input data DT2, the leading edges of the fourth and the eighth clock signals CK4 and CK8 are phase locked to a bit center of the input data DT2. Accordingly, it is possible to correctly read values of the input data DT2 at timings phase locked to the fourth and the eighth clock signals CK4 and CK8.

As shown in FIG. 11C, it will be assumed that the middle point between the clock signals CK2D-CK2 and the middle point between the clock signals CK6D-CK6 lie between phases d2 and c3 and between phases d6 and c7, respectively. In this event, the first phase comparator PD'1 detects that the transition point of the input data DT2 lies between the first secondary clock signal CK1D and the second secondary clock signal CK2D on the basis of the first set of the six sampled data obtained by sampling the input data DT2 by the first set of the clock signals CK1D, CK1, CK2D, CK2, CK3D, and CK3. Accordingly, the first phase comparator PD'1 determines that the phases of the clock signals should be put forward (UP) because the clock signals lag behind. Under the circumstances, the first phase comparator PD'1 supplies the first UP signal to the majority circuit 11 as shown in FIG. 12.

Similarly, the third phase comparator PD'3 detects that the transition point of the input data DT2 lies between the fifth secondary clock signal CK5D and the sixth secondary clock signal CK6D on the basis of the third set of the six sampled data obtained by sampling the input data DT2 by the third set of the clock signals CK5D, CK5, CK6D, CK6, CK7D, and CK7. Accordingly, the third phase comparator PD'3 determines that the phases of the clock signals should be put forward (UP) because the clock signals lag behind. Under the circumstances, the third phase comparator PD'3 supplies the third UP signal to the majority circuit 11 as shown in FIG. 12.

In addition, inasmuch as the second phase comparator PD'2 cannot detect the transition point of the input data DT2 on the basis of the second set of the six sampled data obtained by sampling the input data DT2 by the second set of the clock signals Ck3D, CK3, CK4D, CK4, CK5D, and CK5, the second phase comparator PD'2 produces neither the second UP signal nor the second DOWN signal. Likewise, inasmuch as the fourth phase comparator PD'4 cannot detect the transition point of the input data DT2 on the basis of the fourth set of the six sampled data obtained by sampling the input data DT2 by the fourth set of the clock signals CK7D, CK7, CK8D, CK8, CK1D, and CK1, the fourth phase comparator PD'4 produces neither the fourth UP signal nor the fourth DOWN signal.

As shown in FIG. 11D, it will be assumed that the middle point between the clock signals CK2D-CK2 and the middle point between the clock signals CK6D-CK6 lie between phases c3 and d3 and between phases c7 and d7, respectively. In this event, the second phase comparator PD'2 detects that the transition point of the input data DT2 lies between the fourth primary clock signal CK4 and the fifth secondary clock signal CK5D on the basis of the second set of the six sampled data obtained by sampling the input data DT2 by the second set of the clock signals CK3D, CK3, CK4D, CK4, CK5D, and CK5. Accordingly, the second phase comparator PD'2 determines that the phases of the clock signals should be put backward (DOWN) because the clock signals gain. Under the circumstances, the second phase comparator PD'2 supplies the second DOWN signal to the majority circuit 11. However, in this case, inasmuch as the second DOWN signal output terminal DN2(out) of the second phase comparator PD'2 is connected to the second UP signal input terminal UP2(in) of the majority circuit 11 as illustrated in FIG. 12, the majority circuit 11 decides by majority by counting the second DOWN signal as the second UP signal.

Similarly, the fourth phase comparator PD'4 detects that the transition point of the input data DT2 lies between the eighth primary clock signal CK8 and the first secondary clock signal CK1D on the basis of the fourth set of the six sampled data obtained by sampling the input data DT2 by the fourth set of the clock signals CK7D, CK7, CK8D, CK8, CK1D, and CK1. Accordingly, the fourth phase comparator PD'4 determines that the phases of the clock signals should be put backward (DOWN) because the clock signals gain. Under the circumstances, the fourth phase comparator PD'4 supplies the fourth DOWN signal to the majority circuit 11. However, in this case, inasmuch as the fourth DOWN signal output terminal DN4(out) of the fourth phase comparator PD'4 is connected to the fourth UP signal input terminal UP4(in) of the majority circuit 11 as illustrated in FIG. 12, the majority circuit 11 decides by majority by counting the fourth DOWN signal as the fourth UP signal.

In addition, inasmuch as the first phase comparator PD'1 cannot detect the transition point of the input data DT2 on the basis of the first set of the six sampled data obtained by sampling the input data DT by the first set of the clock signals CK1D, CK1, CK2D, CK2, CK3D, and CK3, the first phase comparator PD'1 produces neither the first UP signal nor the first DOWN signal. Likewise, inasmuch as the third phase comparator PD'3 cannot detect the transition point of the input data DT2 on the basis of the third set of the six sampled data obtained by sampling the input data DT1 by the third set of the clock signals CK5D, CK5, CK6D, CK6, CK7D, and CK7, the third phase comparator PD'3 produces neither the third UP signal nor the third DOWN signal.

Although illustration is not made, it will be assumed that the middle point between the clock signals CK2D-CK2 and the middle point between the clock signals CK6D-CK6 lie between phases c1-d1 and between phases c5-d5, respectively. In this event, inasmuch as the first phase comparator PD'1 detects that the transition point of the input data DT2 lies between the clock signals CK2-CK3D, the first phase comparator PD'1 determines that the phases of the clock signals should be put backward (DOWN) because the clock signals gain. Under the circumstances, the first phase comparator PD'1 supplies the first DOWN signal to the majority circuit 11 as shown in FIG. 12.

Similarly, inasmuch as the third phase comparator PD'3 detects that the transition point of the input data DT2 lies between the clock signals CK6-CK7D, the third phase comparator PD'3 determines that the phases of the clock signals should be put backward (DOWN) because the clock signals gain. Under the circumstances, the third phase comparator PD'3 supplies the third DOWN signal to the majority circuit 11 as shown in FIG. 12.

In addition, inasmuch as the second phase comparator PD'2 cannot detect the transition point of the input data DT2, the second phase comparator PD'2 produces neither the second UP signal nor the second DOWN signal. Likewise, inasmuch as the fourth phase comparator PD'4 cannot detect the transition point of the input data DT2, the fourth phase comparator PD'4 produces neither the fourth UP signal nor the fourth DOWN signal.

Although illustration is not made, it will be assumed that the middle point between the clock signals CK2D-CK2 and the middle point between the clock signals CK6D-CK6 lie between phases d8-c1 and between phases d4-c5, respectively. In this event, inasmuch as the second phase comparator PD'2 detects that the transition point of the input data DT2 lies between the third primary clock signal CK3 and the fourth secondary clock signal CK4D the second phase comparator PD'2 determines that the phases of the clock signals should be put forward (UP) because the clock signals lag behind. Under the circumstances, the second phase comparator PD'2 supplies the second UP signal to the majority circuit 11. However, in this case, inasmuch as the second UP signal output terminal UP2(out) of the second phase comparator PD'2 is connected to the second DOWN signal input terminal DN2(in) of the majority circuit 11 as illustrated in FIG. 12, the majority circuit 11 decides by majority by counting the second UP signal as the second DOWN signal.

Similarly, inasmuch as the fourth phase comparator PD'4 detects that the transition point of the input data DT2 lies between the seventh primary clock signal CK7 and the eighth secondary clock signal CK8D, the fourth phase comparator PD'4 determines that the phases of the clock signals should be put forward (UP) because the clock signals lag behind. Under the circumstances, the fourth phase comparator PD'4 supplies the fourth UP signal to the majority circuit 11. However, in this case, inasmuch as the fourth UP signal output terminal UP4(out) of the fourth phase comparator PD'4 is connected to the fourth DOWN signal input terminal DN4(in) of the majority circuit 11 as illustrated in FIG. 12, the majority circuit 11 decides by majority by counting the fourth UP signal as the fourth DOWN signal.

In addition, inasmuch as the first phase comparator PD'1 cannot detect the transition point of the input data DT2, the first phase comparator PD'1 produces neither the first UP signal nor the first DOWN signal. Likewise, inasmuch as the third phase comparator PD'3 cannot detect the transition point of the input data DT2, the third phase comparator PD'3 produces neither the third UP signal nor the third DOWN signal.

On summarizing the above-mentioned phase comparison characteristic, by changing the connections between the output terminals of the second and the fourth phase comparators PD'2 and PD'4 and the input terminals of the majority circuit 11 in the manner which is described above, the phase comparison characteristic is changed so as to suit the input data DT2 having the data rate of 1.25 Gbps as illustrated in FIG. 11F. More specifically, as is apparent from FIGS. 11E and 11F, DN decision between the phases c3-d3 is changed to UP decision, UP decision between the phases d4-c5 is changed to DN decision, DN decision between the phases c7-d7 is changed to UP decision, and UP decision between the phases d8-c1 is changed to DN decision. In other words, while the middle point between the clock signals CK2D-CK3 (the middle point between the clock signals CK6D-CK6) lies between the phases d2–d3 (d6–d7), UP decision is carried out. While the middle point between the clock signals CK2D-CK2 (the middle point between the clock signals CK6D-CK6) lies between the phases d8-d1 (d4–d5), DN decision is carried out. Only when the middle point between the clock signals CK2D-CK2 (the middle point between the clock signals CK6D-CK6) lies between the phases d1–d2 (d5–d6), synchronization decision is carried out. Accordingly, it is possible to recovery the state illustrated in FIG. 11A to make the clock signals follow the input data DT2. Inasmuch as the resolution for phase controlling the sixteen-phase clock signals CK1 to CK8 and CK1D-CK8D is twice, a following speed of the clock signals becomes twice. Accordingly, it is possible to ensure a sufficient follow-up for the input data DT2 having the data rate of 1.25 Gbps.

The third embodiment described above is nothing but an embodiment of this invention. In general, the oversampling clock recovery circuit comprises first through 2N-th phase comparators PD'1 through PD'2N with a one-to-two correspondence with one bit of an input data, where N represents a positive integer and a majority circuit. Each of the first through the 2N-th phase comparators has a synchronization signal output terminal for producing a synchronization signal, an UP signal output terminal for producing an UP signal, and a DOWN signal output terminal for producing a DOWN signal. Each of N odd numbered phase comparators PD'(2n+1) corresponds to a transition point of the input data, where n represents an integer between 0 and (N−1), both inclusive. The majority circuit decides by majority on synchronization signals, UP signals, and DOWN signals supplied from the first through the 2N-th phase comparators. The majority circuit has 2N synchronization signal input terminals, 2N UP signal input terminals, and 2N DOWN signal output terminals. The N odd numbered phase comparators PD'(2n+1) have N synchronization signal output terminals connected to N synchronization signal input terminals of the majority circuit, N UP signal output terminals connected to N UP signal input terminals of the majority circuit, and N DOWN signal output terminals connected to N DOWN signal input terminals of the majority circuit. N even numbered phase comparators PD'(2n+2) have N DOWN signal output terminals connected to N UP signal input terminals of the majority circuit, N UP signal output terminals connected to N DOWN signal input terminals of the majority circuit, and N synchronization signal output terminals disconnected to N synchronization signal input terminals of the majority circuit.

Fourth Embodiment

Figure 13:
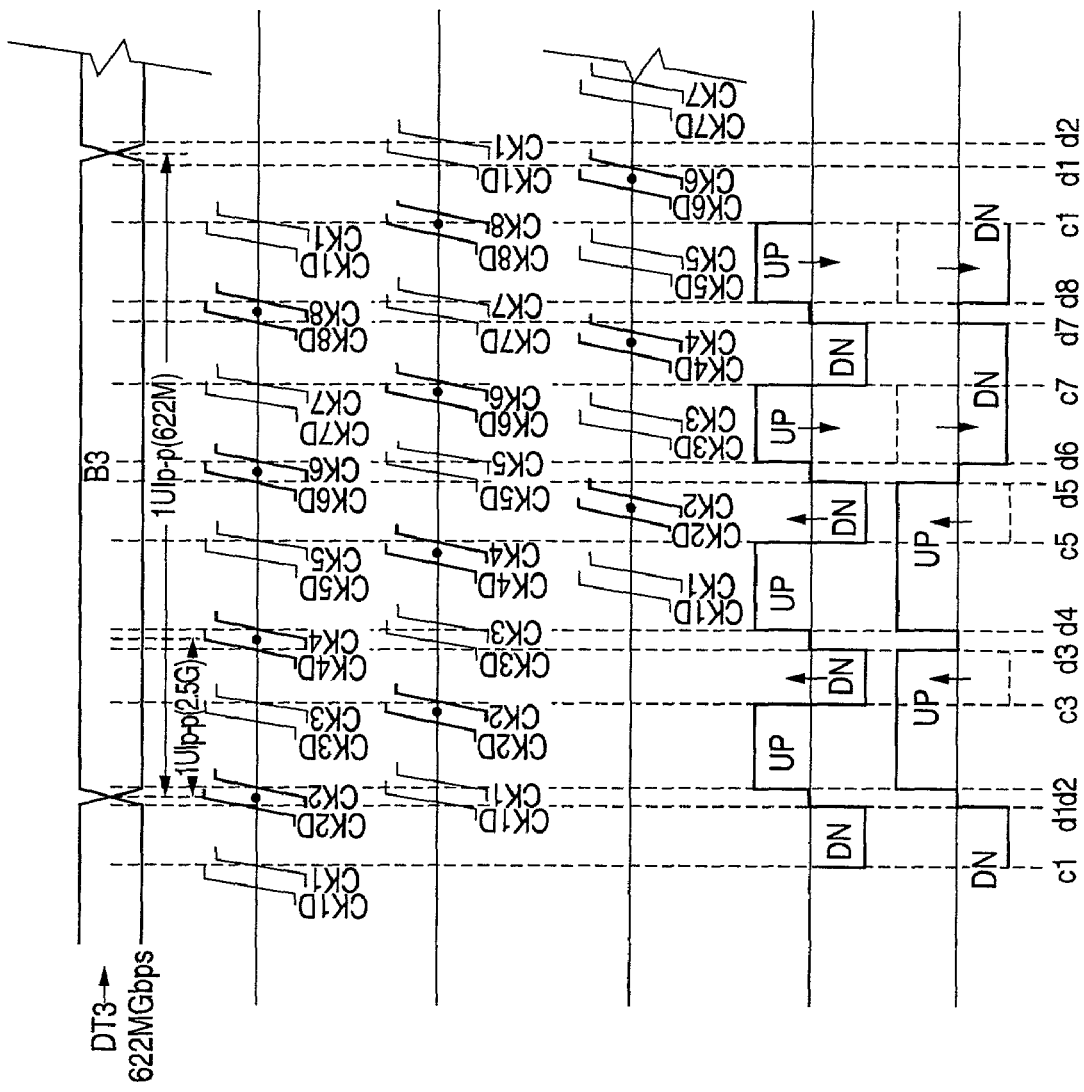
FIG. 13A is a time chart schematically showing a waveform of a third input data DT3.
FIGS. 13B through 13D are time charts schematically showing leading edges of sixteen-phase clock signals CK1 to CK8 and CK1D to CK8D.
FIGS. 13E and 13F show a phase comparison characteristic in phase comparators.
Figure 14:
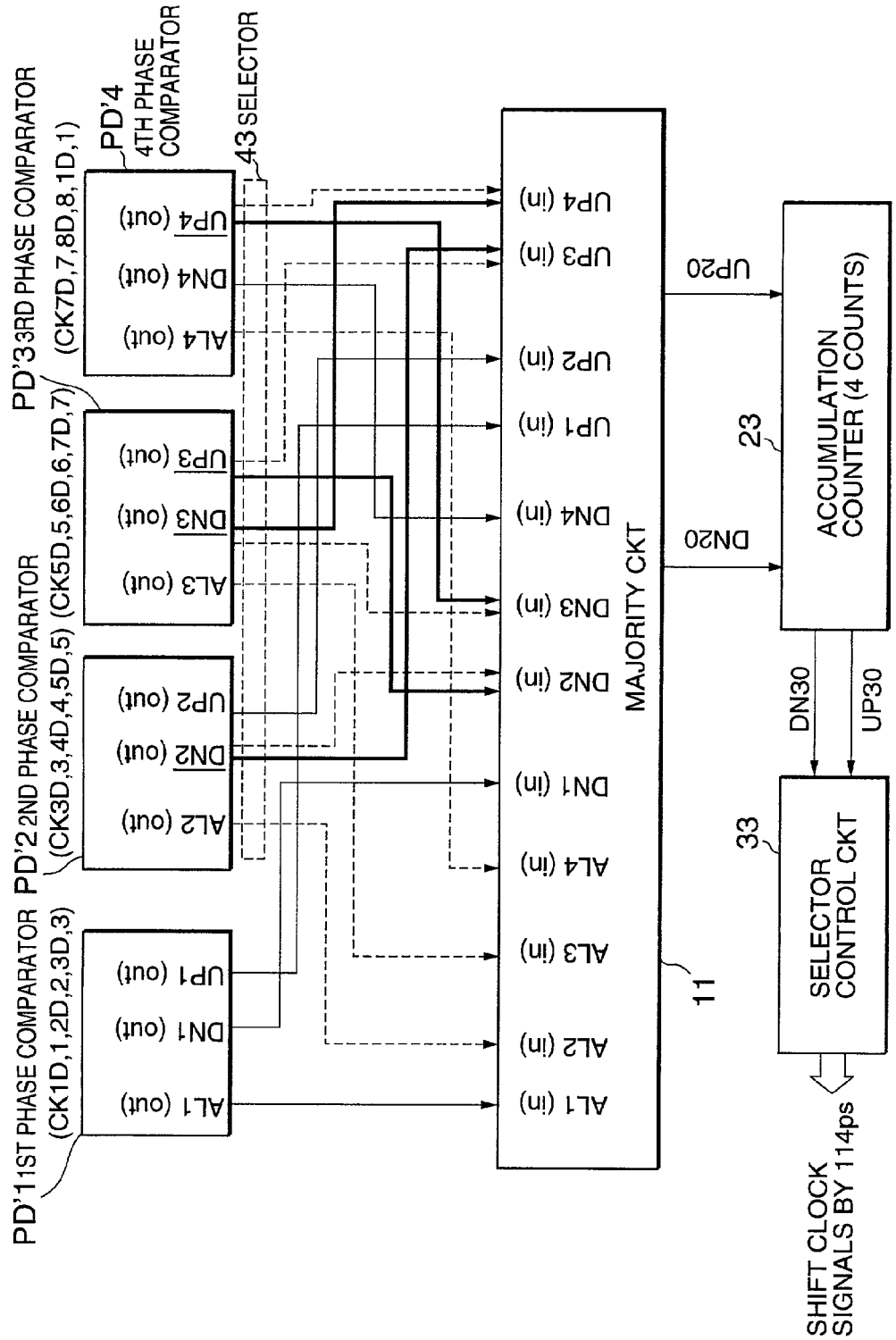
FIG. 14 is a block diagram showing a main part of a digital oversampling clock recovery circuit according to a fourth embodiment of this invention that includes the phase comparators.

Referring to FIGS. 13A through 13F and FIG. 14, the description will proceed to a digital oversampling clock recovery circuit according to a fourth embodiment of this invention. FIG. 13A is a time chart schematically showing a waveform of an input data DT3. FIGS. 13B through 13D are time charts schematically showing leading edges of sixteen-phase clock signals CK1 to CK8 and CK1D to CK8D. FIGS. 13E and 13F show a phase comparison characteristic in phase comparators. FIG. 14 is a block diagram showing a main part of the digital oversampling clock recovery circuit that includes the phase comparators.

As shown in FIG. 13A, the input data DT3 is a serial input data having a data rate of 622 Mbps and has a length of one bit equal to 1600 ps. Flicker in the input data DT3 caused by jitter is dependent on the data rate. Inasmuch as it is convenient to use, as an indicator of a magnitude of the flicker, a unit of a bit length, a length of one bit is represented by 1UI (unit interval) in the art. Inasmuch as the length of 1UT is different by the data rate, 1UI in the input data DT3 is denoted by 1UT(622 M). As shown in FIG. 13A, 1UIp-p(622 M) corresponds to 4UIp-p(2.5 G).

The illustrated digital oversampling clock recovery circuit according to the fourth embodiment is an embodiment obtained by making three alternations in structure of the digital oversampling clock recovery circuit described in conjunction with FIG. 10.

Firstly, a correspondence relationship between output terminals of the second, the third, and the fourth phase comparators PD'2, PD'3, and PD'4 and input terminals of the majority circuit 11 is altered.

Secondary, resolution (an amount for shifting once) in the selector control circuit 33 is changed from 57 ps to 114 ps.

Thirdly, an accumulation counter 23 has a count number which is changed from 8 to 4.

Now, a first alternation will be described in detail. As shown in FIG. 14, the second and the third DOWN signal output terminals DN2(out) and DN3(out) of the second and the third phase comparators PD'2 and PD'3 are connected to the third and the fourth UP signal input terminals UP3(in) and UP4(in) of the majority circuit 11 in lieu of the second and the third DOWN signal input terminals DN2(in) and DN3(in). The third and the fourth UP signal output terminals UP3(out) and UP4(out) of the third and the fourth phase comparator PD'3 and PD'4 are connected to the second and the third DOWN signal input terminal DN2(in) and DN3(in) of the majority circuit 11 in lieu of the third and the fourth UP signal input terminals UP3(in) and UP4(in). In addition, the second through the fourth synchronization output terminals AL2(out), AL3(out), and AL4(out) of the second through the fourth phase comparators PD'2 to PD'4 are connected to a ground terminal (not shown). In FIG. 14, wiring before alternation is depicted at a broken line.

The illustrated digital oversampling clock recovery circuit further may comprise a selector 43 for changing connections between inputs and outputs before alternation into connections between inputs and outputs after alternation.

Now, the description will proceed to a phase comparison characteristic of the digital oversampling clock recovery circuit illustrated in FIG. 14.

FIG. 14B shows a state where the sixteen-phase clock signals CK1 to CK8 and CK1D to CK8D are phase locked to a desired phase of the input data DT3. As shown in FIG. 7B, by making a middle point between the second secondary clock signal CK2D and the second primary clock signal CK2 phase lock to a phase of a transition point in the input data DT3, the leading edge of the sixth primary clock signal CK6 is phase locked to a bit center of the input data DT3. Accordingly, it is possible to correctly read values of the input data DT3 at a timing phase locked to the sixth primary clock signal CK6.

Now, description will proceed to a phase comparison characteristic in the fourth embodiment of this invention.

By changing connections between the output terminals of the second through the fourth phase comparators PD'2 to PD'4 and the input terminals of the majority circuit 11 in the manner which is described above, the phase comparison characteristic is changed from a phase comparison characteristic as shown in FIG. 13E to a phase comparison characteristic suit to the input data DT3 having the data rate of 622 Mbps as shown in FIG. 13F.

More specifically, as is apparent from FIGS. 13E and 13F, DN decisions between the phases c3-d3 and between the phases c5-d5 are changed to UP decisions while UP decisions between the phases d6-c7 and between the phases d8-c1 are changed to DN decisions. In other words, while the middle point between the clock signals CK2D-CK2 lies in a range between the phases d2–d3 and between the phases d4–d5, UP decision is carried out. While the middle point between the clock signals CK2D-CK2 lies in a range between the phases d6–d7 and between the phases d8-d1, DN decision is carried out. Only when the middle point between the clock signals CK2D-CK2 lies in a range between the phases d1–d2, synchronization decision is carried out. Accordingly, it is possible to recovery the state illustrated in FIG. 13A and to make the clock signals follow the input data DT3. Inasmuch as the resolution for phase controlling the sixteen-phase clock signals CK1 to CK8 is twice and the count number in the accumulation counter 23 is a half, a following speed of the clock signals becomes four times. Accordingly, it is possible to ensure a sufficient follow-up for the input data DT3 having the data rate of 622 Mbps.

For instance, as shown in FIG. 13C, it will be assumed that the middle point between the clock signals CK2D-CK2 lies between the phases d2-c3. In this event, the first phase comparator PD'1 detects that the transition point of the input data DT3 lies between the first secondary clock signal CK1D and the second secondary clock signal CK2D on the basis of the first set of the six sampled data obtained by sampling the input data DT3 by the first set of the clock signals CK1D, CK1, CK2D, CK2, CK3d, and CK3. Accordingly, the first phase comparator PD'1 determines that the phases of the clock signals should be put forward (UP) because the clock signals lag behind. Under the circumstances, the first phase comparator PD'1 supplies the first UP signal to the majority circuit 11 as shown in FIG. 14.

In addition, inasmuch the second phase comparator PD'2 cannot detect the transition point of the input data DT3 on the basis of the second set of the six sampled data obtained by sampling the input data DT3 by the second set of the clock signals CK3D, CK3, CK4D, CK4, CK5D, and CK5, the second phase comparator PD'2 produces neither the second UP signal nor the second DOWN signal. Likewise, inasmuch as the third phase comparator PD'3 cannot detect the transition point of the input data DT3 on the basis of the third set of the six sampled data obtained by sampling the input data DT3 by the third set of the clock signals CK5D, CK5, CK6D, CK6, CK7D, and CK7, the third phase comparator PD'3 produces neither the third UP signal nor the third DOWN signal. Inasmuch as the fourth phase comparator PD'4 cannot detect the transition point of the input data DT3 on the basis of the fourth set of the six sampled data obtained by sampling the input data DT3 by the fourth set of the clock signals CK7D, CK7, CK8D, CK8, CK1D, and CK1, the fourth phase comparator PD'4 produces neither the fourth UP signal nor the fourth DOWN signal.

As shown in FIG. 13D, it will be assumed that the middle point between the clock signals CK2D-CK2 lies between the phases c5-d5. In this event, the third phase comparator PD'3 detects that the transition point of the input data DT3 lies between the sixth primary clock signal CK6 and the seventh seconray clock signal CK7D on the basis of the third set of the six sampled data obtained by sampling the input data DT3 by the third set of the clock signals CK5D, CK5, CK6D, CK6, CK7, and CK7. Accordingly, the third phase comparator PD'3 determines that the phases of the clock signals should be put backward (DOWN) because the clock signals gain. Under the circumstances, the third phase comparator PD'3 supplies the third DOWN signal to the majority circuit 11. However, in this case, inasmuch as the third DOWN signal output terminal DN3(out) of the third phase comparator PD'3 is connected to the fourth UP signal input terminal UP4(in) of the majority circuit 11 as illustrated in FIG. 14, the majority circuit 11 decides by majority by counting the third DOWN signal as the fourth UP signal.

In addition, inasmuch as the first phase comparator PD'1 cannot detect the transition point of the input data DT3 on the basis of the first set of the six sampled data obtained by sampling the input data DT3 by the first set of the clock signals CK1D, CK1, CK2D, CK2, CK3D, and CK3, the first phase comparator PD'1 produces neither the first UP signal nor the first DOWN signal. Likewise, inasmuch as the second phase comparator PD'2 cannot detect the transition point of the input data DT3 on the basis of the second set of the six sampled data obtained by sampling the input data DT3 by the second set of the clock signals CK3D, CK3, CK4D, CK4, CK5D, and CK5, the second phase comparator PD'2 produces neither the second UP signal nor the second DOWN signal. Inasmuch as the fourth phase comparator PD'4 cannot detect the transition point of the input data DT3 on the basis of the fourth set of the six sampled data obtained by sampling the input data DT3 by the fourth set of the clock signals CK7D, CK7, CK8D, CK8, CK1D, and CK1, the fourth phase comparator PD'4 produces neither the fourth UP signal nor the fourth DOWN signal.

The fourth embodiment described above is nothing but an embodiment of this invention. In general, the oversampling clock recovery circuit comprises first through 4N-th phase comparators PD'1 through PD'4N with a one-to-four correspondence with one bit of an input data, where N represents a positive integer and a majority circuit. A (4n+1)-th phase comparator PD'(4n+1) corresponds to a transition point of the input data, where n represents an integer between 0 and (N−1), both inclusive. Each of the first through the 4N-th phase comparators has a synchronization signal output terminal for producing a synchronization signal, an UP signal output terminal for producing an UP signal, and a DOWN signal output terminal for producing a DOWN signal. The majority circuit has 4N synchronization signal input terminals, 4N UP signal input terminals, and 4N DOWN signal output terminals. The (4n+1)-th phase comparator PD'(4n+1) has a synchronization signal output terminal, a DOWN signal output terminal, and an UP signal output terminal which are connected to a synchronization signal input terminal, a DONW signal input terminal, and an UP signal input terminal of the majority circuit, respectively. A (4n+2)-th phase comparator PD'(4n+2) has a DOWN signal output terminal and an UP signal output terminal which are connected to UP signal input terminals of the majority circuit. The (4n+2)-th phase comparator PD'(4n+2) has a synchronization signal output terminal disconnected to a synchronization signal input terminal of the majority circuit. A (4n+3)-th phase comparator PD'(4n+3) has a DOWN signal output signal and an UP signal output terminal which are connected to an UP signal input terminal and the a DOWN signal input terminal of the majority circuit, respectively. The (4n+3)-th phase comparator PD'(4n+3) has a synchronization signal output terminal disconnected to a synchronization signal input terminal of the majority circuit. A (4n+4)-th phase comparator PD'(4n+4) has a DOWN signal output terminal and an UP signal output terminal which are connected to DOWN signal input terminals of the majority circuit. The (4n+4)-th phase comparator PD'(4n+4) has a synchronization signal output terminal disconnected to a synchronization signal input terminal of the majority circuit.

Figure 21:
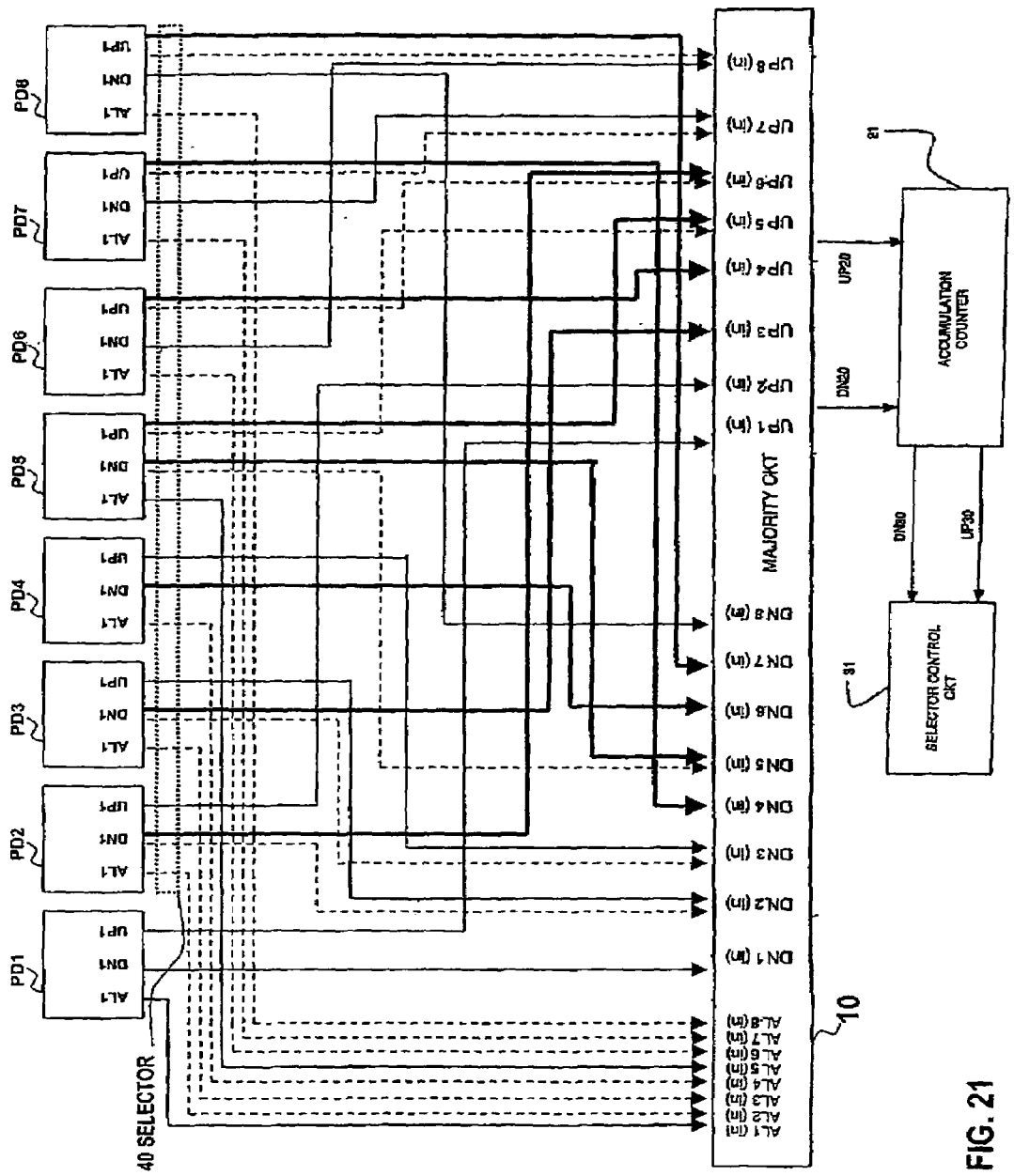
FIG. 21 is a block diagram showing a main part of a digital oversampling clock recovery circuit according to an alternative fourth embodiment of this invention that includes the phase comparators.

Referring to FIG. 21 will be assumed that the phase control circuit produces sixteen-phase clock signals each having a clock signal of 312.5 MHz which is one-eighths of a data rate of 2.5 Gbps and the oversampling clock recovery circuit comprises first through eighth phase comparators PD1–PD8 with a one-to-eight correspondence with one bit of an input data and a majority circuit 10. Each of the first and the fifth phase comparators PD1 and PD5 corresponds to a transition point of the input data. The majority circuit 10 has eight synchronization signal input terminals AL1(in)–AL8(in), eight DOWN signal input terminals DN1(in)–DN8(in), and eight UP signal input terminals UP1(in)–UP8(in). Each of the first and the fifth phase comparators PD1 and PD5 has a synchronization signal output terminal AL1, a DOWN signal output terminal DN1, and an UP signal output terminal UP1 which are connected to a synchronization signal input terminal AL1(in)–AL8(in), a DOWN signal input terminal DN1(in)–DN8(in), and an UP signal input terminal UP1(in)–UP8(in) of the majority circuit 10, respectively. Each of the second and the sixth phase comparators PD2 and PD6 has a DOWN signal output terminal DN1 and an UP signal output terminals UP1 which are connected to UP signal input terminals UP1(in)–UP8(in) of the majority circuit 10 and has a synchronization signal output terminal AL1 disconnected to a synchronization signal input terminal AL1(in)–AL8(in) of the majority circuit 10. Each of the third and the seventh phase comparators PD3 and PD7 has a DOWN signal output terminal DN1 and an UP signal output terminal UP1 which are connected to an UP signal input terminal UP1(in)–UP8(in) and a DOWN signal input terminal DN1(in)–DN8(in) of the majority circuit 10, respectively, and has a synchronization signal output terminal AL1 disconnected to a synchronization signal input terminal AL1(in)–AL8(in) of the majority circuit 10. Each of the fourth and the eighth phase comparators PD4 and PD8 has a DOWN signal output terminal DN1 and an UP signal output terminal UP1 which are connected to DOWN signal output terminals DN1(in)–DN8(in) of the majority circuit 10. Each of the fourth and the eighth phase comparators has a synchronization signal output terminal AL1 disconnected to a synchronization signal input terminal AL1(in)–AL8(in) of the majority circuit 10.

It will be assumed the oversampling clock recovery circuit is reconstructed for the input data having the data rate of 311 MHz. In this event, inasmuch as the data rate is one-eighths, the oversampling clock recovery circuit comprises first through 8N-th phase comparators PD'1 through PD'8N with a one-to-eight correspondence with one bit of an input data, where N represents a predetermined positive integer and a majority circuit having 8N synchronization signal input terminals, 8N DOWN signal input terminals, and 8N UP signal input terminals. Each of the first through the 8N-th phase comparators has a synchronization signal output terminal for producing a synchronization signal, an UP signal output terminal for producing an UP signal, and a DOWN signal output terminal for producing a DOWN signal. An (8n+1)-th phase comparator PD'(8n+1) corresponds to a transition point of the input data, where n represents an integer between 0 to (N−1), both inclusive. The majority circuit decides by majority on synchronization signals, UP signals, and DOWN signals supplied from the first through the 8N-th phase comparators. The (8n+1)-th phase comparator PD'(8n+1) has a synchronization signal output terminal, a DOWN signal output terminal, and an UP signal output terminal which are connected to a synchronization signal input terminal, a DOWN signal input terminal, and an UP signal input terminal of the majority circuit, respectively. Each of an (8n+2)-th phase comparator PD'(8n+2), an (8n+3)-th phase comparator PD'(8n+3), and an (8n+4)-th phase comparator PD'(8n+4) has a DOWN signal output terminal and an UP signal output terminal which are connected to UP signal input terminals of the majority circuit and has a synchronization signal output terminal disconnected to a synchronization signal input terminal of the majority circuit. An (8n+5)-th phase comparator PD'(8n+5) has a DOWN signal output terminal and an UP signal output terminal which are connected to an UP signal input terminal and a DOWN signal input terminal of the majority circuit, respectively, and has a synchronization signal output terminal disconnected to a synchronization signal input terminal of the majority circuit. Each of an (8n+6)-th phase comparator PD'(8n+6), an (8n+7)-th phase comparator PD'(8n+7), and an (8n+8)-th phase comparator PD'(8n+8) has a DOWN signal output terminal and an UP signal output terminal which are connected to DOWN signal input terminals of the majority circuit and has a synchronization signal output terminal disconnected to a synchronization signal input terminal of the majority circuit.

Figure 22:
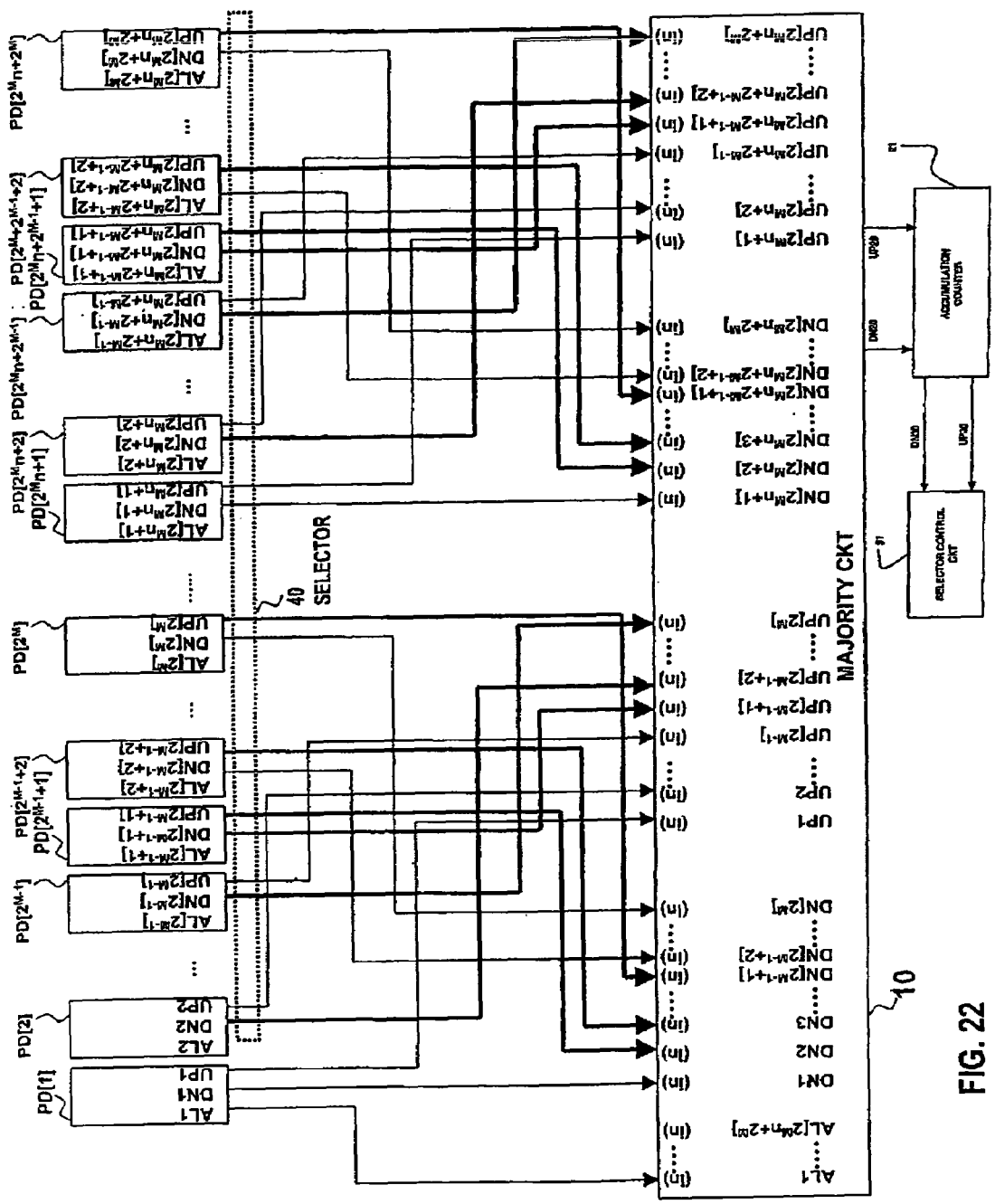
FIG. 22 is a block diagram showing a main part of a digital oversampling clock recovery circuit according to another alternative fourth embodiment of this invention that includes the phase comparators.

As shown in FIG. 22. in general, an oversampling clock recovery circuit comprises first through $2^M$N-th phase comparators PD1–PD[$2^M$n+$2^M$] with a one-to-$2^M$ correspondence with one bit of an input data, where M and N represent first and second predetermined positive integers, respectively, and a majority circuit 10. Each of the first through the $2^M$N-th phase comparators PD1–PD[$2^M$n+$2^M$] has a synchronization signal output terminal AL1–AL[$2^M$n+$2^M$] for producing a synchronization signal, an UP signal output terminal UP1–UP[$2^M$n+$2^M$] for producing an UP signal, and a DOWN signal output terminal DN1–DN[$2^M$n+$2^M$] for producing a DOWN signal. The majority circuit 10 decides by majority on synchronization signals, UP signals, and DOWN signals supplied from the first through the $2^M$N-th phase comparators PD1–PD[$2^M$n+$2^M$]. The majority circuit 10 has $2^M$N synchronization signal input terminals AL1(in)–AL[$2^M$n+$2^M$](in), $2^M$N UP signal input terminals UP1(in)–UP[$2^M$n+$2^M$](in), and $2^M$N DOWN signal input terminals DN1(in)–DN[$2^M$n+$2^M$](in). A ($2^M$n+1)-th phase comparator corresponds to a transition point of the input data, where n represents an integer between 0 to (N−1), both inclusive. The ($2^M$n+1)-th phase comparator has a synchronization signal output terminal AL[$2^M$n+1], a DOWN signal output terminal DN[$2^M$n+1] and an UP signal output terminal UP[$2^M$n+1] which are connected to a synchronization signal input terminal AL1(in)–AL[$2^M$n+$2^M$](in), a DOWN signal input terminal DN1(in)–DN[$2^M$n+$2^M$](in), and an UP signal input terminal UP1(in)–UP[$2^M$n+$2^M$](in) of the majority circuit 10, respectively. Each of ($2^M$n+2)-th through ($2^M$n+$2^{M-1}$)-th phase comparators has a synchronization signal output terminal AL[$2^M$n+2]–AL[$2^{M-1}$] disconnected to a synchronization signal input terminal AL1(in)–AL[$2^M$n+$2^M$](in) of the majority circuit 10. Each of the ($2^M$n+2)-th through the ($2^M$n+$2^M$)-th phase comparators has a DOWN signal output terminal DN[$2^M$n+2]–DN[$2^{M-}$] and an UP signal output terminal Up[$2^M$n+2]–UP[$2^{M-1}$] which are connected to UP signal input terminals UP1(in)–UP[$2^M n+2^M$] (in) of the majority circuit 10. A ($2^M n+(2^{M-1})$)-th phase comparator has a synchronization signal output terminal AL[$2^M n+2^{M-1}+1$] disconnected to a synchronization signal input terminal AL1(in)–AL1[$2^M n+2^M$](in) of the majority circuit 10. The ($2^M n+(2^{M-1}+1)$)-th phase comparator has a DOWN signal output terminal DN[$2^M n+2^{M-1}+1$] and an UP signal output terminal UP[$2^M n+2^{M-1}+1$] which are connected to an UP signal input terminal UP1(in)–UP[$2^M n+2^M$](in) and a DOWN signal input terminal DN1(in)–DN[$2^M n+2^M$](in) of the majority circuit 10, respectively. Each of ($2^M n+(2^{M-1}+2)$)-th through ($2^M n+2^M$)-th phase comparators has a synchronization signal output terminal AL[$2^M n+2^{M-1}+2$]–AL[$2^M n+2^M$] disconnected to a synchronization signal input terminal AL1(in)–AL[$2^M n+2^M$](in) of the majority circuit 10. Each of the ($2^M n+(2^{M-1}+2)$)-th through the ($2^M n 2^M$)-th phase comparators has a DOWN signal output terminal DN[$2^M n+2^{M-1}+2$]–DN[$2^M n+2^M$] and an UP signal output terminal UP[$2^M n+2^{M-1}+2$]–UP[$2^M n+2^M$] which are connected to DOWN signal input terminals DN1(in)–DN[$2^M n+2^M$](in) of the majority circuit 10.

Fifth Embodiment

Figure 15:
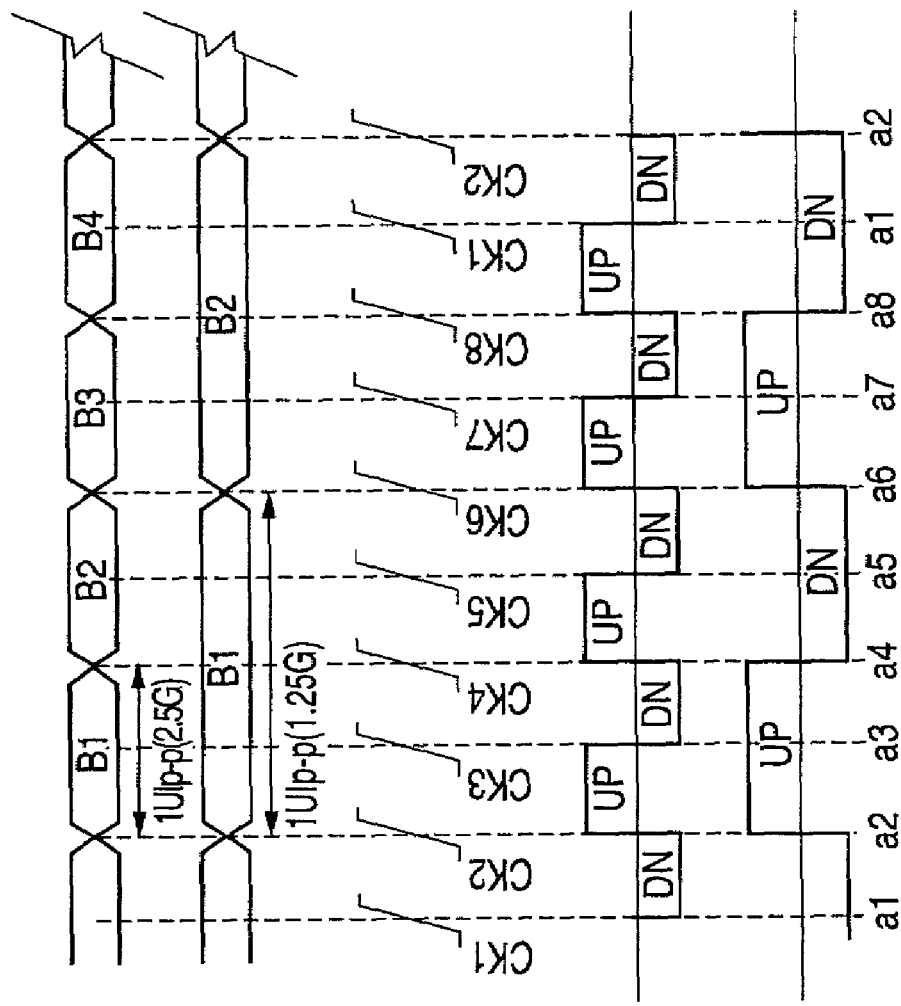
FIG. 15A is a time chart schematically showing a waveform of a first input data DT1 having the data rate of 2.5 Gbps.
FIG. 15B is a time chart schematically showing a waveform of a second input data DT2 having the data rate of 1.25 Gbps.
FIG. 15C is a time charts schematically showing leading edges of eight-phase clock signals CK1 through CK8.
FIGS. 15D and 15E show a phase comparison characteristic in phase comparators.
Figure 16:
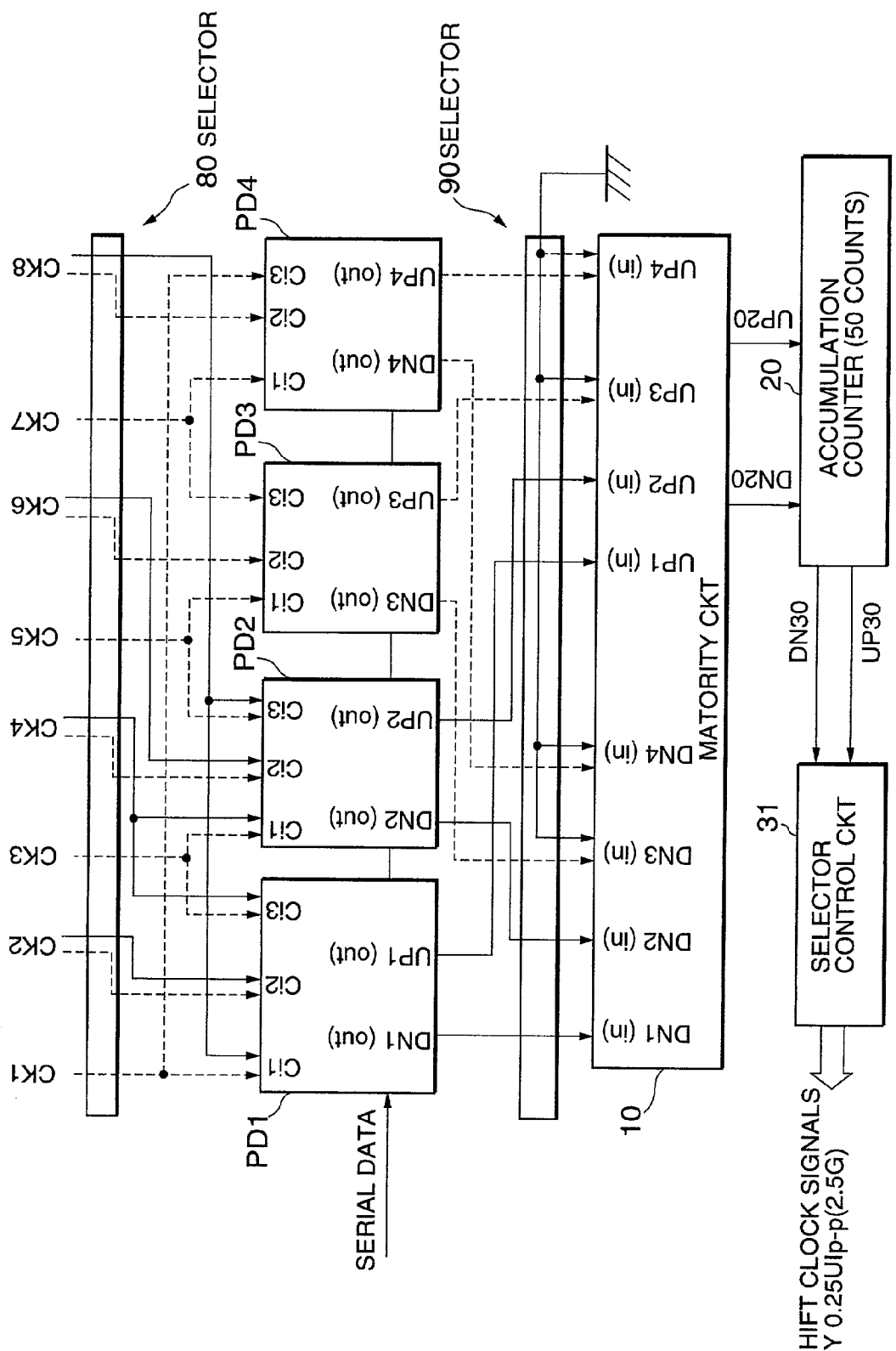
FIG. 16 is a block diagram showing a main part of a digital oversampling clock recovery circuit according to a fifth embodiment of this invention that includes the phase comparators.

Referring to FIGS. 15A through 15E and FIG. 16, the description will proceed to an oversampling clock recovery circuit according to a fifth embodiment of this invention. The illustrated clock recovery circuit is a 2-times digital oversampling clock recovery circuit for a data rate of 2.5 Gbps that is also used to a 2-times digital oversampling clock recovery circuit for a data rate of 1.25 Gbps. FIG. 15A is a time chart schematically showing a waveform of a first input data DT1 having the data rate of 2.5 Gbps while FIG. 15B is a time chart schematically showing a waveform of a second input data DT2 having the data rate of 1.25 Gbps. FIGS. 15C is a time charts schematically showing leading edges of eight-phase clock signals CK1 through CK8. FIGS. 15D and 15E show a phase comparison characteristic in phase comparators. FIG. 16 is a block diagram showing a main part of the digital oversampling clock recovery circuit that includes the phase comparators.

As shown in FIGS. 15A and 15B, 1UIp-p(1.25G) corresponds to 2UIp-p(2.5G).

The illustrated digital oversampling clock recovery circuit according to the fifth embodiment is an embodiment obtained by making three alternations in structure of the 2-times digital oversampling clock recovery circuit described in conjunction with FIG. 2.

Firstly, the illustrated digital oversampling clock recovery circuit further comprises a first selector 80 at clock input sides of the first through the fourth phase comparators PD1, PD2, PD3, and PD4 that may change correspondence relationships between the first through the fourth phase comparators PD1 to PD4 and the eight-phase clock signals CK1 to CK8 so as to supply the first phase comparator PD1 with the eighth, the second, and the fourth clock signals CK8, CK2, and CK4 and to supply the second phase comparator PD2 with the fourth, the sixth, and the eighth clock signals CK4, CK6, and CK8 as shown at a solid line in FIG. 16.

Secondary, the illustrated digital oversampling clock recovery circuit further comprises a second selector 90 disposed between the first through the fourth phase comparators PD1 to PD4 and the majority circuit 10 that may change connection relationships between the output terminals of the first through the fourth phase comparators PD1 to PD4 and the input terminals of the majority circuit 10 so as to connect the third and the fourth DOWN signal input terminals CN3(in) and CN4(in) and the third and the fourth UP signal input terminals UP3(in) and UP4(in) with a ground terminal.

Thirdly, resolution (an amount for shifting once) in the selector control circuit 31 may be changed from 0.125UIp-p(2.5 G) to 0.25UIp-p(2.5 G).

Now, the description will be made about the phase comparison characteristic of the oversampling clock recovery circuit according to the fifth embodiment of this invention.

It will be assumed that the 2-times digital oversampling clock recovery circuit is used for the first input data DT having the data rate of 2.5 Gbps. In this event, phase information is obtained by carrying out a 2-times oversampling on 1 bit using the eight-phase clock signals CK1 to CK8 having a frequency which is one-fourths of the data rate of the first input data DT1. In this case, as shown at a broken line in FIG. 16, the first selector 80 selects so as to use all of the eight-phase clock signals CK1 to CK8 which are supplied to the first through the fourth phase comparators PD1, PD2, PD3, and PD4. More specifically, the first, the second, and the third clock signals CK1, CK2, and CK3 are supplied to first through third clock input terminals Ci1, Ci2, and Ci3 of the first phase comparator PD1, respectively. The third, the fourth, and the fifth clock signals CK3, CK4, and CK5 are supplied to first through third clock input terminals Ci1, Ci2, and Ci3 of the second phase comparator PD2, respectively. The fifth, the sixth, and the seventh clock signals CK5, CK6, and CK7 are supplied to first through third clock input terminals Ci1, Ci2, and Ci3 of the third phase comparator PD3, respectively. The seventh, the eighth, and the first clock signals CK7, CK8, and CK1 are supplied to first through third clock input terminals Ci1, Ci2, and Ci3 of the fourth phase comparator PD4, respectively. As a result, in the manner which is described in prior art, the phase comparison characteristic suitable for the first input data DT1 as shown in FIG. 15D.

However, it is impossible to use the oversampling clock recovery circuit for the data rate of 2.5 Gbps using the 2-times oversampling as the second input data DT2 having the data rate of 1.25 Gbps as it is. This reason is as follows. The phase comparison characteristic shown in FIG. 15E is required for the oversampling clock recovery circuit for the second input data DT2 having the data rate of 1.25 Bbps. If the oversampling clock recovery circuit for the data rate of 2.5 Gbps is supplied with the second input data DT2 having the data rate of 1.25 Gbps as it is, a 4-times oversamping is carried out for 1 bit of the second input data DT2 as seen from FIGS. 15B and 15C and correct phase information for the input data DT2 cannot be obtained because a phase comparison logic for the oversampling clock recovery circuit is designed in view of the 2-times oversampling. The phase comparison characteristic for the input data DT2 having the data rate of 1.25 Gbps shown in FIG. 15E can be realized by obtaining phase information for the second input data DT2 by carrying out a 2-times oversampling using only four-phase clock signals CK2, CK4, CK6, and CK8 as shown at the solid line in FIG. 16 or using only four-phase clock signals CK1, CK3, CK5, and CK7 which are not illustrated in FIG. 16.

Accordingly, in a case of using the oversampling clock recovery circuit for the data rate of 2.5 Gbps for use in the second input date DT2 having the data rate of 1.25 Gbps, wiring between the first through the third clock input terminals Ci1, Ci2, and Ci3 of the first through the fourth phase comparators PD1 to PD4 and the clock signals CK1 to CK8 is changed by using the first selector 80 so that each phase comparator can obtain necessary sampled data, as shown in FIG. 16. Specifically, the eighth, the second, and the fourth clock signals CK8, CK2, and CK4 are supplied to the first phase comparator PD1, the fourth, the sixth, and the eighth clock signals CK4, CK6, and CK8 are supplied to the second phase comparator PD2 and then both of the third and the fourth phase comparators PD3 and PD4 are supplied with no clock signal. At the same time, the third DOWN signal input terminal CN3(in), the fourth DOWN signal input terminal CN4(in), the third UP signal input terminal UP3(in), and the fourth UP signal input terminal UP4(in) of the majority circuit 10 are changed to set to a grounding level by using the second selector 90.

By performing such an alternation, the first and the second phase comparators PD1 and PD2 determine that the phases of the clock signals should be put forward (UP) when the leading edges of the second and the sixth clock signals CK2 and CK6 lie in ranges from the phases a2 and a6 of the transition point of the second input data DT2 up to +0.5UI (1.25 G) (between the phases a2–a4 and bewteen the phases a6–a8), respectively, and the first and the second phase comparators PD1 and PD2 supply the first and the second UP signals to the majority circuit 10, respectively. On the contrary, the first and the second phase comparators PD1 and PD2 determine that the phases of the clock signals should be put backward (DOWN) when the leading edges of the second and the sixth clock signals CK2 and CK6 lie in ranges from the phases a2 and a6 of the transition point of the second input data DT2 down to –0.5UI(1.25 G) (between the phases a8-a2 and between the phases a4–a6), respectively, and the first and the second phase comparators PD1 and PD2 supply the first and the second DOWN signals to the majority circuit 10, respectively. The majority circuit 10 counts the first and the second UP signals or the first and the second DOWN signals to decide by majority. As a result, inasmuch as the oversampling clock recovery circuit is changed so as to have the phase comparison characteristic corresponding to the second input data DT2 having the data rate of 1.25 Gbps as shown in FIG. 15E, it is possible to make the clock signals follow the second input data DT2. Inasmuch as the resolution for controlling the phases of the eight-phase clock signals CK1 to CK8 is twice, the follow-up speed of the clock signals becomes twice. Accordingly, it is possible to ensure a sufficient follow-up for the second input data DT2 having the data rate of 1.25 Gbps.

Under the circumstances, if the third and the fourth DOWN signal output terminals DN3(out) and CN4(out) and the third and the fourth UP signal output terminals DN3(out) and DN4(out) of the third and the fourth phase comparators PD3 and PD4 are not connected to the majority circuit 10, clock inputs for the third and the fourth phase comparators PD3 and PD4 may not be altered. In addition, the clock signals supplied to the phase comparators may be the first, the third, the fifth, and the seventh clock signals CK1, CK3, CK5, and CK7 instead of the second, the fourth, the sixth, and the eighth clock signals CK2, CK4, CK6, and CK8. Inputs for the third and the fourth DOWN signal input terminals DN3(in) and DN4(in) and the third and the fourth UP signal input terminals UP3(in) and UP4(in) of the majority circuit 10 may not be the grounding level if the inputs does not affect the count number of the majority circuit 10.

Sixth Embodiment

Referring to FIGS. 17A through 17E and FIG. 18, the description will proceed to an oversampling clock recovery circuit according to a sixth embodiment of this invention. The illustrated clock recovery circuit is a 2-times digital oversampling clock recovery circuit for a data rate of 2.5 Gbps that is also used to a 2-times digital oversampling clock recovery circuit for a data rate of 622 Mbps.

Figure 17:
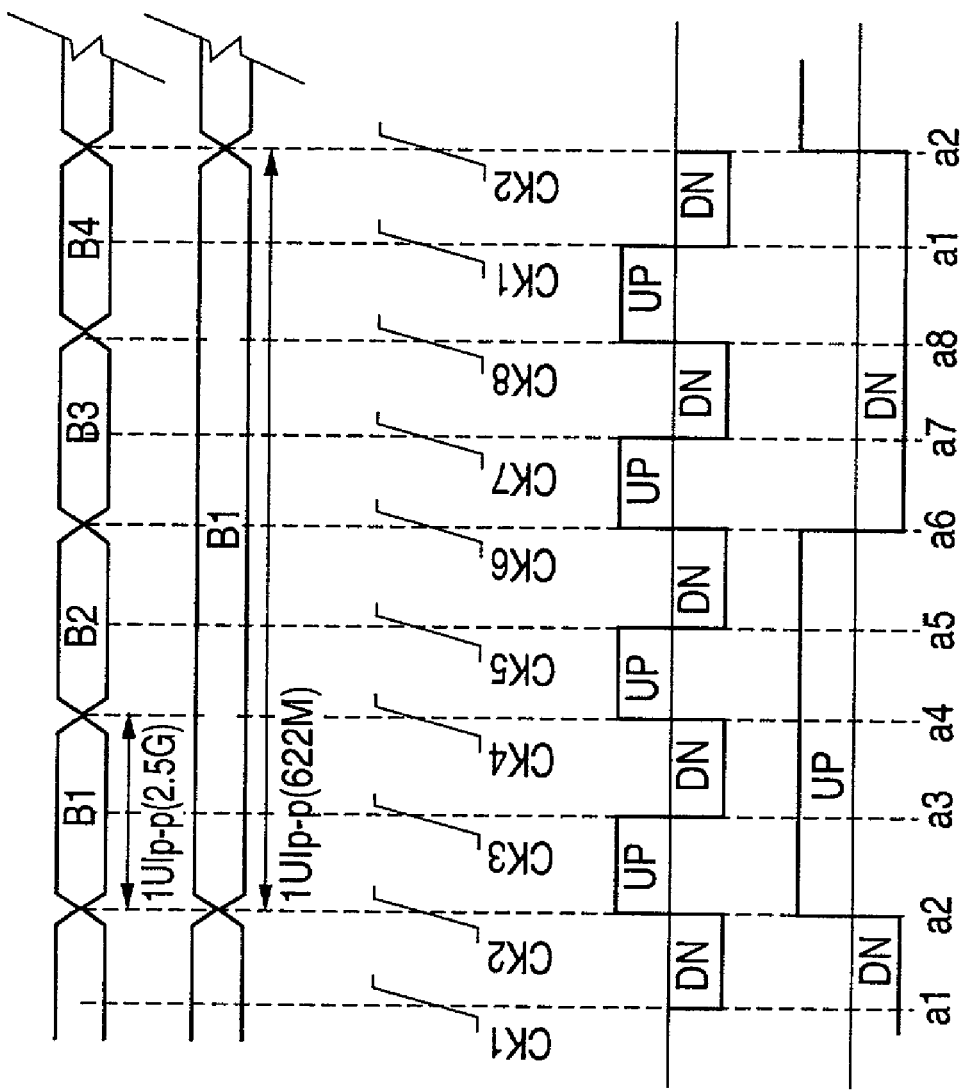
FIG. 17A is a time chart schematically showing a waveform of a first input data DT1 having the data rate of 2.5 Gbps.
FIG. 17B is a time chart schematically showing a waveform of a third input data DT3 having the data rate of 622 Mbps.
FIG. 17C is a time charts schematically showing leading edges of eight-phase clock signals CK1 through CK8.
FIGS. 17D and 17E show phase comparison characteristics in phase comparators.
Figure 18:
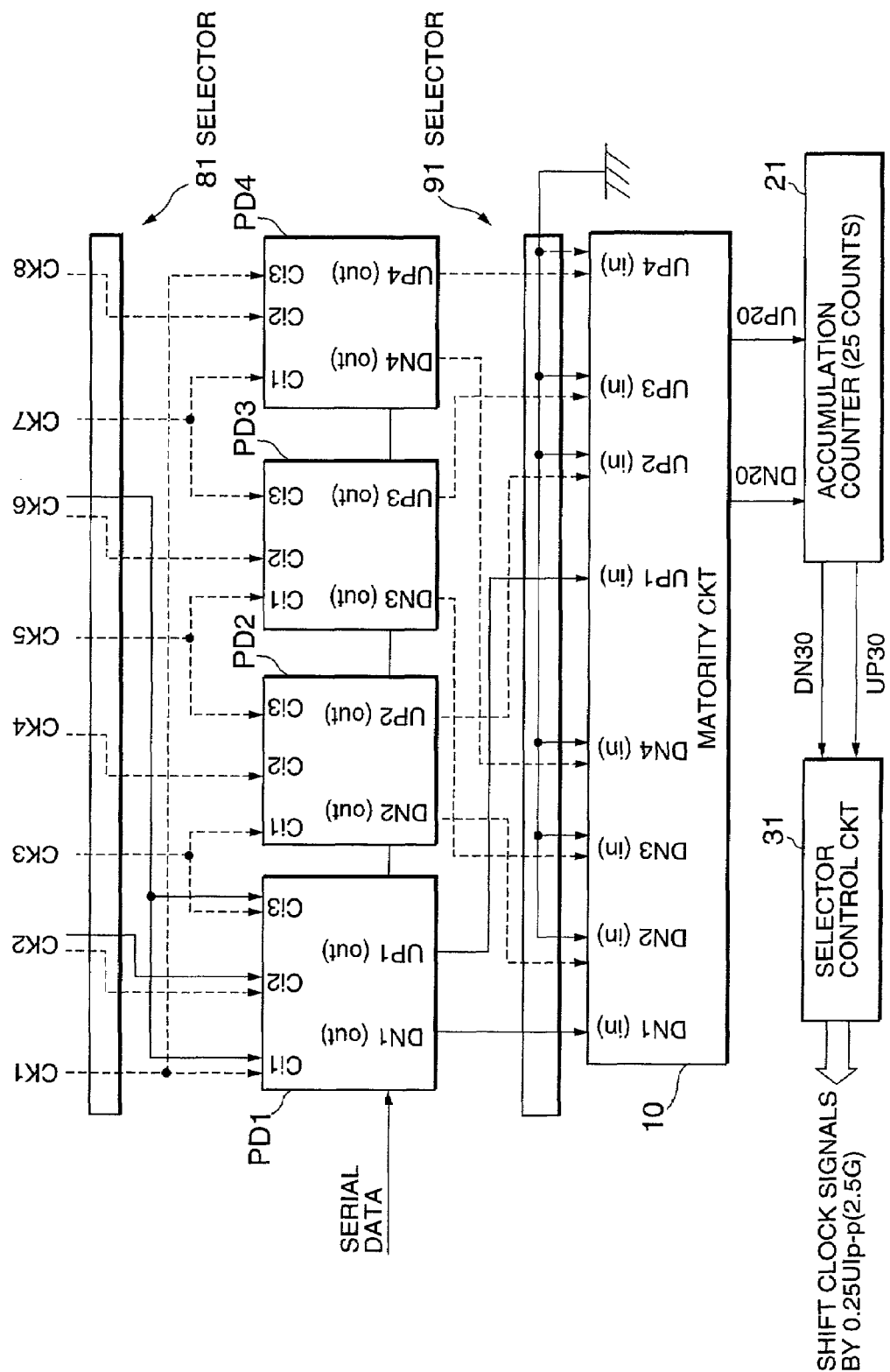
FIG. 18 is a block diagram showing a main part of a digital oversampling clock recovery circuit according to a sixth embodiment of this invention that includes the phase comparators.

FIG. 17A is a time chart schematically showing a waveform of a first input data DT1 having the data rate of 2.5 Gbps while FIG. 17B is a time chart schematically showing a waveform of a third input data DT3 having the data rate of 622 Mbps. FIG. 17C is a time charts schematically showing leading edges of eight-phase clock signals CK1 through CK8. FIGS. 17D and 17E show phase comparison characteristics in phase comparators. FIG. 18 is a block diagram showing a main part of the digital oversampling clock recovery circuit that includes the phase comparators.

As shown in FIGS. 17A and 17B, 1UIp-p(622 M) corresponds to 4UIp-p(2.5 G).

The illustrated digital oversampling clock recovery circuit according to the sixth embodiment is an embodiment obtained by making four alternations in structure of the 2-times digital oversampling clock recovery circuit described in conjunction with FIG. 2.

Firstly, the illustrated digital oversampling clock recovery circuit further comprises a first selector 81 at clock input sides of the first through the fourth phase comparators PD1, PD2, PD3, and PD4 that may change correspondence relationships between the first through the fourth phase comparators PD1 to PD4 and the eight-phase clock signals CK1 to CK8 so as to supply the first phase comparator PD1 with the sixth, the second, and the sixth clock signals CK6, CK2, and CK6 as shown at a solid line in FIG. 18.

Secondary, the illustrated digital oversampling clock recovery circuit further comprises a second selector 91 disposed between the first through the fourth phase comparators PD1 to PD4 and the majority circuit 10 that may change connection relationships between the output terminals of the first through the fourth phase comparators PD1 to PD4 and the input terminals of the majority circuit 10 so as to connect the second through the fourth DOWN signal input terminals CN2(in) to CN4(in) and the second through the fourth UP signal input terminals UP2(in) to UP4(in) with a ground terminal.

Thirdly, resolution (an amount for shifting once) in the selector control circuit 31 may be changed from 0.125UIp-p(2.5 G) to 0.25UIp-p(2.5 G).

Fourthly, the count number of an accumulation counter 21 is changed from fifty to twenty-five.

Now, the description will be made about the phase comparison characteristic of the oversampling clock recovery circuit according to the sixth embodiment of this invention.

It will be assumed that the 2-times digital oversampling clock recovery circuit is used for the first input data DT having the data rate of 2.5 Gbps. In this event, phase information is obtained by carrying out a 2-times oversampling on 1 bit using the eight-phase clock signals CK1 to CK8 having a frequency which is one-fourths of the data rate of the first input data DT1. In this case, as shown at a broken line in FIG. 18, the first selector 81 selects so as to use all of the eight-phase clock signals CK1 to CK8 which are supplied to the first through the fourth phase comparators PD1, PD2, PD3, and PD4. More specifically, the first, the second, and the third clock signals CK1, CK2, and CK3 are supplied to first through third clock input terminals Ci1, Ci2, and Ci3 of the first phase comparator PD1, respectively. The third, the fourth, and the fifth clock signals CK3, CK4, and CK5 are supplied to first through third clock input terminals Ci1, Ci2, and Ci3 of the second phase comparator PD2, respectively. The fifth, the sixth, and the seventh clock signals CK5, CK6, and CK7 are supplied to first through third clock input terminals Ci1, Ci2, and Ci3 of the third phase comparator PD3, respectively. The seventh, the eighth, and the first clock signals CK7, CK8, and CK1 are supplied to first through third clock input terminals Ci1, Ci2, and Ci3 of the fourth phase comparator PD4, respectively. As a result, in the manner which is described in prior art, the phase comparison characteristic suitable for the first input data DT1 is obtained as shown in FIG. 17D.

However, it is impossible to use the oversampling clock recovery circuit for the data rate of 2.5 Gbps using the 2-times oversampling as the third input data DT3 having the data rate of 622 Mbps as it is. This is because the phase comparison characteristic shown in FIG. 17E is required for the oversampling clock recovery circuit for the third input data DT2 having the data rate of 622 Mbps. The phase comparison characteristic for the third input data DT3 having the data rate of 622 Mbps shown in FIG. 17E can be realized by obtaining phase information for the third input data DT3 by carrying out a 2-times oversampling using only two-phase clock signals CK2 and CK6 as shown at the solid line in FIG. 18 or using only two-phase clock signals CK1 and CK5, only two-phase clock signals CK3 and CK7, or only two-phase clock signals CK4 and CK8 which are not illustrated in FIG. 18.

Accordingly, in a case of using the oversampling clock recovery circuit for the data rate of 2.5 Gbps for use in the third input date DT3 having the data rate of 622 Mbps, wiring between the first through the third clock input terminals Ci1, Ci2, and Ci3 of the first through the fourth phase comparators PD1 to PD4 and the clock signals CK1 to CK8 is changed by using the first selector 81 so that each phase comparator can obtain necessary sampled data, as shown in FIG. 18. Specifically, the sixth, the second, and the sixth clock signals CK6, CK2, and CK6 are supplied to the first phase comparator PD1, and then the second through the fourth phase comparators PD2 to PD4 are supplied with no clock signal. At the same time, the second through the fourth DOWN signal input terminals CN2(in) to CN4(in) and the second through the fourth UP signal input terminals UP2(in) to UP4(in) of the majority circuit 10 are changed to set to a grounding level by using the second selector 91.

By performing such an alternation, the first phase comparator PD1 determines that the phases of the clock signals should be put forward (UP) when the leading edges of the second and the sixth clock signals CK2 and CK6 lie in ranges from the phases a2 and a6 of the transition point of the third input data DT3 up to +0.5UI(622 M) (between the phases a2–a6, and the first and phase comparator PD1 suppies the first UP signal to the majority circuit 10, respectively On the contrary, the first phase comparator PD1 determines that the phases of the clock signals should be put backward (DOWN) when the leading edges of the second and the sixth clock signals CK2 and CK6 lie in ranges from the phase a2 of the transition point of the third input data DT3 down to –0.5UI(622 M) (between the phases a6-a2), and the first phase comparator PD1 supplies the first DOWN signal to the majority circuit 10. The majority circuit 10 counts the first UP signal or the first DOWN signals to decide by majority. As a result, inasmuch as the oversampling clock recovery circuit is changed so as to have the phase comparison characteristic corresponding to the third input data DT3 having the data rate of 622 Mbps as shown in FIG. 17E, it is possible to make the clock signals follow the third input data DT3. Inasmuch as the resolution for controlling the phases of the eight-phase clock signals CK1 to CK8 is twice and the count number of the accumulation counter 21 has one-seconds, the follow-up speed of the clock signals becomes twice. Accordingly, it is possible to ensure a sufficient follow-up for the third input data DT3 having the data rate of 622 Mbps.

Under the circumstances, if the second through the fourth DOWN signal output terminals DN2(out) to CN4(out) and the second through the fourth UP signal output terminals DN2(out) to DN4(out) of the second through the fourth phase comparators PD2 to PD4 are not connected to the majority circuit 10, clock inputs for the second through the fourth phase comparators PD2 to PD4 may not be altered. In addition the clock signals supplied to the first phase comparator PD1 may be a pair of the first and the fifth seventh clock signals CK1 and CK5, a pair of the third and the seventh clock signals CK3 and CK7, or a pair of fourth and the eighth clock signals CK4 and CK8 instead of a pair of the second and the sixth clock signals CK2 and CK6.

While this invention has thus far been described in conjunction with a few preferred embodiments thereof, it will now be readily possible for those skilled in the art to put this invention into various other manners. For example, this invention may be applicable to an oversampling clock recovery circuit having two or more kinds of data rate by changing structure of selectors for switching input relationships of sampling clock signals for phase comparators although the description has been made about the examples for reconstructing the oversampling clock recovery circuit constructed for the data rate of 2.5 Gbps into those for the data rate of 1.25 Gbps and 622 Mbps in the fifth and the sixth embodiments of this invention.

What is claimed is:

1. An oversampling clock recovery circuit comprising:

first through 2N-th phase comparators (PD1 to PD2N) with a one-to-two correspondence with one bit of an input data, where N represents a predetermined positive integer, each of said first through said 2N-th phase comparators having an UP signal output terminal for producing an UP signal and a DOWN signal output terminal for producing a DOWN signal, each of N odd numbered phase comparators (PD(2n+1)) corresponding to a transition point of said input data, where n represents an integer between 0 to (N–1), both inclusive; and a majority circuit (10) for deciding by majority on UP signals and DOWN signals supplied from said first through said 2N-th phase comparators, said majority circuit having 2N UP signal input terminals and 2N DOWN signal input terminals, said N odd numbered phase comparators (PD(2n+1)) having N DOWN signal output terminals connected to N DOWN signal input terminals of said majority circuit and N UP signal output terminals connected to N UP signal input terminals of said majority circuit, N even numbered phase comparators (PD(2n+2)) having N DOWN signal output terminals connected to N UP signal input terminals of said majority circuit and N UP signal output terminals connected to N DOWN signal input terminal of said majority circuit.

2. An oversampling clock recovery circuit as claimed in claim 1, wherein said oversampling clock recovery circuit further comprises a selector, disposed between said first through said 2N-th phase comparators and said majority circuit, for switching a connection state between the UP signal output terminal and the DOWN signal output terminal of said first through said 2N-th phase comparators and the 2N UP signal input terminals and the 2N DOWN signal input terminals of said majority circuit.

3. An oversampling clock recovery circuit comprising:

first through 4N-th phase comparators (PD1 to PD4N) with a one-to-four correspondence with one bit of an input data, where N represents a predetermined positive integer, each of said first through said 4N-th phase comparators having an UP signal output terminal for producing an UP signal and a DOWN signal output terminal for producing a DOWN signal, a (4n+1)-th phase comparator (PD(4n+1)) corresponding to a transition point of said input data, where n represents an integer between 0 to (N−1), both inclusive; and a majority circuit (10) for deciding by majority on UP signals and DOWN signals supplied from said first through said 4N-th phase comparators, said majority circuit having 4N UP signal input terminals and 4N DOWN signal input terminals, said (4n+1)-th phase comparator (PD(4n+1)) having a DOWN signal output terminal connected to a DOWN signal input terminal of said majority circuit and an UP signal output terminal connected to an UP signal input terminal of said majority circuit, a (4n+2)-th phase comparator (PD(4n+2)) having a DOWN signal output terminal and an UP signal output terminal which are connected to UP signal input terminals of said majority circuit, a (4n+3)-th phase comparator (PD(4n+3)) having a DOWN signal output terminal connected to an UP signal input terminal of said majority circuit and an UP signal output terminal connected to a DOWN signal input terminal of said majority circuit, and a (4n+4)-th phase comparator (PD(4n+4)) having a DOWN signal output terminal and an UP signal output terminal which are connected to DOWN signal input terminals of said majority circuit.

4. An oversampling clock recovery circuit as claimed in claim 3, wherein said oversampling clock recovery circuit further comprises a selector, disposed between said first through said 4N-th phase comparators and said majority circuit, for switching a connection state between the UP signal output terminal and the DOWN signal output terminal of said first through said 4N-th phase comparators and the UP signal input terminal and the DOWN signal input terminal of said majority circuit.

5. An oversampling clock recovery circuit comprising:

first through 8N-th phase comparators with a one-to-eight correspondence with one bit of an input data, where N represents a predetermined positive integer, each of said first through said 8N-th phase comparators having an UP signal output terminal for producing an UP signal and a DOWN signal output terminal for producing a DOWN signal, an (8n+1)-th phase comparator corresponding to a transition point of said input data, where n represents an integer between 0 to (N−1), both inclusive; and a majority circuit for deciding by majority on UP signals and DOWN signals supplied from said first through said 8N-th phase comparators, said majority circuit having 8N UP signal input terminals and 8N DOWN signal input terminals, said (8n+1)-th phase comparator having a DOWN signal output terminal connected to a DOWN signal input terminal of said majority circuit and an UP signal output terminal connected to an UP signal input terminal of said majority circuit, each of (8n+2)-th through (8n+4)-th phase comparators having a DOWN signal output terminal and an UP signal output terminal which are connected to UP signal input terminals of said majority circuit, an (8n+5)-th phase comparator having a DOWN signal output terminal connected to an UP signal input terminal of said majority circuit and an UP signal output terminal connected to a DOWN signal input terminal of said majority circuit, and each of (8n+6)-th through (8n+8)-th phase comparators having a DOWN signal output terminal and an UP signal output terminal which are connected to DOWN signal input terminals of said majority circuit.

6. An oversampling clock recovery circuit as claimed in claim 5, wherein said oversampling clock recovery circuit further comprises a selector, disposed between said first through said 8N-th phase comparators and said majority circuit, for switching a connection state between the UP signal output terminal and the DOWN signal output terminal of said first through said 8N-th phase comparators and the 8N UP signal input terminals and the 8N DOWN signal input terminals of said majority circuit.

7. An oversampling clock recovery circuit comprising:

first through $2^M$N-th phase comparators with a one-to-$2^M$ correspondence with one bit of an input data, where M and N represent first and second predetermined positive integers, respectively, each of said first through said $2^M$N-th phase comparators having an UP signal output terminal for producing an UP signal and a DOWN signal output terminal for producing a DOWN signal, a ($2^M$n+1)-th phase comparator corresponding to a transition point of said input data, where n represents an integer between 0 to (N−1), both inclusive; and a majority circuit for deciding by majority on UP signals and DOWN signals supplied from said first through said $2^M$N-th phase comparators, said majority circuit having 2MN UP signal input terminals and $2^M$N DOWN signal input terminals, said ($2^M$n+1)-th phase comparator having a DOWN signal output terminal connected to a DOWN signal input terminal of said majority circuit and an UP signal output terminal connected to an UP signal input terminal of said majority circuit, each of "($2^M$n+2)-th" through ($2^M$n+$2^{M-1}$)-th phase comparators having a DOWN signal output terminal and an UP signal output terminal which are connected to UP signal input terminals of said majority circuit, a ($2^M$n+($2^{M-1}$+1))-th phase comparator having a DOWN signal output terminal connected to an UP signal input terminal of said majority circuit and an UP signal output terminal connected to a DOWN signal input terminal of said majority circuit, and each of ($2^M$n+($2^{M-1}$+2))-th through ($2^M$n+$2^M$)-th phase comparators having a DOWN signal output terminal and an UP signal output terminal which are connected to DOWN signal input terminals of said majority circuit.

8. An oversampling clock recovery circuit as claimed in claim 7, wherein further said oversampling clock recovery circuit comprises a selector, disposed between said first through said $2^M$N-th phase comparators and said majority circuit, for switching a connection state between the UP signal output terminal and the DOWN signal output terminal of said first through said $2^M$N-th phase comparators and the $2^M$N UP signal input terminals and the $2^M$N DOWN signal input terminals of said majority circuit.

9. An oversampling clock recovery circuit comprising:

first through 2N-th phase comparators (PD'1 to PD'2N) with a one-to-two correspondence with one bit of an input data, where N represents a predetermined positive integer, each of said first through said 2N-th phase comparators having a synchronization signal output terminal for producing a synchronization signal, an UP signal output terminal for producing an UP signal, and a DOWN signal output terminal for producing a DOWN signal, each of N odd numbered phase comparators (PD'(2n+1)) corresponding to a transition point of said input data, where n represents an integer between 0 to (N−1), both inclusive; and a majority circuit (11) for deciding by majority on synchronization signals, UP signals, and DOWN signals supplied from said first through said 2N-th phase comparators, said majority circuit having 2N synchronization signal input terminals, 2N UP signal input terminals, and 2N DOWN signal input terminals, said N odd numbered phase comparators (PD'(2n+1)) having N synchronization signal output terminals connected to N synchronization signal input terminals of said majority circuit, N DOWN signal output terminals connected to N DOWN signal input terminals of said majority circuit, and N UP signal output terminals connected to N UP signal input terminals of said majority circuit, N even numbered phase comparators (PD(2n+2)) having N synchronization signal output terminals disconnected from N synchronization signal input terminals of said majority circuit, N DOWN signal output terminals connected to N UP signal input terminals of said majority circuit, and N UP signal output terminals connected to N DOWN signal input terminal of said majority circuit.

10. An oversampling clock recovery circuit as claimed in claim 9, wherein said oversampling clock recovery circuit further comprises a selector, disposed between said first through said 2N-th phase comparators and said majority circuit, for switching a connection state between the synchronization signal output terminal, the UP signal output terminal, and the DOWN signal output terminal of said first through said 2N-th phase comparators and the 2N synchronization signal input terminals, the 2N UP signal input terminals, and the 2N DOWN signal input terminals of said majority circuit.

11. An oversampling clock recovery circuit comprising:

first through 4N-th phase comparators (PD'1 to PD'4N) with a one-to-four correspondence with one bit of an input data, where N represents a predetermined positive integer, each of said first through said 4N-th phase comparators having a synchronization signal output terminal for producing a synchronization signal, an UP signal output terminal for producing an UP signal, and a DOWN signal output terminal for producing a DOWN signal, a (4n+1)-th phase comparator (PD'(4n+1)) corresponding to a transition point of said input data, where n represents an integer between 0 to (N−1), both inclusive; and a majority circuit for deciding by majority on synchronization signals, UP signals, and DOWN signals supplied from said first through said 4N-th phase comparators, said majority circuit having 4N synchronization signal input terminals, 4N UP signal input terminals, and 4N DOWN signal input terminals, said (4n+1)-th phase comparator (PD'(4n+1)) having a synchronization signal output terminal, a DOWN signal output terminal, and an UP signal output terminal which are connected to a synchronization signal input terminal, a DOWN signal input terminal, and an UP signal input terminal of said majority circuit, respectively, a (4n+2)-th phase comparator (PD'(4n+2)) having a synchronization signal output terminal disconnected from a synchronization signal output terminal of said majority circuit, said (4n+2)-th phase comparator (PD'(4n+2)) having a DOWN signal output terminal and an UP signal output terminal which are connected to UP signal input terminals of said majority circuit, a (4n+3)-th phase comparator (PD'(4n+3)) having a synchronization signal output terminal disconnected from a synchronization signal output terminal of said majority circuit, said (4n+3)-th phase comparator (PD'(4n+3)) having a DOWN signal output terminal connected to an UP signal input terminal of said majority circuit and an UP signal output terminal connected to a DOWN signal input terminal of said majority circuit, and a (4n+4)-th phase comparator (PD'(4n+4)) having a synchronization signal input terminal disconnected from a synchronization signal output terminal of said majority circuit, said (4n+4)-th phase comparator (PD'(4n+4)) having a DOWN signal output terminal and an UP signal output terminal which are connected to DOWN signal input terminals of said majority circuit.

12. An oversampling clock recovery circuit as claimed in claim 11, wherein said oversampling clock recovery circuit further comprises a selector, disposed between said first through said 4N-th phase comparators and said majority circuit, for switching a connection state between the synchronization signal output terminal, the UP signal output terminal, and the DOWN signal output terminal of said first through said 4N-th phase comparators and the 4N synchronization signal input terminals, the 4N UP signal input terminals, and the 4N DOWN signal input terminals of said majority circuit.

13. An oversampling clock recovery circuit comprising:

first through 8N-th phase comparators with a one-to-eight correspondence with one bit of an input data, where N represents a predetermined positive integer, each of said first through said 8N-th phase comparators having a synchronization signal output terminal for producing a synchronization signal, an UP signal output terminal for producing an UP signal, and a DOWN signal output terminal for producing a DOWN signal, an (8n+1)-th phase comparator corresponding to a transition point of said input data, where n represents an integer between 0 to (N−1), both inclusive; and a majority circuit for deciding by majority on synchronization signals, UP signals and DOWN signals supplied from said first through said 8N-th phase comparators, said majority circuit having 8N synchronization signal input terminals, 8N UP signal input terminals, and 8N DOWN signal input terminals, said (8n+1)-th phase comparator having a synchronization signal output terminal, a DOWN signal output terminal, and an UP signal output terminal which are connected to a synchronization signal input terminal, a DOWN signal input terminal, and an UP signal input terminal of said majority circuit, respectively, each of (8n+2)-th through (8n+4)-th phase comparators having a synchronization signal output terminal disconnected from a synchronization signal input terminal of said majority circuit, each of said (8n+2)-th through said (8n+4)-th phase comparators having a DOWN signal output terminal and an UP signal output terminal which are connected to UP signal input terminals of said majority circuit, an (8n+5)-th phase comparator having a synchronization signal output terminal disconnected from a synchronization signal input terminal of said majority circuit, said (8n+5)-th phase comparator having a DOWN signal output terminal connected to an UP signal input terminal of said majority circuit and an UP signal output terminal connected to a DOWN signal input terminal of said majority circuit, and each of (8n+6)-th through (8n+8)-th phase comparators having a synchronization signal output terminal disconnected from a synchronization signal input terminal of said majority circuit, each of said (8n+6)-th through said (8n+8)-th phase comparators having a DOWN signal output terminal and an UP signal output terminal which are connected to DOWN signal input terminals of said majority circuit.

14. An oversampling clock recovery circuit as claimed in claim 13, wherein said oversampling clock recovery circuit further comprises a selector, disposed between said first through said 8N-th phase comparators and said majority circuit, for switching a connection state between the synchronization signal output terminal, the UP signal output terminal, and the DOWN signal output terminal of said first through said 8N-th phase comparators and the 8N synchronization signal input terminals, the 8N UP signal input terminals, and the 8N DOWN signal input terminals of said majority cirucit.

15. An oversampling clock recovery circuit comprising:
first through $2^M$N-th phase comparators with a one-to-$2^M$ correspondence with one bit of an input data, where M and N represent first and second predetermined positive integers, respectively, each of said first through said $2^M$N-th phase comparators having a synchronization signal output terminal for producing a synchronization signal, an UP signal output terminal for producing an UP signal, and a DOWN signal output terminal for producing a DOWN signal, a $(2^M n+1)$-th phase comparator corresponding to a transition point of said input data, where n represents an integer between 0 to (N−1), both inclusive; and
a majority circuit for deciding by majority on synchronization signals, UP signals, and DOWN signals supplied from said first through said $2^M$N-th phase comparators, said majority circuit having $2^M$N synchronization signal input terminals, $2^M$N UP signal input terminals, and $2^M$N DOWN signal input terminals,
said $(2^M n+1)$-th phase comparator having a synchronization signal output terminal, a DOWN signal output terminal, and an UP signal output terminal which are connected to a synchronization signal input terminal, a DOWN signal input terminal, and an UP signal input terminal of said majority circuit, respectively, each of $(2^M n+2)$-th through "$(2^M n+2^{M-1})$-th" phase comparators having a synchronization signal output terminal disconnected from a synchronization signal input terminal of said majority circuit, each of said $(2^M n+2)$-th through $(2^M n+2^{M-1})$-th phase comparators having a DOWN signal output terminal and an UP signal output terminal which are connected to UP signal input terminals of said majority circuit, a $(2^M n+(2^{M-1}+1))$-th phase comparator having a synchronization signal output terminal disconnected from a synchronization signal input terminal of said majority circuit, said $(2^M n+(2^{M-1}+1))$-th phase comparator having a DOWN signal output terminal and an UP signal output terminal which are connected to an UP signal input terminal and a DOWN signal input terminal of said majority circuit, respectively, and each of $(2^M n+(2^{M-1}+2))$-th through $(2^M n+2^M)$-th phase comparators having a synchronization signal output terminal disconnected from a synchronization signal input terminal of said majority circuit, each of said $(2^M n+(2^{M-1}+2))$-th through $(2^M n+2^M)$-th phase comparators having a DOWN signal output terminal and an UP signal output terminal which are connected to DOWN signal input terminals of said majority circuit.

16. An oversampling clock recovery circuit as claimed in claim 15, wherein said oversampling clock recovery circuit further comprises a selector, disposed between said first through said $2^M$N-th phase comparators and said majority circuit, for switching a connection state between the synchronization signal output terminal, the UP signal output terminal, and the DOWN signal output terminal of said first through said $2^M$N-th phase comparators and the $2^M$N synchronization signal input terminals, the $2^M$N UP signal input terminals, and the $2^M$N DOWN signal input terminals of said majority circuit.

17. An oversampling clock recovery circuit comprising:
a plurality of phase comparators for sampling an input data having a predetermined data rate using two or more clock signals selected from multi-phase clock signals, each of said phase comparators producing one of an UP signal and a DOWN signal; and
a majority circuit for deciding by majority on UP signals and DOWN signals supplied from said phase comparators, whereby said oversampling clock recovery circuit has a phase comparison characteristic corresponding to a data rate different from said predetermined data rate by supplying said phase comparators with said two or more clock signals selected from said multi-phase clock signals in accordance with said data rate, at least a number of said plurality of phase comparators having DOWN signal output terminals connected to UP signal input terminals of said majority circuit and UP signal output terminals connected to DOWN signal input terminals of said majority circuit.

18. An oversampling clock recovery circuit as claimed in claim 17, wherein said oversampling clock recovery circuit further comprises a selector for switching a connection state between said multi-phase clock signals and said phase comparators.

* * * * *